United States Patent
Rabkin et al.

(10) Patent No.: US 12,219,756 B2
(45) Date of Patent: *Feb. 4, 2025

(54) THREE DIMENSIONAL MEMORY DEVICE CONTAINING RESONANT TUNNELING BARRIER AND HIGH MOBILITY CHANNEL AND METHOD OF MAKING THEREOF

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 458 days.

This patent is subject to a terminal disclaimer.

(21) Appl. No.: 17/664,550

(22) Filed: May 23, 2022

(65) Prior Publication Data

US 2023/0164988 A1 May 25, 2023

Related U.S. Application Data

(63) Continuation-in-part of application No. 17/673,137, filed on Feb. 16, 2022, which is a continuation-in-part
(Continued)

(51) Int. Cl.
*H10B 41/27* (2023.01)
*H01L 23/522* (2006.01)
(Continued)

(52) U.S. Cl.
CPC ......... *H10B 41/27* (2023.02); *H01L 23/5226* (2013.01); *H10B 41/10* (2023.02);
(Continued)

(58) Field of Classification Search
CPC ........ H10B 41/27; H10B 41/10; H10B 41/35; H10B 43/10; H10B 43/27; H10B 43/35;
(Continued)

(56) References Cited

U.S. PATENT DOCUMENTS 9,425,299 B1 8/2016 Rabkin et al.
9,449,985 B1 9/2016 Rabkin et al.
(Continued)

OTHER PUBLICATIONS

ISR—Notification of Transmittal of The International Search Report and Written Opinion of the International Searching Authority for International Patent Application No. PCT/US2022/29493, mailed Apr. 25, 2023, 9 pages.
(Continued)

*Primary Examiner* — Jerome Leboeuf
(74) *Attorney, Agent, or Firm* — THE MARBURY LAW GROUP PLLC

(57) ABSTRACT

A memory device includes at least one instance of a unit layer stack including a source layer, a channel-containing layer that contains a semiconductor channel, and a drain layer that are stacked along a vertical direction over a substrate; a memory opening vertically extending through the at least one instance of the unit layer stack; and a memory opening fill structure located in the memory opening and including a control gate electrode and a memory film in contact with each instance of the semiconductor channel. The memory film includes a resonant tunneling barrier stack, a barrier layer, and a memory material layer located between the resonant tunneling barrier stack and the barrier layer.

20 Claims, 74 Drawing Sheets

Related U.S. Application Data of application No. 17/534,528, filed on Nov. 24, 2021, now Pat. No. 12,016,179.

(51) Int. Cl.
  *H10B 41/10* (2023.01)
  *H10B 41/35* (2023.01)
  *H10B 43/10* (2023.01)
  *H10B 43/27* (2023.01)
  *H10B 43/35* (2023.01)

(52) U.S. Cl.
  CPC .............. *H10B 41/35* (2023.02); *H10B 43/10* (2023.02); *H10B 43/27* (2023.02); *H10B 43/35* (2023.02)

(58) Field of Classification Search
  CPC ........... H01L 23/5226; H01L 29/40117; H01L 29/512; H01L 29/7926; G11C 16/0483
  See application file for complete search history.

(56) References Cited

U.S. PATENT DOCUMENTS

| | | |
|---|---|---|
| 9,818,801 B1 | 11/2017 | Rabkin et al. |
| 9,941,295 B2 | 4/2018 | Rabkin et al. |
| 10,593,692 B2 | 3/2020 | Borukhov |
| 10,950,626 B2 | 3/2021 | Kai et al. |
| 11,018,153 B2 | 5/2021 | Kai et al. |
| 11,069,410 B1 | 7/2021 | Cui et al. |
| 11,251,199 B2 | 2/2022 | Zhang et al. |
| 2007/0029607 A1 | 2/2007 | Kouznetzov |
| 2016/0240550 A1 | 8/2016 | Jung et al. |
| 2016/0358933 A1 | 12/2016 | Rabkin et al. |
| 2018/0175048 A1 | 6/2018 | Yasuda et al. |
| 2019/0139983 A1 | 5/2019 | Lee et al. |
| 2019/0333930 A1 | 10/2019 | Borukhov |
| 2021/0175251 A1 | 6/2021 | Zhang et al. |
| 2021/0242241 A1 | 8/2021 | Rajashekhar et al. |
| 2021/0375908 A1 | 12/2021 | Baraskar et al. |
| 2021/0375909 A1 | 12/2021 | Baraskar et al. |
| 2021/0375910 A1 | 12/2021 | Baraskar et al. |
| 2021/0408032 A1 | 12/2021 | Baraskar et al. |
| 2021/0408033 A1 | 12/2021 | Baraskar et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.

Robertson, J., "Band Offsets, Schottky Barrier Heights, And Their Effects On Electronic Devices," Review Article, J. Vac. Sci. Technol., vol. A 31, No. 5, pp. 050821-1-050821-18, (2013); http://dx.doi.org/10.1116/1.4818426.

Tizno, O. et al., "Room-temperature Operation of Low-voltage, Non-volatile, Compound-semiconductor Memory Cells," Scientific Reports, vol. 9, No. 8950, pp. 1-8, (2019); https://doi.org/10.1038/s41598-019-45370-1.

Verma, S. (2010). *Tunnel barrier engineering for flash memory technology.* Stanford University; http://purl.stanford.edu/ds551wt1033.

U.S. Appl. No. 17/534,528, filed Nov. 24, 2021, SanDisk Technologies LLC.

U.S. Appl. No. 17/673,137, filed Feb. 26, 2022, SanDisk Technologies LLC.

Rabkin, P. et al., "Three Dimensional Memory Device Containing Resonant Tunneling Barrier And High Mobility Channel And Method Of Making Thereof," U.S. Appl. No. 17/664,542, filed May 23, 2022.

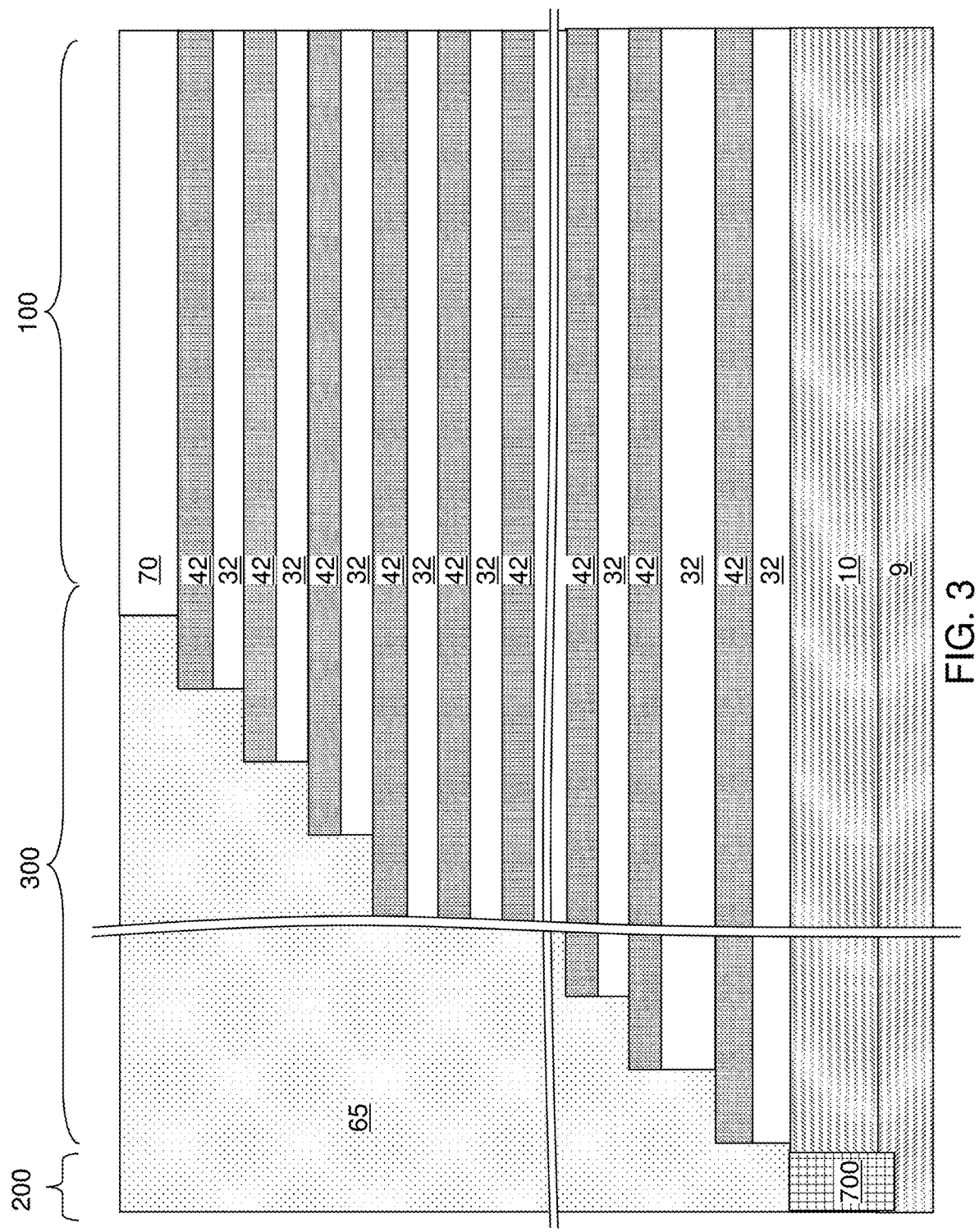

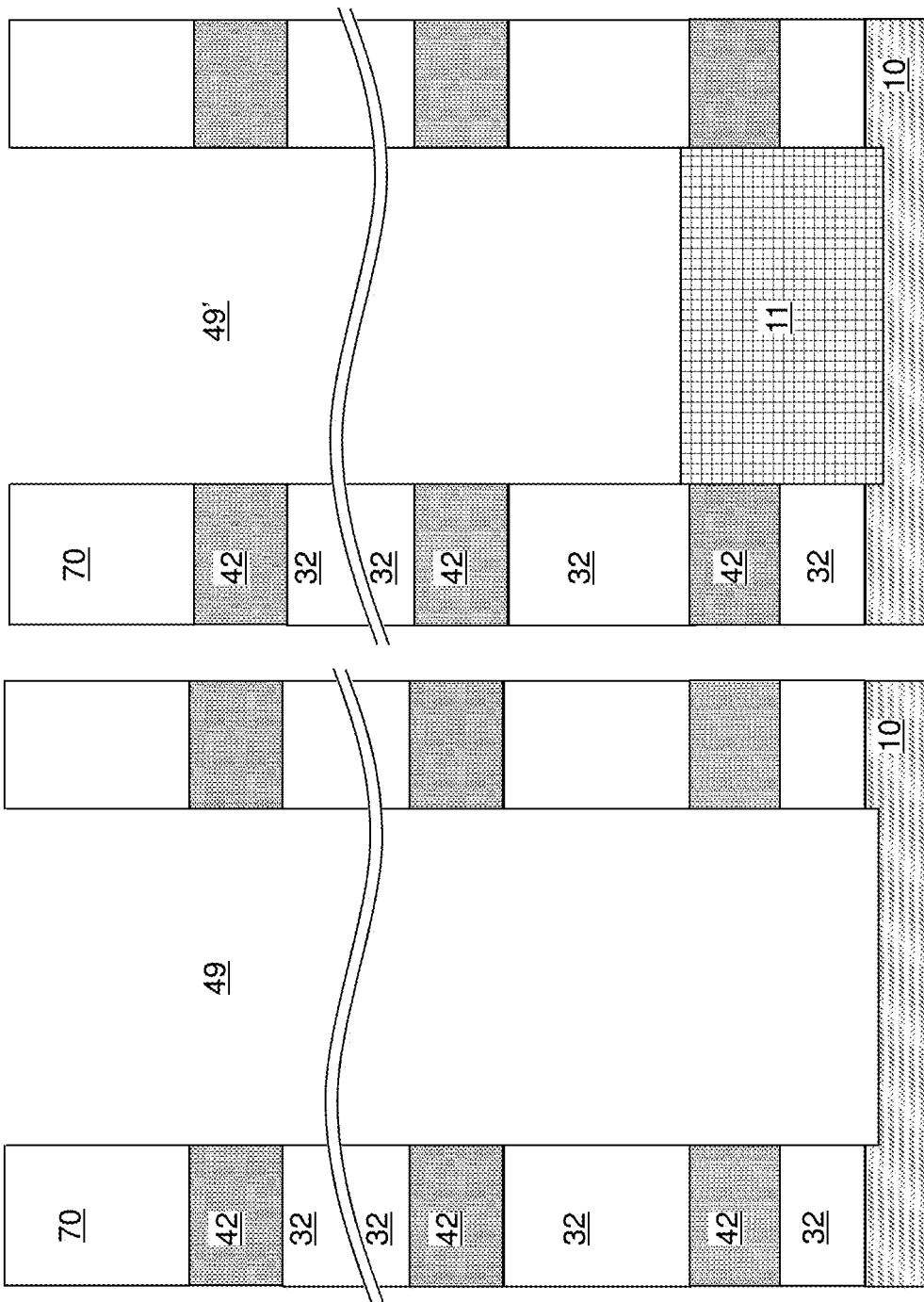

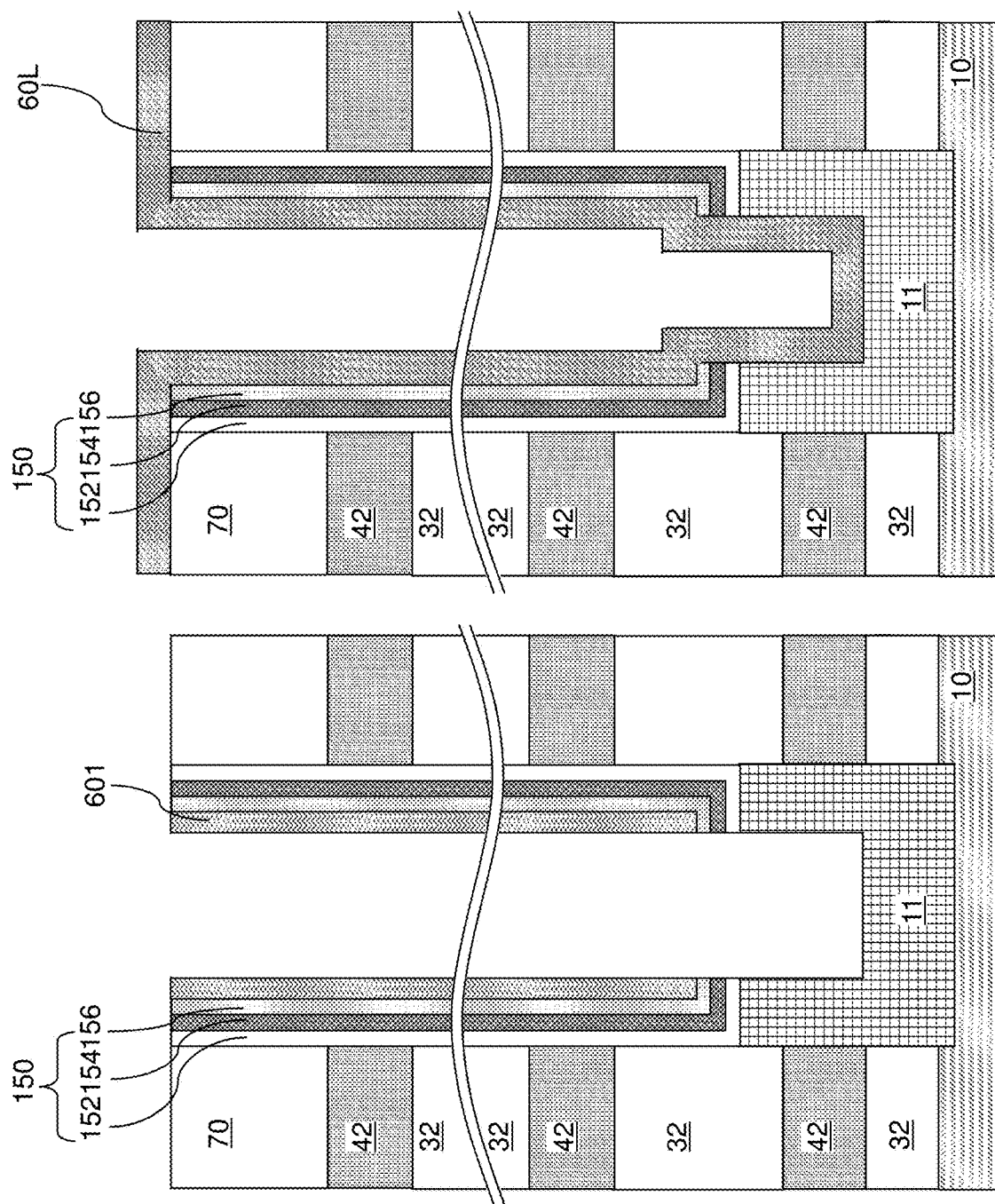

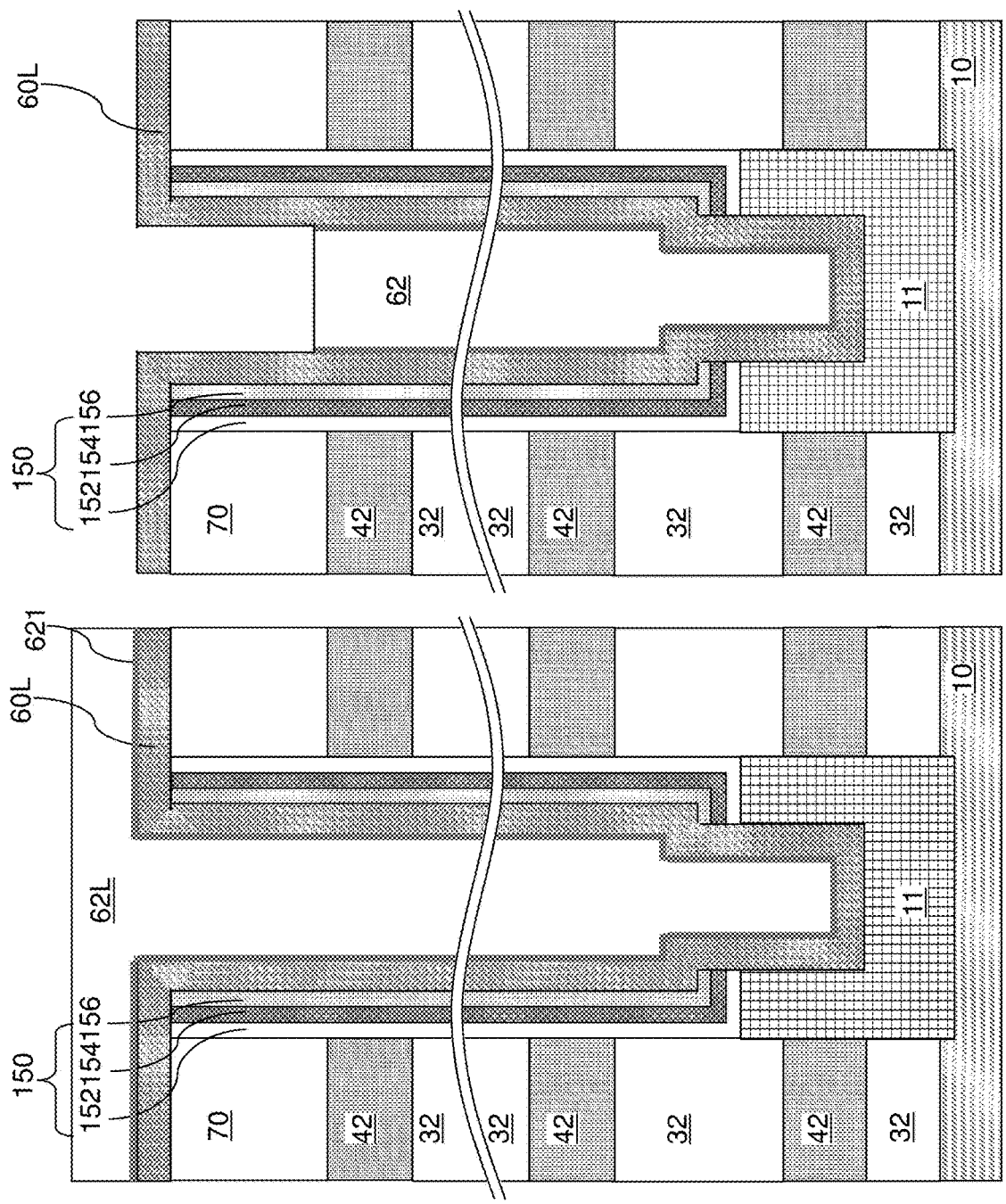

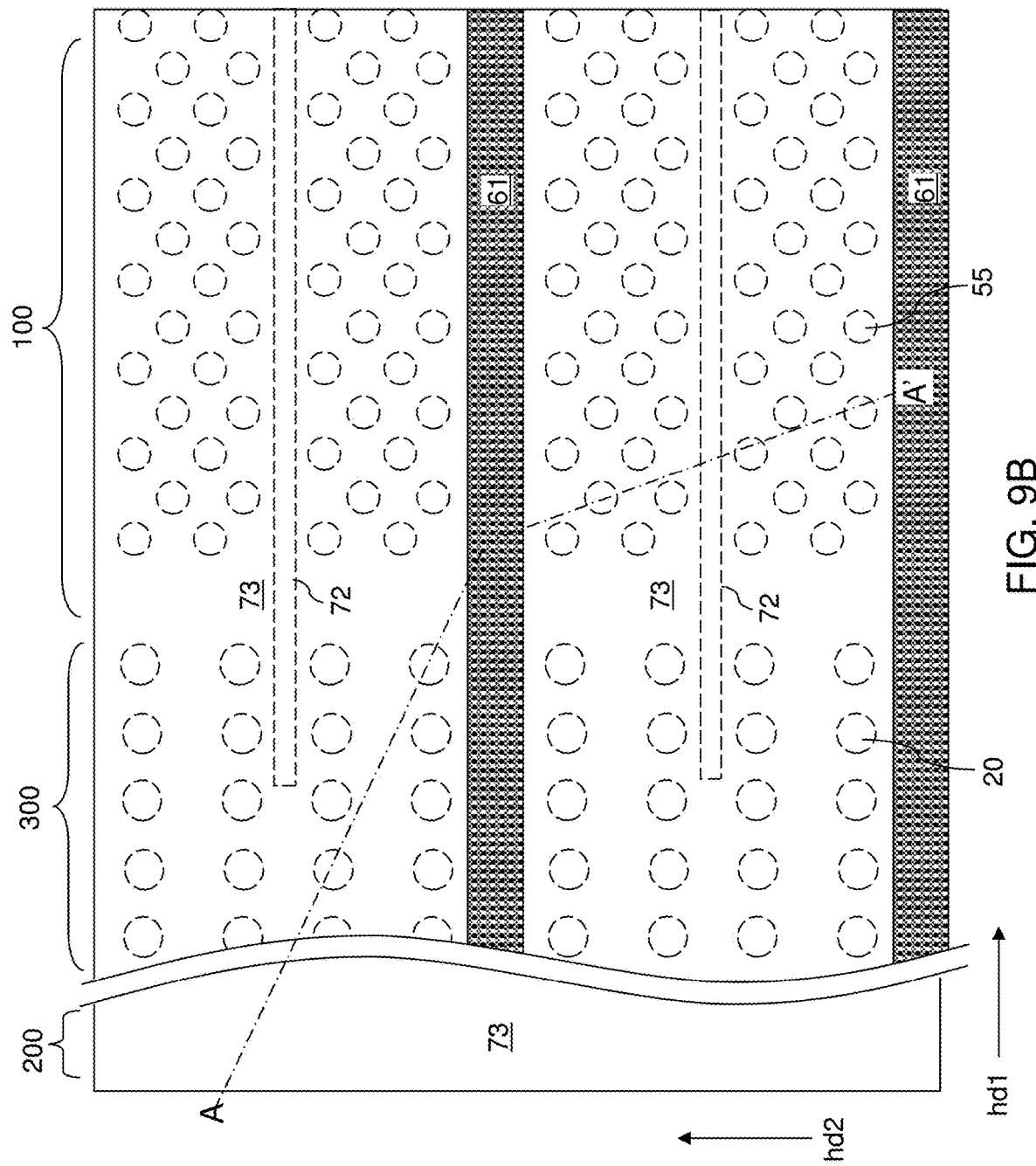

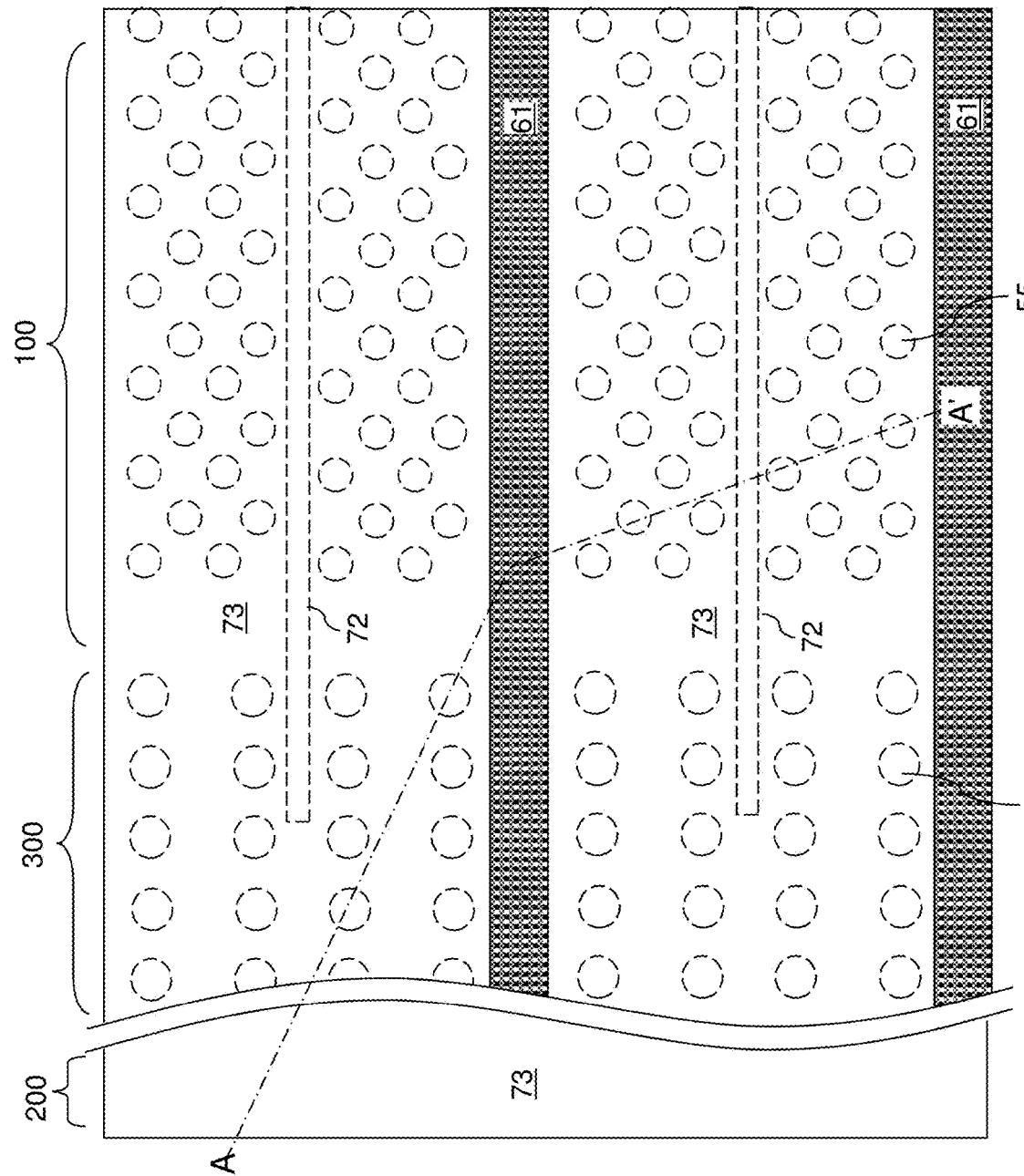

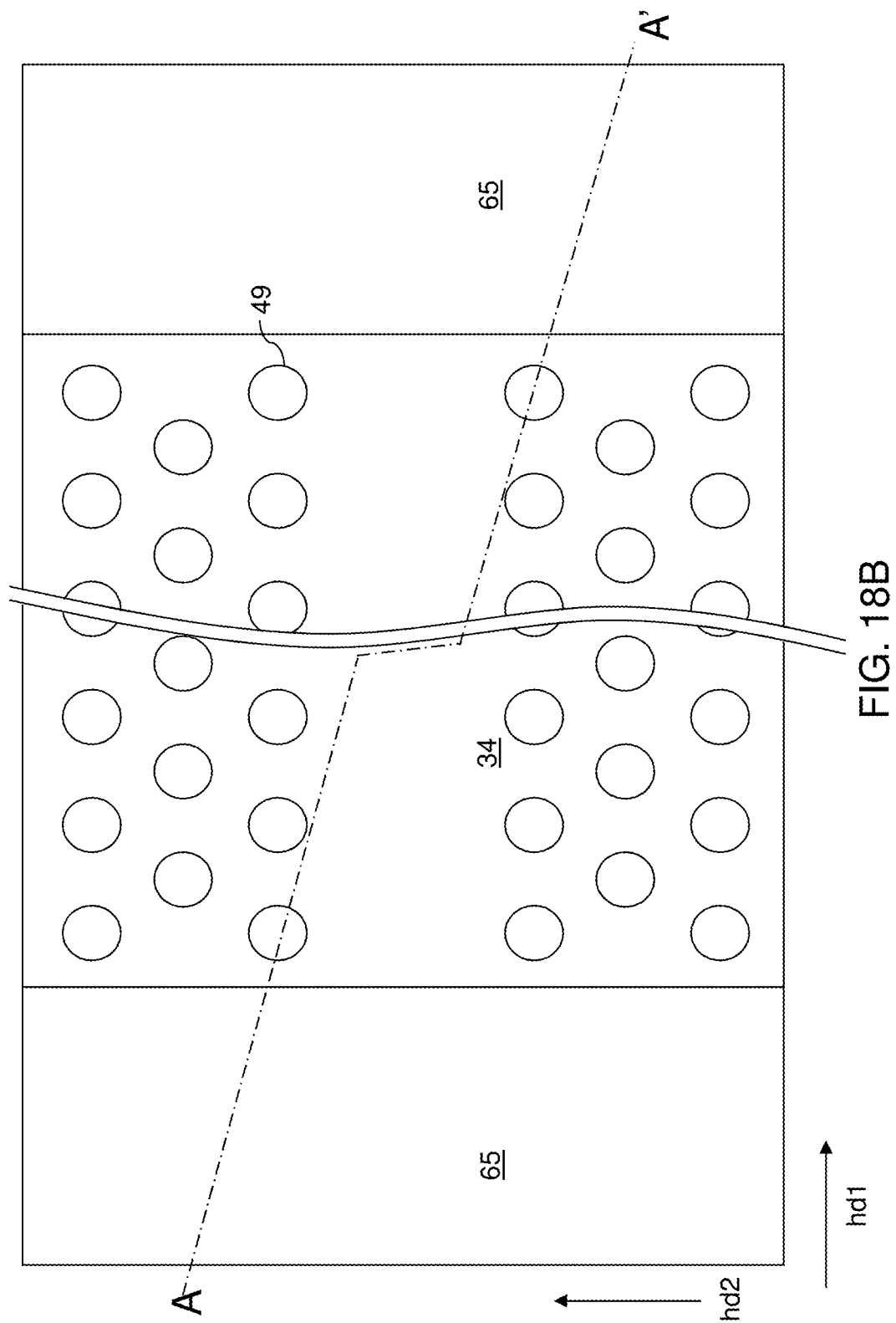

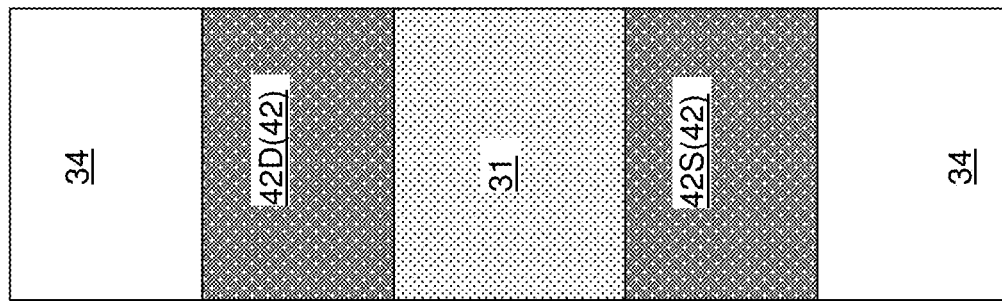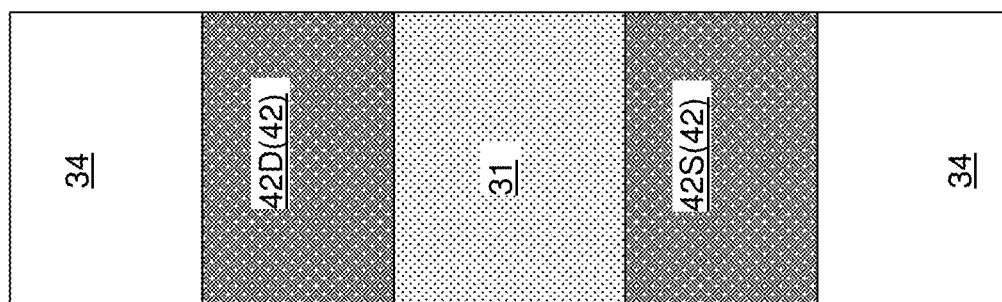
FIG. 18C

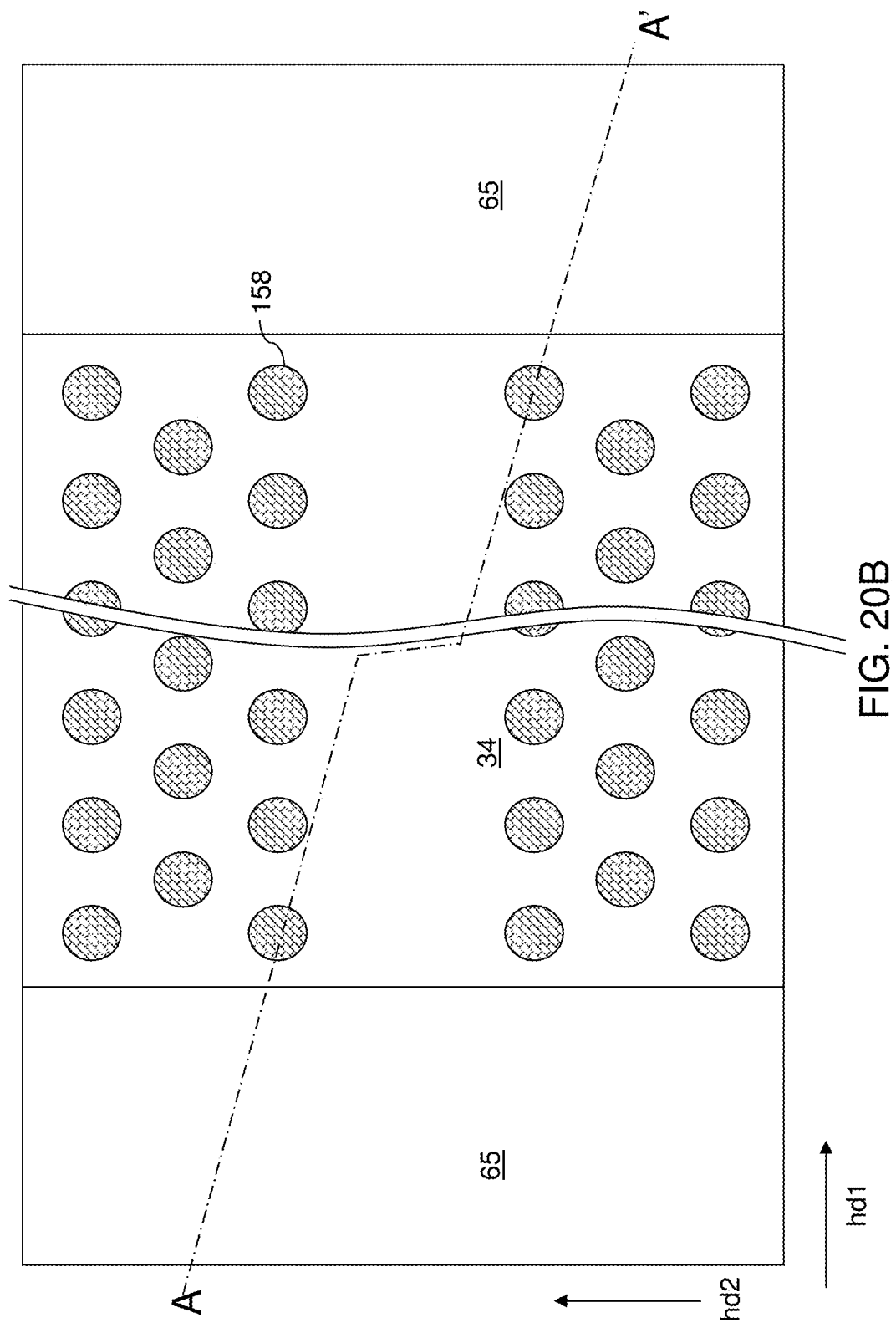

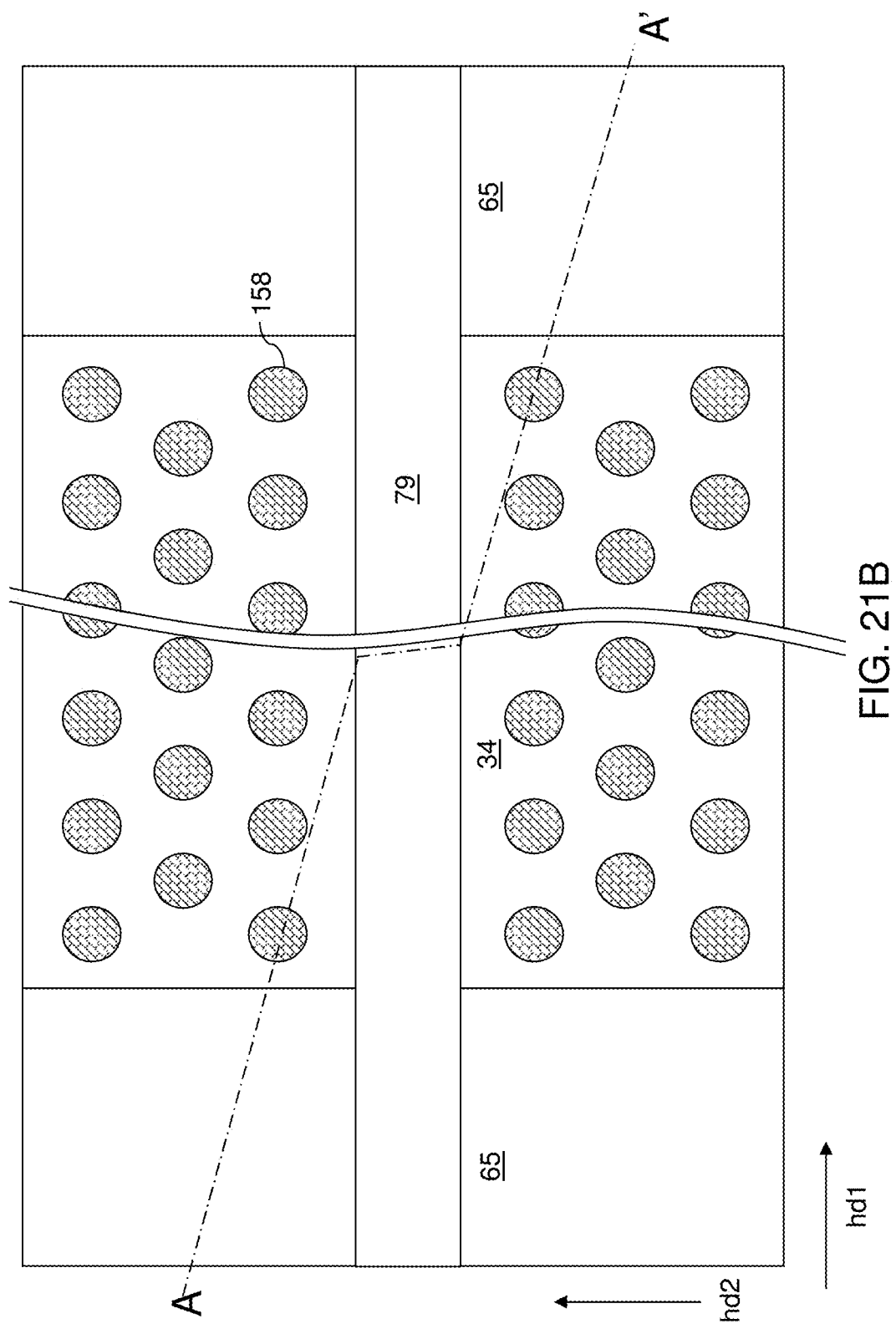

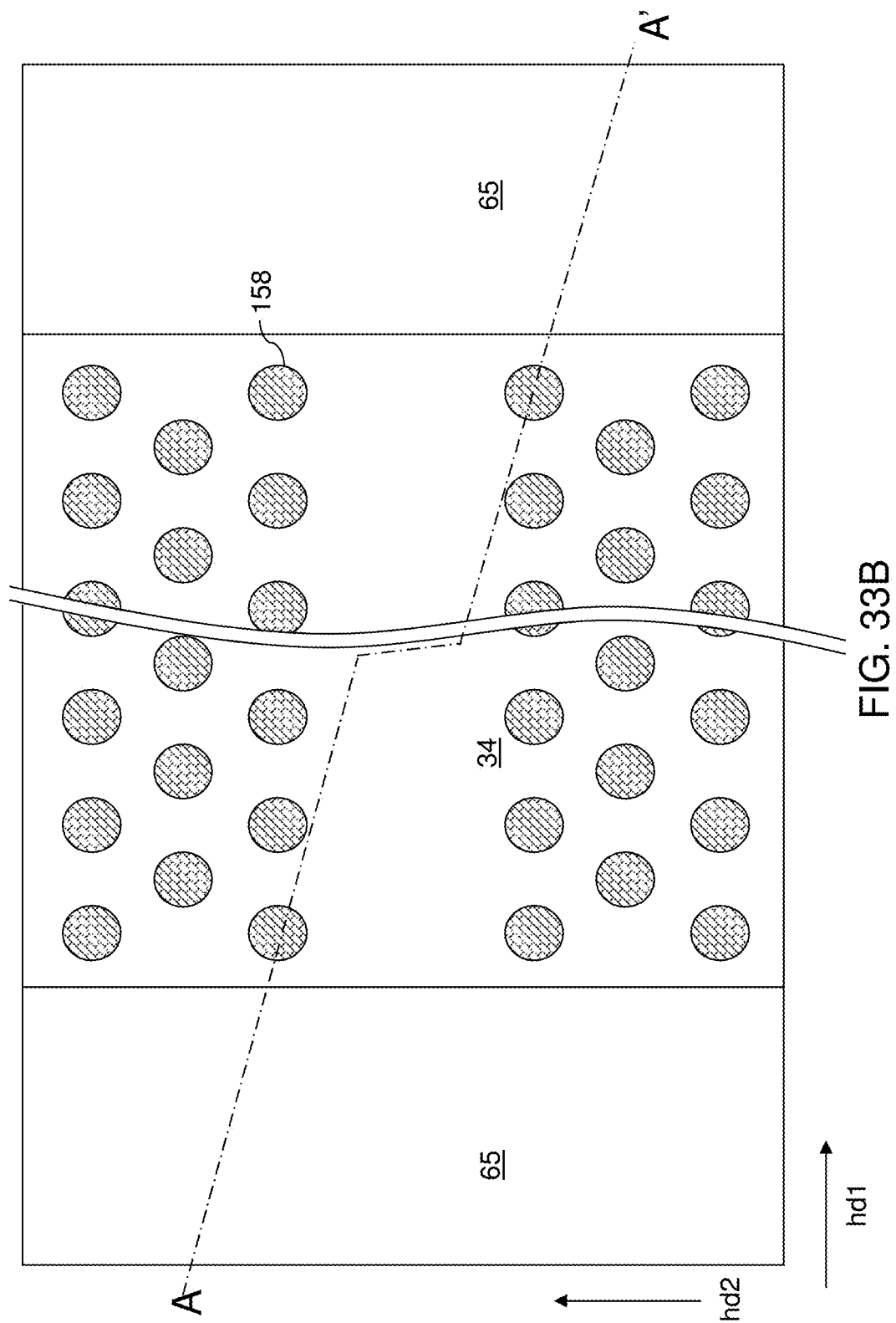

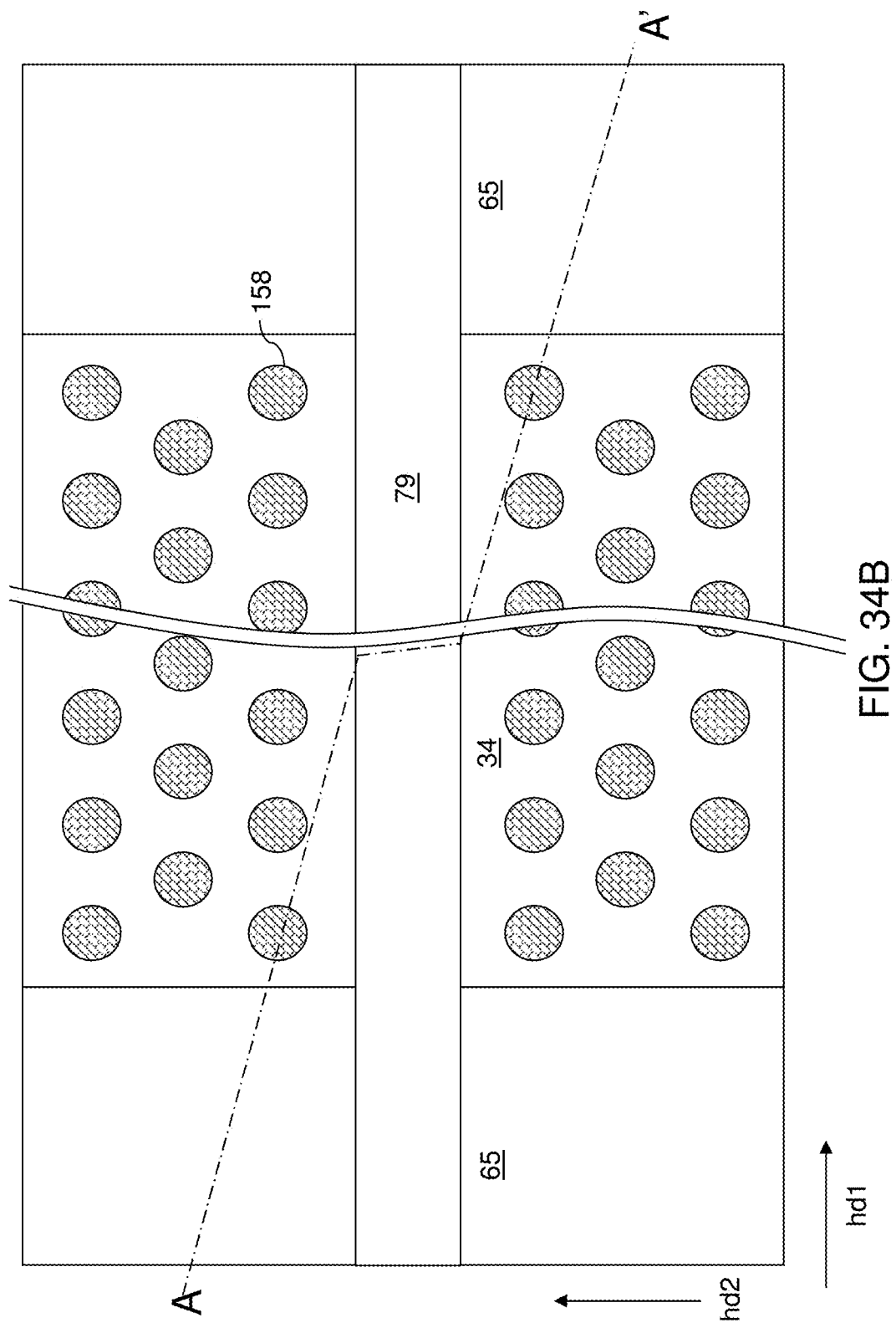

THREE DIMENSIONAL MEMORY DEVICE CONTAINING RESONANT TUNNELING BARRIER AND HIGH MOBILITY CHANNEL AND METHOD OF MAKING THEREOF

RELATED APPLICATIONS

This application is a continuation-in-part (CIP) application of U.S. application Ser. No. 17/673,137 filed on Feb. 16, 2022, which is a CIP application of U.S. application Ser. No. 17/534,528 filed on Nov. 24, 2021, the entire contents of which are incorporated herein by reference.

FIELD

The present disclosure relates generally to the field of semiconductor devices, and particularly to a three-dimensional memory device containing a resonant tunneling barrier and a high mobility channel and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: at least one instance of a unit layer stack including a source layer, a channel-containing layer that contains a semiconductor channel, and a drain layer that are stacked along a vertical direction over a substrate; a memory opening vertically extending through the at least one instance of the unit layer stack; and a memory opening fill structure located in the memory opening and comprising a control gate electrode and a memory film in contact with each instance of the semiconductor channel, wherein the memory film comprises a resonant tunneling barrier stack, a barrier layer, and a memory material layer located between the resonant tunneling barrier stack and the barrier layer.

According to another aspect of the present disclosure, a method of making a memory device is provided, which comprises: forming at least one instance of a unit layer stack including a source-level material layer, a channel-level material layer, and a drain-level material layer over a substrate, wherein the source-level material layer and the drain-level material layer are formed as, or are subsequently replaced with, an electrically conductive source layer and an electrically conductive drain layer, and wherein the channel-level material layer comprises a semiconductor channel or is replaced with the semiconductor channel; forming a memory opening through the at least one instance of the unit layer stack; forming a memory film in the memory opening, wherein the memory film comprises a layer stack that includes a resonant tunneling barrier stack, a barrier layer, and a memory material layer located between the resonant tunneling barrier stack and the barrier layer; and forming a control gate electrode on an inner sidewall of the memory film.

According to an aspect of the present disclosure, a three-dimensional memory device contains a plurality of levels of memory structures. Each level of memory structures includes a memory film containing a layer stack that includes a resonant tunneling barrier stack, a semiconductor barrier layer, and a memory material layer located between the resonant tunneling barrier stack and the semiconductor barrier layer, a semiconductor channel, and a control gate electrode.

According to another aspect of the present disclosure, a method of making a memory device is provided, which comprises: forming at least one instance of a unit layer stack including a source-level material layer, a channel-level material layer, and a drain-level material layer over a substrate, wherein the source-level material layer and the drain-level material layer are formed as, or are subsequently replaced with, an electrically conductive source layer and an electrically conductive drain layer, and wherein the channel-level material layer comprises a semiconductor channel or is replaced with the semiconductor channel; forming a memory opening through the at least one instance of the unit layer stack; forming a memory film in the memory opening, wherein the memory film comprises a layer stack that includes a resonant tunneling barrier stack, a semiconductor barrier layer, and a memory material layer located between the resonant tunneling barrier stack and the semiconductor barrier layer; and forming a control gate electrode on an inner sidewall of the memory film.

According to an aspect of the present disclosure, a memory device includes an alternating stack of insulating layers and control gate layers, a memory opening vertically extending through the alternating stack, and a memory opening fill structure containing a memory film and a vertical semiconductor channel located within the memory opening. The memory film contains a resonant tunneling barrier stack, a semiconductor barrier layer, and a memory material layer located between the resonant tunneling barrier stack and the semiconductor barrier layer.

According to another aspect of the present disclosure, a method of making memory device includes forming an alternating stack of insulating layers and control gate layers over a substrate, forming a memory opening vertically extending through the alternating stack, and forming a memory opening fill structure comprising a memory film and a vertical semiconductor channel within the memory opening. The memory film comprises a resonant tunneling barrier stack, a semiconductor barrier layer, and a memory material layer located between the resonant tunneling barrier stack and the semiconductor barrier layer.

BRIEF DESCRIPTION OF THE DRAWINGS

FIG. 3 is a schematic vertical cross-sectional view of the first exemplary structure after formation of stepped terraces and a retro-stepped dielectric material portion according to the first embodiment of the present disclosure.

FIGS. 5A-5G are sequential schematic vertical cross-sectional views of a memory opening during formation of a memory opening fill structure according to the first embodiment of the present disclosure.

FIG. 9B is a partial see-through top-down view of the first exemplary structure of FIG. 9A. The vertical plane A-A' is the plane of the schematic vertical cross-sectional view of FIG. 9A.

FIG. 12B is a top-down view of the first exemplary structure of FIG. 12A.

FIG. 18B is a top-down view of the second exemplary structure of FIG. 18A.

FIG. 18C is a vertical cross-sectional view of a region of the second exemplary structure around a memory opening at the processing step of FIGS. 18A and 18B.

FIG. 20B is a vertical cross-sectional view of a region of the second exemplary structure around a memory opening at the processing step of FIG. 20A.

FIG. 21B is a vertical cross-sectional view of a region of the second exemplary structure around a memory opening at the processing step of FIG. 21A.

FIG. 33B is a vertical cross-sectional view of a region of the third exemplary structure around a memory opening at the processing step of FIG. 33A.

FIG. 34B is a vertical cross-sectional view of a region of the third exemplary structure around a memory opening at the processing step of FIG. 34A.

DETAILED DESCRIPTION

Figure 1:
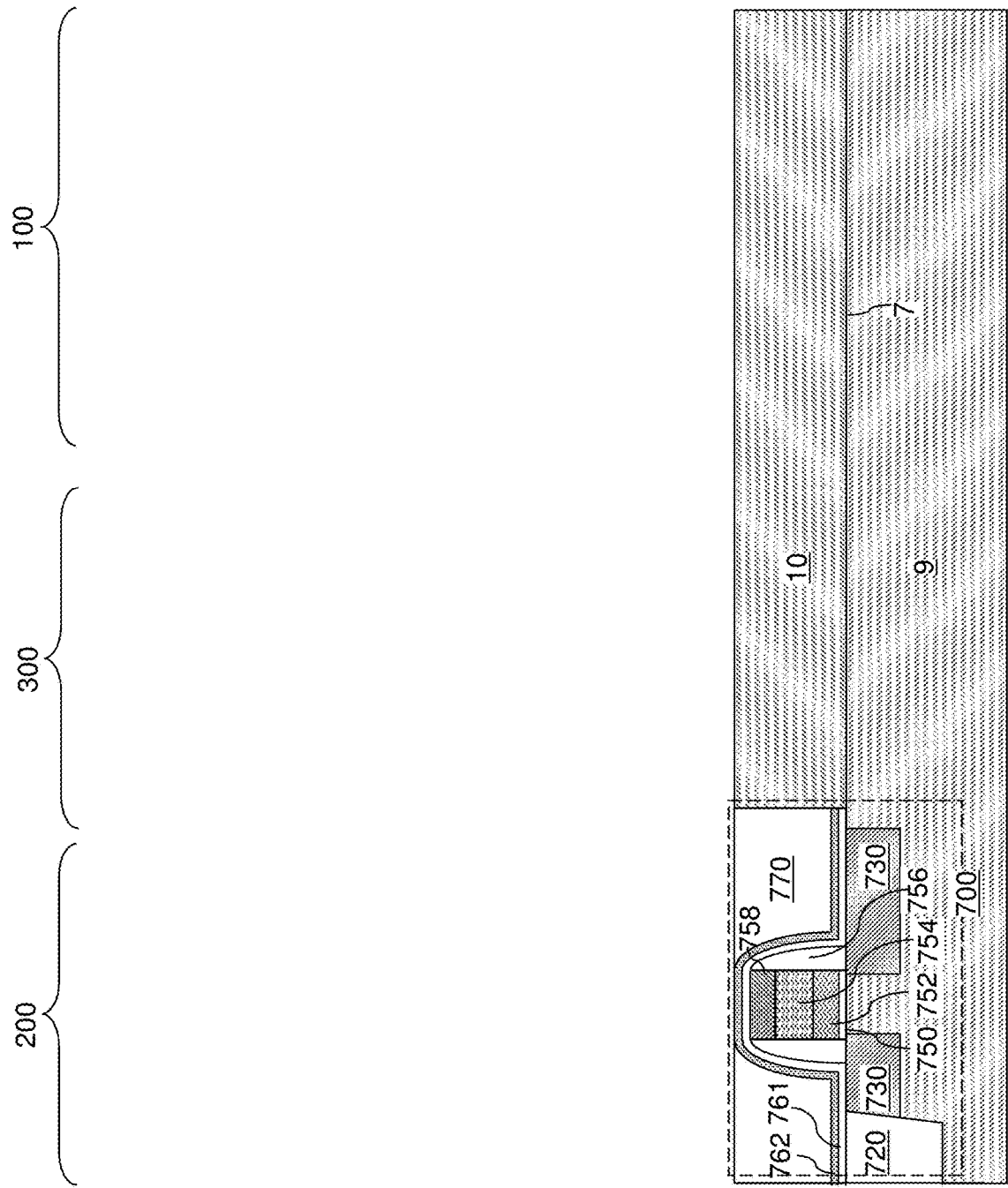
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices containing a resonant tunneling barrier and a high mobility channel and methods of making thereof, the various aspects of which are described below. The embodiments of the disclosure can be employed to form various structures including a multilevel memory structure, non-limiting examples of which include semiconductor devices such as three-dimensional memory array devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
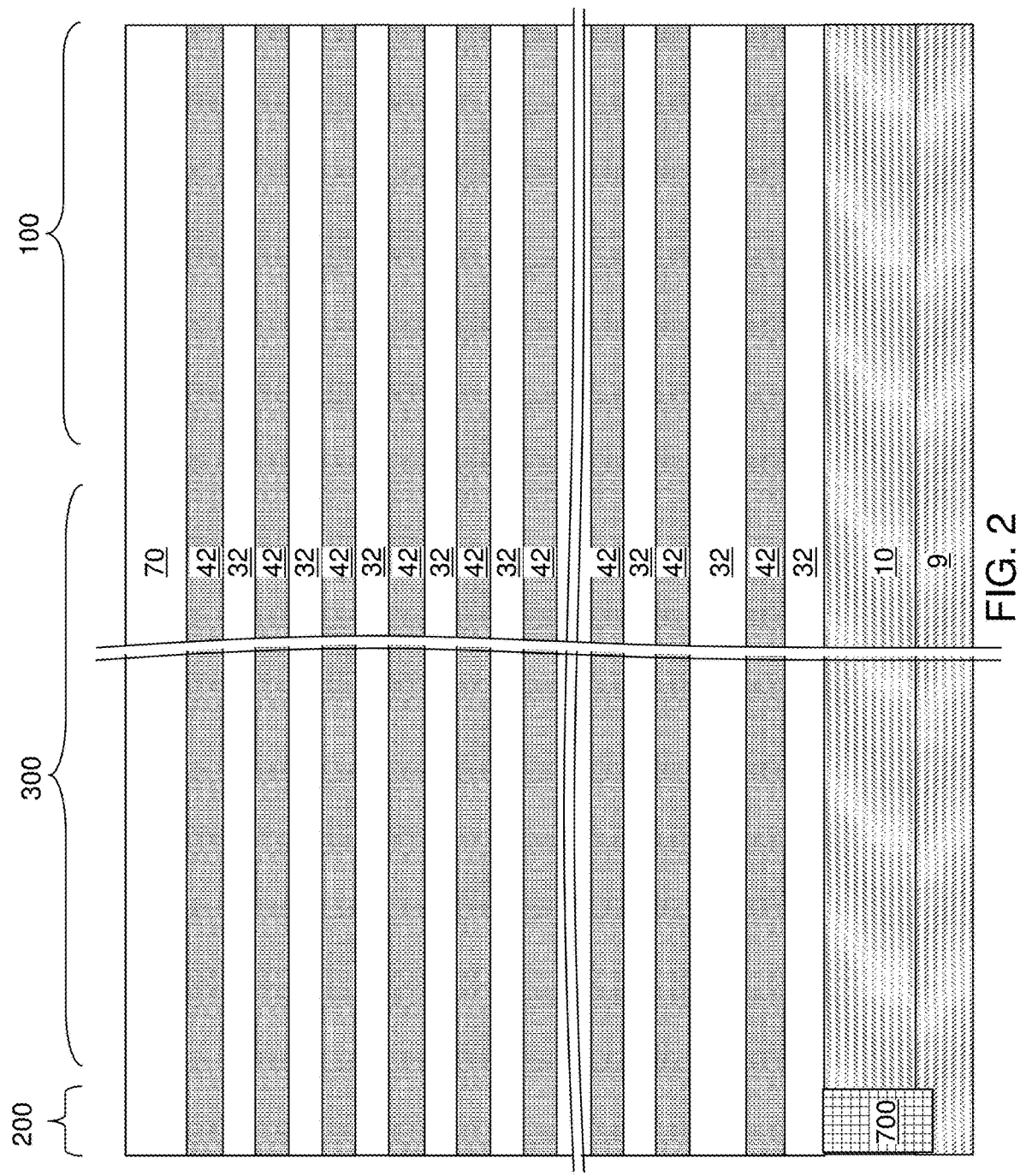
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. The sacrificial material layers 42 are replaced with electrically conductive layers that function as control gate electrodes. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
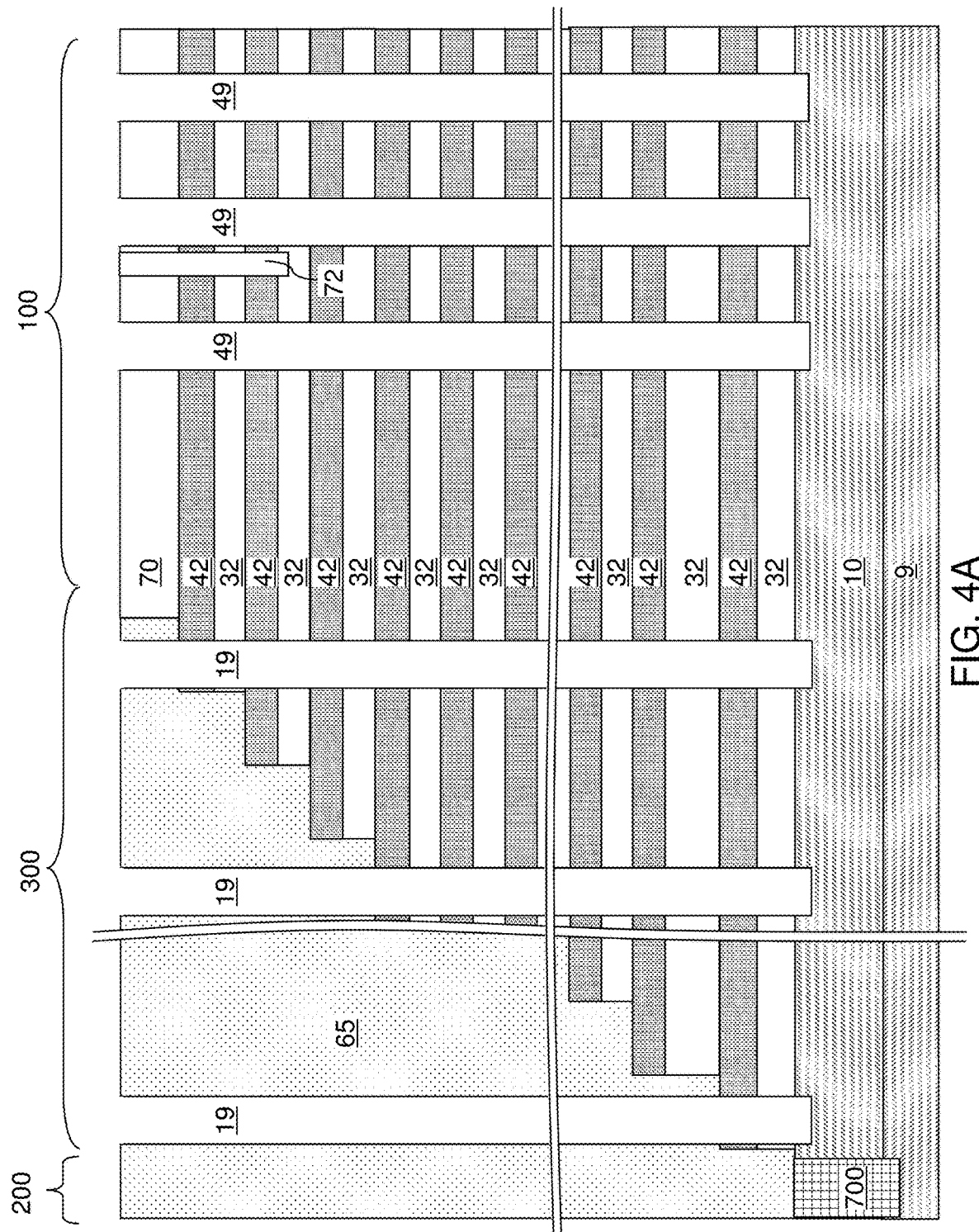
FIG. 4A is a schematic vertical cross-sectional view of the first exemplary structure after formation of memory openings and support openings according to the first embodiment of the present disclosure.
Figure 4B:
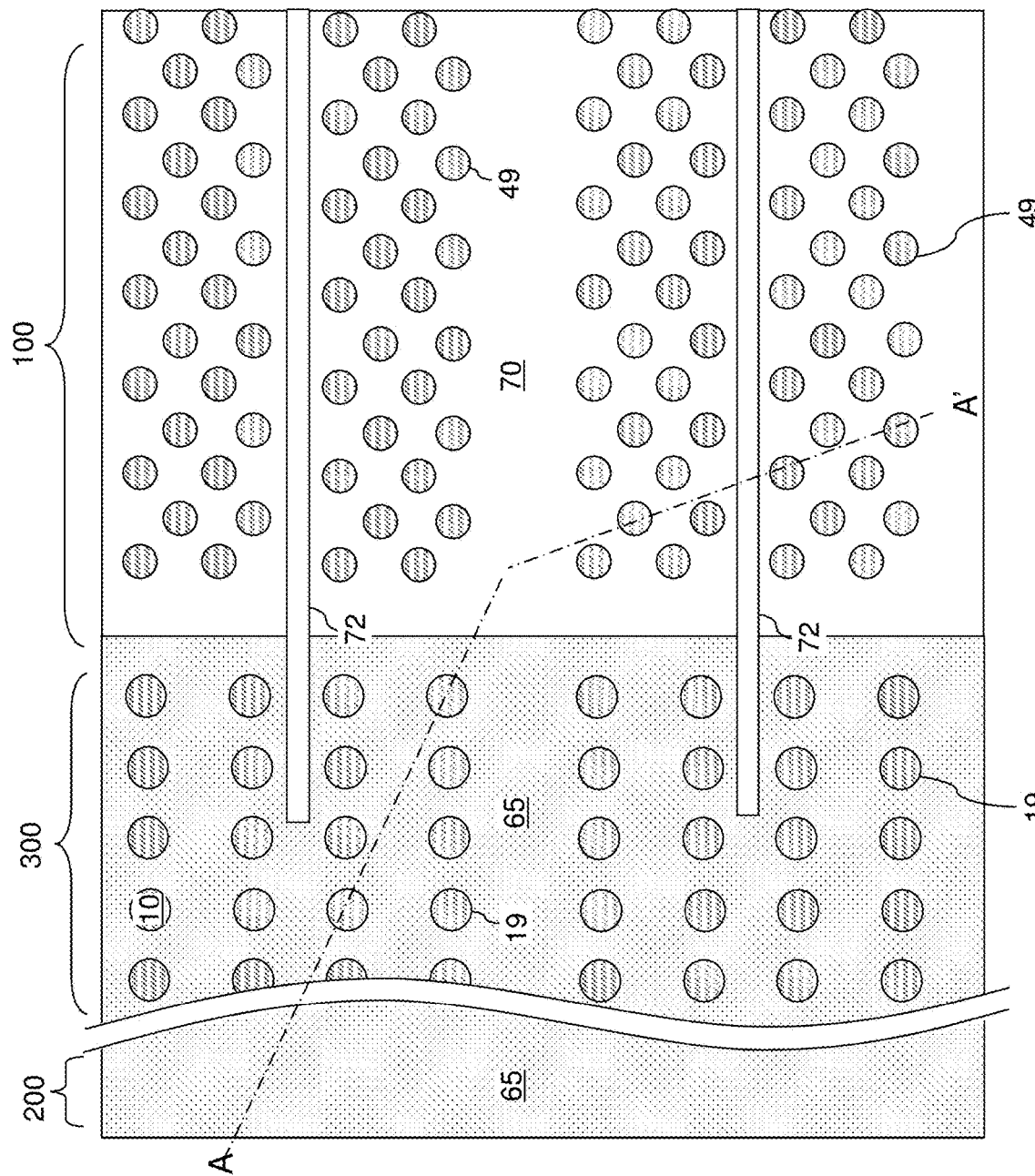
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9. Generally, an alternating stack of insulating layers 32 and spacer material layers over a substrate. The spacer material layers are formed as, or are subsequently replaced with, electrically conductive layers. The spacer material layers comprise the sacrificial material layers 42 in case the spacer material layers are subsequently replaced with the electrically conductive layers.

Figure 5C:
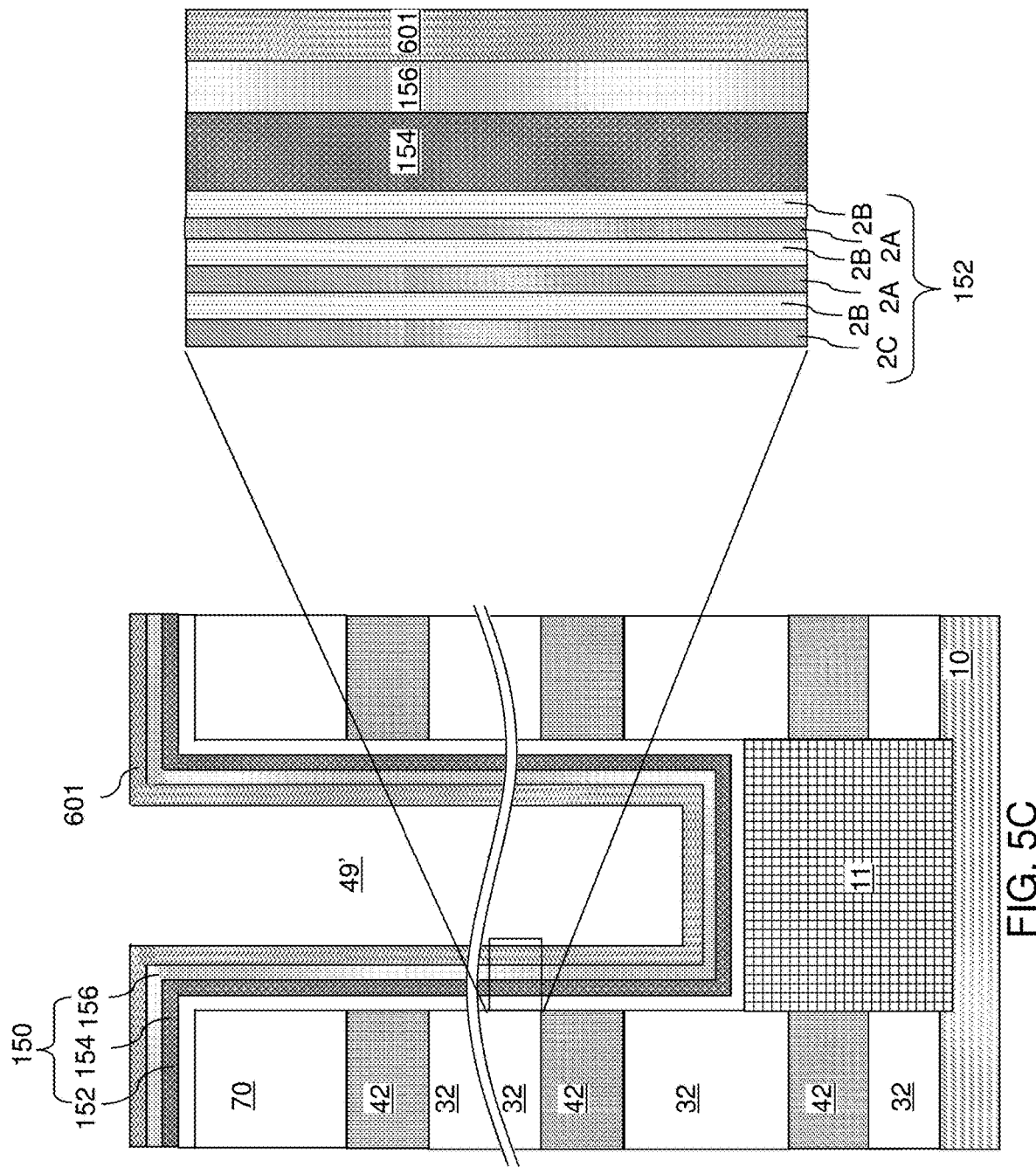

FIGS. 5A-5G are sequential schematic vertical cross-sectional views of a memory opening during formation of a memory opening fill structure according to the first embodiment of the present disclosure. Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a layer stack including a memory film 150 and an optional sacrificial cover material layer 601 can be formed by a series of conformal deposition processes. The memory film 150 includes a resonant tunneling barrier stack 152, a memory material layer 154, and a semiconductor barrier layer 156.

The resonant tunneling barrier stack 152 includes at least two semiconductor quantum wells. Each semiconductor quantum well includes a well layer 2A located between two barrier layers 2B. The well layer 2A comprises a semiconductor material having a relatively narrow first bandgap, and the barrier layers 2B comprise a semiconductor material having a relatively wide second bandgap which is wider than the first bandgap. For example, the well layer 2A and the barrier layers 2B of the semiconductor quantum well comprise compound semiconductor layers, such as Group III-V semiconductor layers. In one embodiment, the well layer 2A may have a direct bandgap less than 1 eV, such as less than 0.5 eV, for example, 0.3 eV to 0.45 eV. For example, the well layer 2A may comprise indium arsenide, which has a direct bandgap of about 0.36 eV. In one embodiment, the barrier layers 2B may have a direct bandgap greater than 1.5 eV, such as than greater than 2 eV, for example, 2.1 eV to 2.3 eV. For example, the barrier layers 2B may comprise aluminum antimonide, which has a direct bandgap of about 2.22 eV. Other semiconductor layers may be used instead of InAs and/or AlSb. In one embodiment, resonant tunneling barrier stack 152 includes two semiconductor quantum wells comprising three wide bandgap semiconductor barrier layers 2B interlaced with two narrow bandgap semiconductor well layers 2A. Optionally, an optional InAs interface layer 2C may be located on a sidewall of the memory opening (i.e., may comprise the outer surface of the resonant tunneling barrier stack 152).

Each of the barrier layers 2B may have a thickness in a range from 1 nm to 3 nm, such as from 1.2 nm to 2 nm, although lesser and greater thicknesses may also be employed. Each of the well layers 2A may have a thickness in a range from 1 nm to 4 nm, such as from 2 nm to 3 nm, although lesser and greater thicknesses may also be employed. In a non-limiting illustrative example, a resonant tunneling barrier stack 152 may comprise, from outside to inside (which corresponds to the order of deposition), an optional semiconductor interface layer 2C composed of InAs and having a thickness in a range from 1 nm to 1.5 nm, a first semiconductor barrier layer 2B composed of AlSb and having a thickness of about 1.8 nm, a first semiconductor well layer 2A composed of InAs and having a thickness of about 3 nm, a second semiconductor barrier layer 2B composed of AlSb and having a thickness of about 1.2 nm, a second semiconductor well layer 2A composed of InAs and having a thickness of about 2.4 nm, and a third semiconductor barrier layer 2B composed of AlSb and having a thickness of about 1.8 nm.

The memory material layer 154 can be deposited as a continuous material layer by a conformal deposition process such as a chemical vapor deposition process or an atomic layer deposition process. The memory material layer 154 includes a memory material, i.e., a material that can store data by selecting a state of the material. For example, the memory material layer 154 may include a charge storage material such as silicon nitride, polysilicon, or a metallic material. The memory material layer 154 can be formed as a single memory material layer of homogeneous composition, or can include a stack of multiple memory material layers. In one embodiment, the memory material layer 154 may comprise an insulating charge trapping material, such as one or more silicon nitride segments. The memory material layer 154 can be formed, for example, by chemical vapor deposition (CVD), atomic layer deposition (ALD), physical vapor deposition (PVD), or any suitable deposition technique for storing electrical charges therein. The thickness of the memory material layer 154 can be in a range from 2 nm to 20 nm, although lesser and greater thicknesses can also be employed. In one embodiment, the memory material layer 154 may comprise a charge storage layer consisting essentially of silicon nitride and having a thickness in a range from 4 nm to 6 nm, although lesser and greater thicknesses may also be employed.

The semiconductor barrier layer 156 may have a relatively wide bandgap and relatively high thickness which prevents electron tunneling therethrough. Thus, the semiconductor barrier layer 156 may function as a blocking layer in a charge storage NAND device. In one embodiment, the semiconductor barrier layer comprises a compound semiconductor material having a band gap greater than 2 eV. The semiconductor barrier layer 156 may comprise aluminum antimonide have a direct band gap of about 2.22 eV. The thickness of the homogeneous barrier layer 156 may be at least 8 nm, such as in a range from 8 nm to 20 nm, such as from 10 nm to 12 nm, although lesser and greater thicknesses may also be employed. The semiconductor barrier layer 156 may comprise a homogeneous barrier layer having a homogeneous material composition throughout.

The optional sacrificial cover material layer 601 includes a sacrificial material that can be subsequently removed selective to the material of the homogeneous barrier layer 156. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (152, 154, 156, 601).

Referring to FIG. 5D, the optional sacrificial cover material layer 601, the semiconductor barrier layer 156, the memory material layer 154, and the resonant tunneling barrier stack 152 overlying the insulating cap layer 70 are sequentially anisotropically etched employing at least one anisotropic etch process. The portions of the sacrificial cover material layer 601, the semiconductor barrier layer 156, the memory material layer 154, and the resonant tunneling barrier stack 152 located above the top surface of the insulating cap layer 70 can be removed by the at least one anisotropic etch process. Further, the horizontal portions of the sacrificial cover material layer 601, the semiconductor barrier layer 156, the memory material layer 154, and the resonant tunneling barrier stack 152 at a bottom of each memory cavity 49' can be removed to form openings in remaining portions thereof. Each of the sacrificial cover material layer 601, the semiconductor barrier layer 156, the memory material layer 154, and the resonant tunneling barrier stack 152 can be etched by a respective anisotropic etch process employing a respective etch chemistry, which may, or may not, be the same for the various material layers.

Each remaining portion of the sacrificial cover material layer 601 can have a tubular configuration. In one embodiment, the memory material layer 154 can include a vertical stack of charge storage regions that store electrical charges upon programming. In one embodiment, the memory material layer 154 can be a silicon nitride layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the semiconductor barrier layer 156, the memory material layer 154, and the resonant tunneling barrier stack 152. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A semiconductor barrier layer 156 is located over the memory material layer 154. A set of a resonant tunneling barrier stack 152, a memory material layer 154, and a semiconductor barrier layer 156 in a memory opening 49 constitutes a memory film 50, which includes a plurality of charge storage regions (comprising portions of the memory material layer 154) that are insulated from surrounding materials by the resonant tunneling barrier stack 152 and the semiconductor barrier layer 156. In one embodiment, the sacrificial cover material layer 601, the semiconductor barrier layer 156, the memory material layer 154, and the resonant tunneling barrier stack 152 can have vertically coincident sidewalls. The sacrificial cover material layer 601 can be subsequently removed selective to the material of the semiconductor barrier layer 156. In case the sacrificial cover material layer 601 includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer 601.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the semiconductor barrier layer 156. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes a high mobility, narrow bandgap semiconductor material such as indium arsenide. Use of a narrow bandgap semiconductor material for the semiconductor channel layer 60L provides the advantage of enhanced charge carrier mobility in a vertical semiconductor channel. The semiconductor channel layer 60L can have a doping of a first conductivity type (e.g., n-type), which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. Optionally, an interfacial dielectric layer 621 (such as an aluminum oxide layer) having a thickness in a range from 2 nm to 4 nm may be formed prior to formation of the dielectric core layer 62L. The interfacial dielectric layer 621 can increase the charge carrier mobility in the semiconductor channel layer 60L. The dielectric core layer 62L includes a dielectric material, such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L (and the interfacial dielectric layer 621, if present) can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Figure 6:
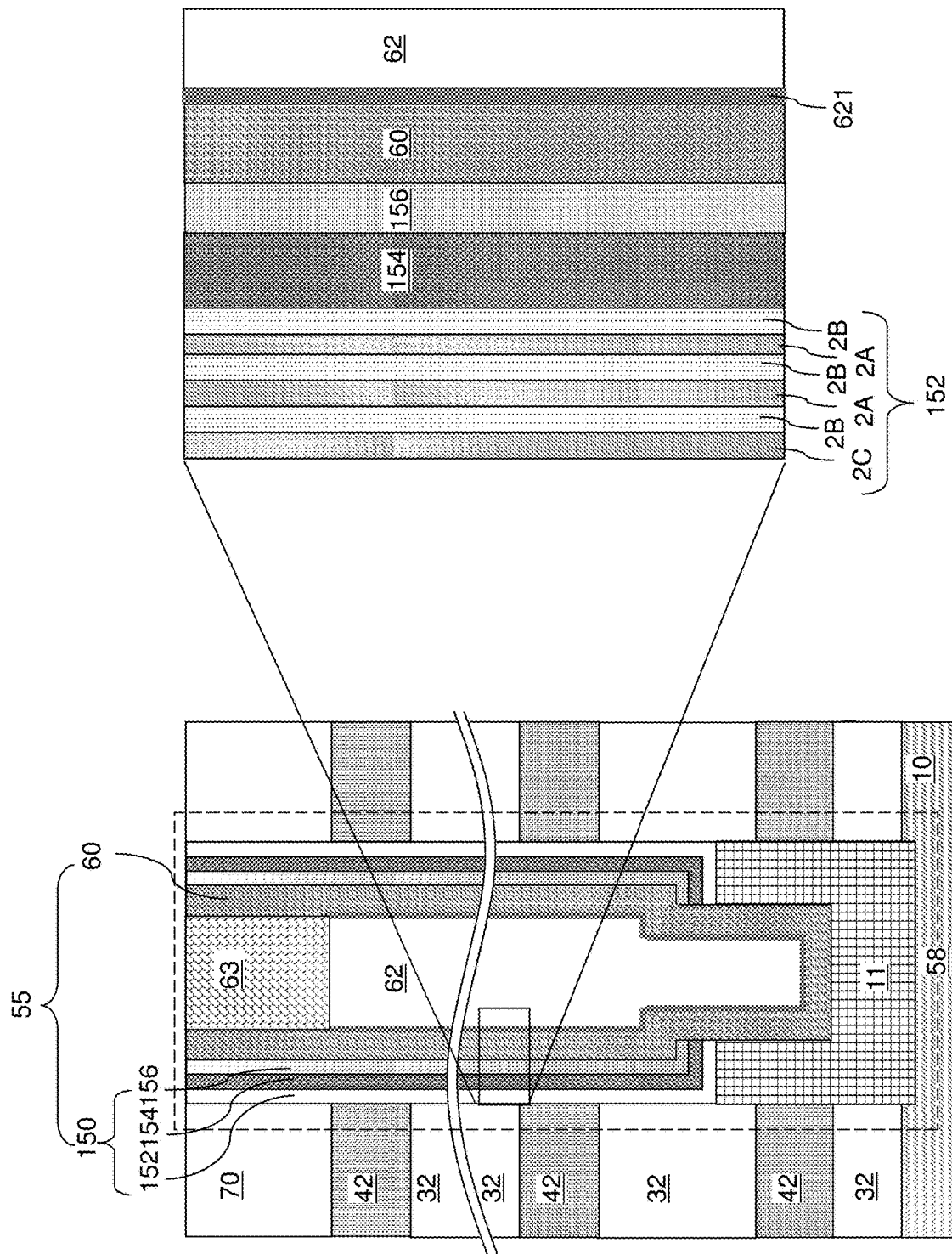
FIG. 6 is a schematic vertical cross-sectional view of a memory opening fill structure according to an embodiment of the present disclosure

Referring to FIG. 6, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the semiconductor barrier layer 156.

Figure 7:
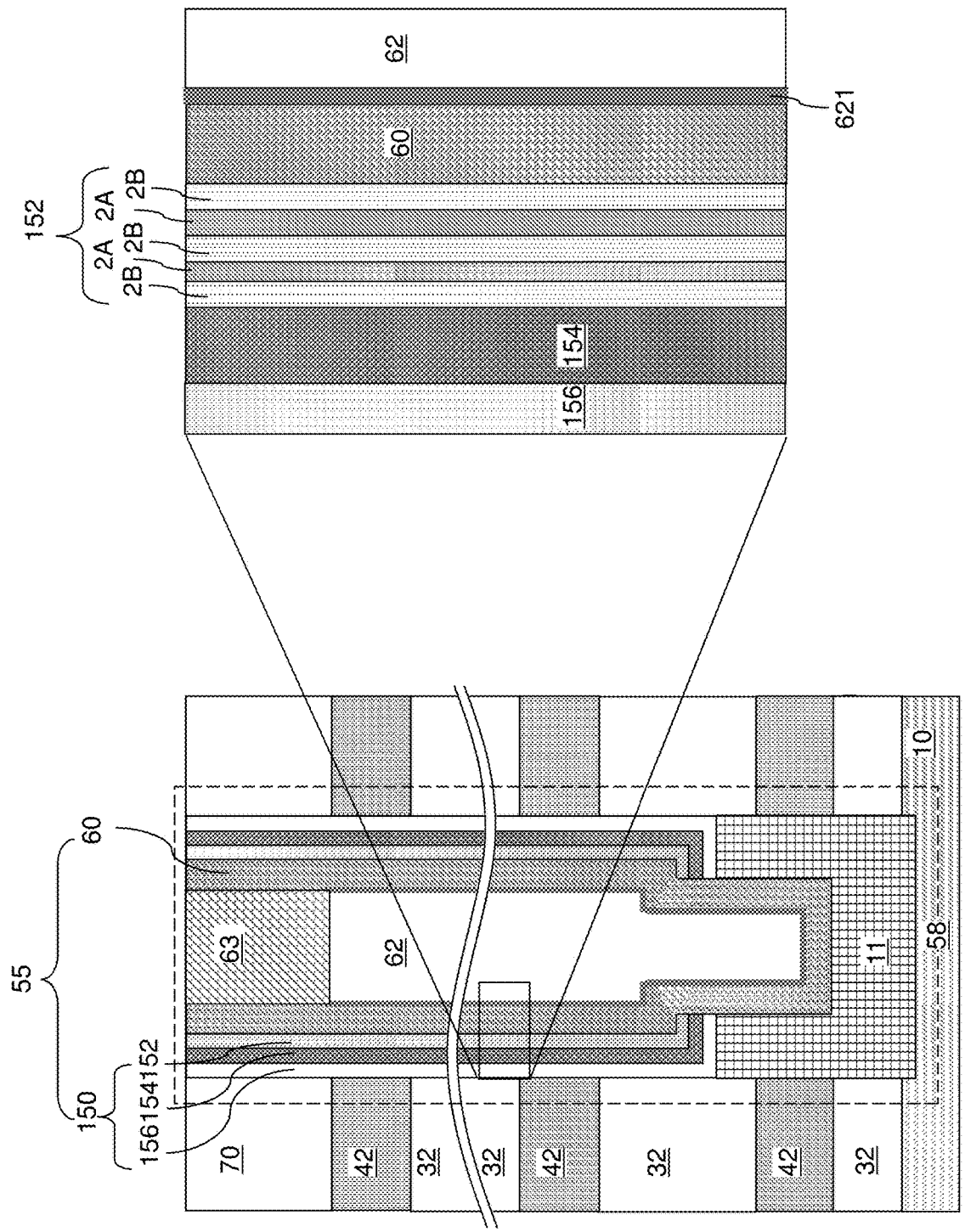
FIG. 7 is a schematic vertical cross-sectional view of an alternative embodiment of a memory opening fill structure according to the first embodiment of the present disclosure.

Referring to FIG. 7, an alternative embodiment of a memory opening fill structure 58 according to an embodiment of the present disclosure is illustrated, which can be derived from the memory opening fill structure 58 illustrated in FIG. 6 by reversing the positions of the resonant tunneling barrier stack 152 and the homogeneous barrier layer 156. Specifically, the homogeneous barrier layer 156 is deposited first, the memory material layer 154 is deposited next, and the resonant tunneling barrier stack 152. The spatial order and the sequential order of layers within the resonant tunneling barrier stack 152 can be the same as in the first exemplary structure illustrated in FIG. 5C. However, the interface layer 2C may be omitted.

In the configuration illustrated in FIG. 7, the homogeneous barrier layer 156 (such as an AlSb barrier layer) is located between a charge storage layer (comprising the memory material layer 154) and a control gate, i.e., a gate electrode to be subsequently formed by replacing a sacrificial material layer 42 with an electrically conductive layer. The homogeneous barrier layer 156 prevents back tunneling of electrons. The resonant tunneling barrier stack 152 is located between the vertical semiconductor channel 60 and a charge storage layer (comprising the memory material layer 154), and enables programming and erase operations by electron tunneling between the vertical semiconductor channel 60 and the memory material layer 154.

Referring collectively to FIGS. 6 and 7, a memory opening fill structure 58 can be formed within each memory opening 49. The layer stack including a memory film 50 can be a vertically-extending component of the memory opening fill structure 58. The vertical semiconductor channel 60 can be another vertically-extending component of the memory opening fill structure 58. The vertical semiconductor channel 60 can be formed on a first side of the layer stack of the memory film 150. As will be described below, the sacrificial material layers 42 are replaced with a plurality of gate electrodes, which is formed on a second side of the layer stack and are arranged along a lengthwise direction of the vertical semiconductor channel 60, i.e., along the vertical direction.

In one embodiment, the substrate comprises a semiconductor material layer 10, and a bottom end of the vertical semiconductor channel 60 can be electrically connected to the semiconductor material layer 10, for example, via a pedestal channel portion 11. A drain region 63 can be formed at an upper end of the vertical semiconductor channel 60.

Figure 8:
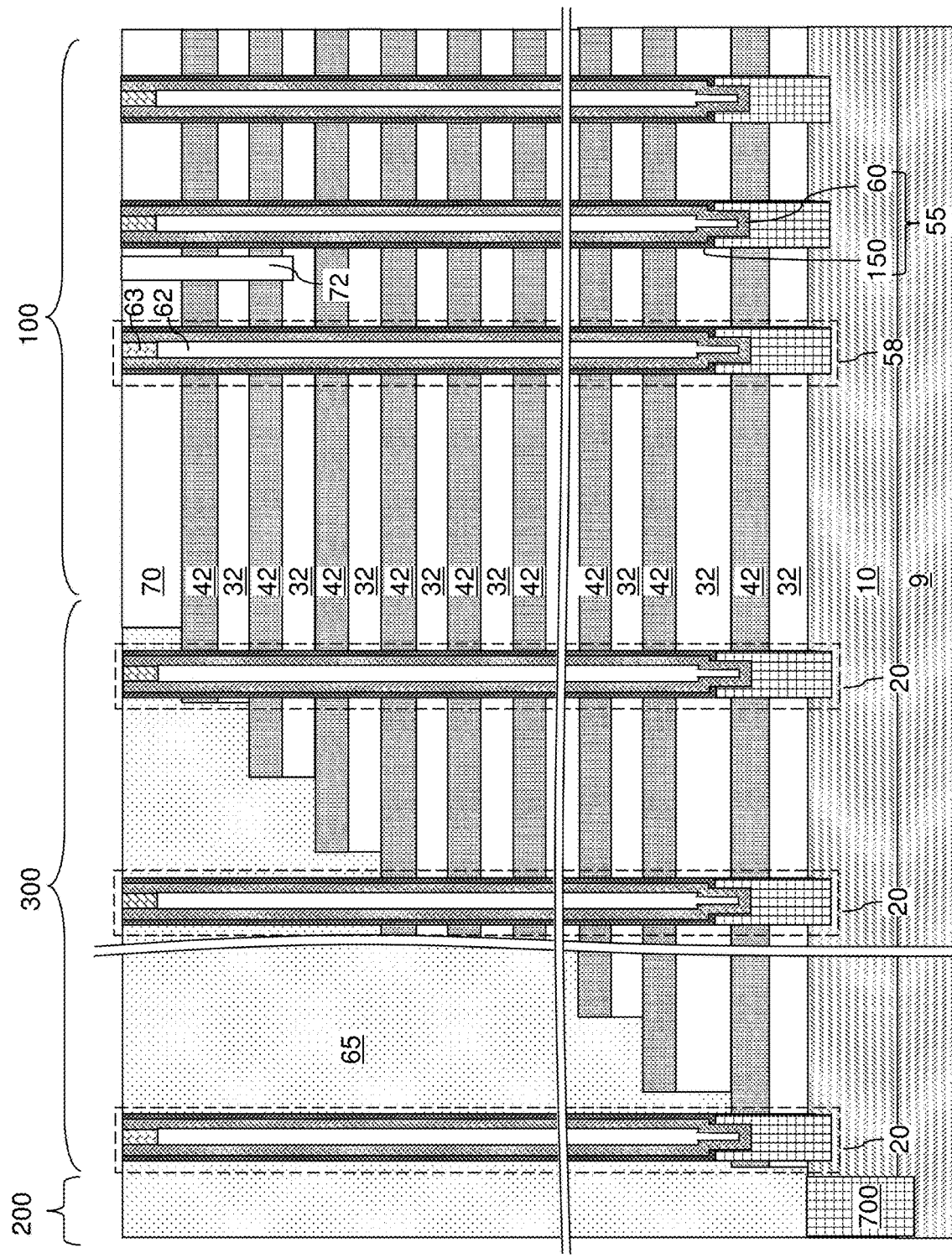
FIG. 8 is a schematic vertical cross-sectional view of the first exemplary structure after formation of memory stack structures and support pillar structures according to the first embodiment of the present disclosure.

Referring to FIG. 8, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. Each memory stack structure 55 includes a vertical semiconductor channel 60 and a memory film 150.

Figure 9A:
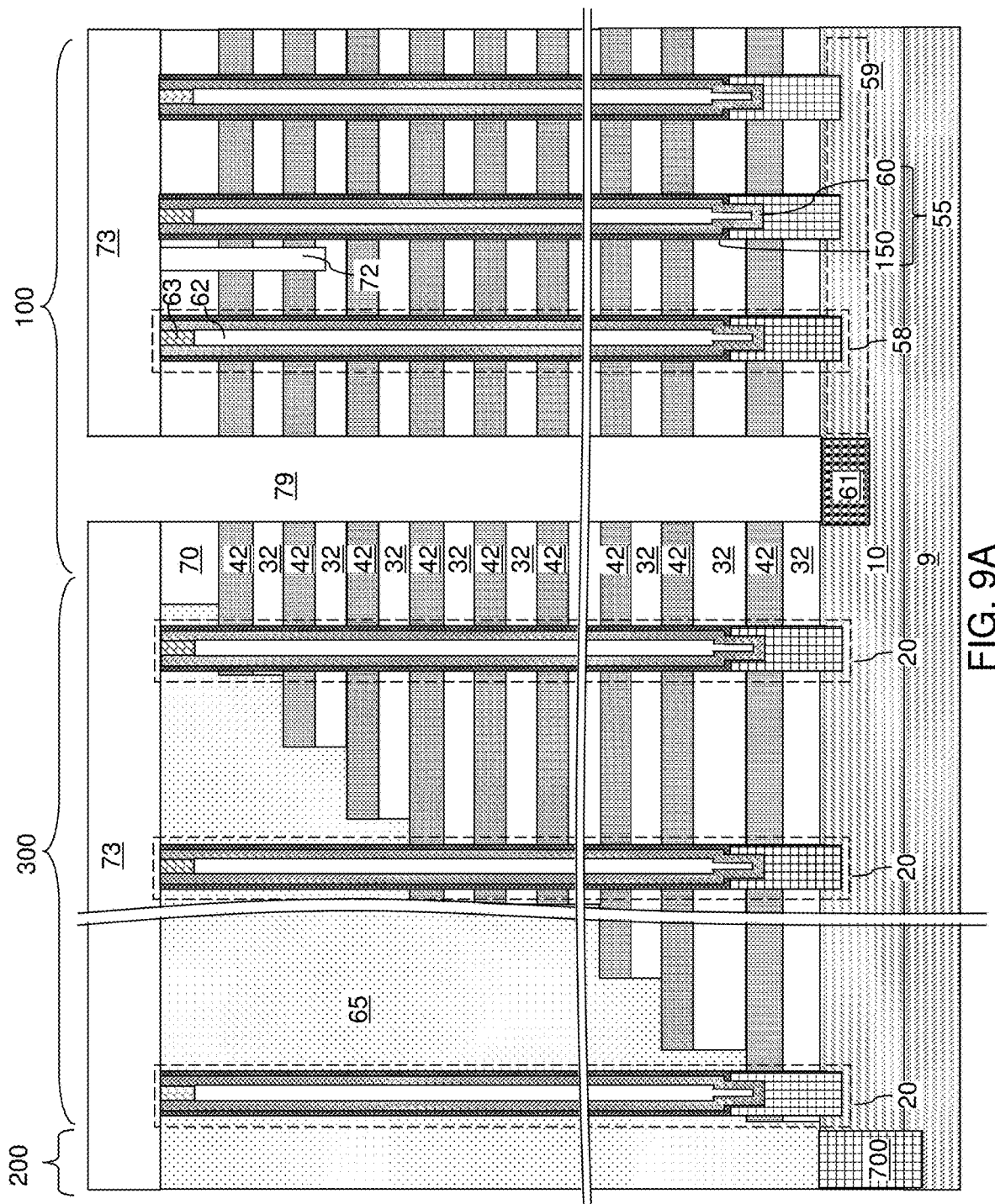
FIG. 9A is a schematic vertical cross-sectional view of the first exemplary structure after formation of backside trenches according to the first embodiment of the present disclosure.
Figure 9C:
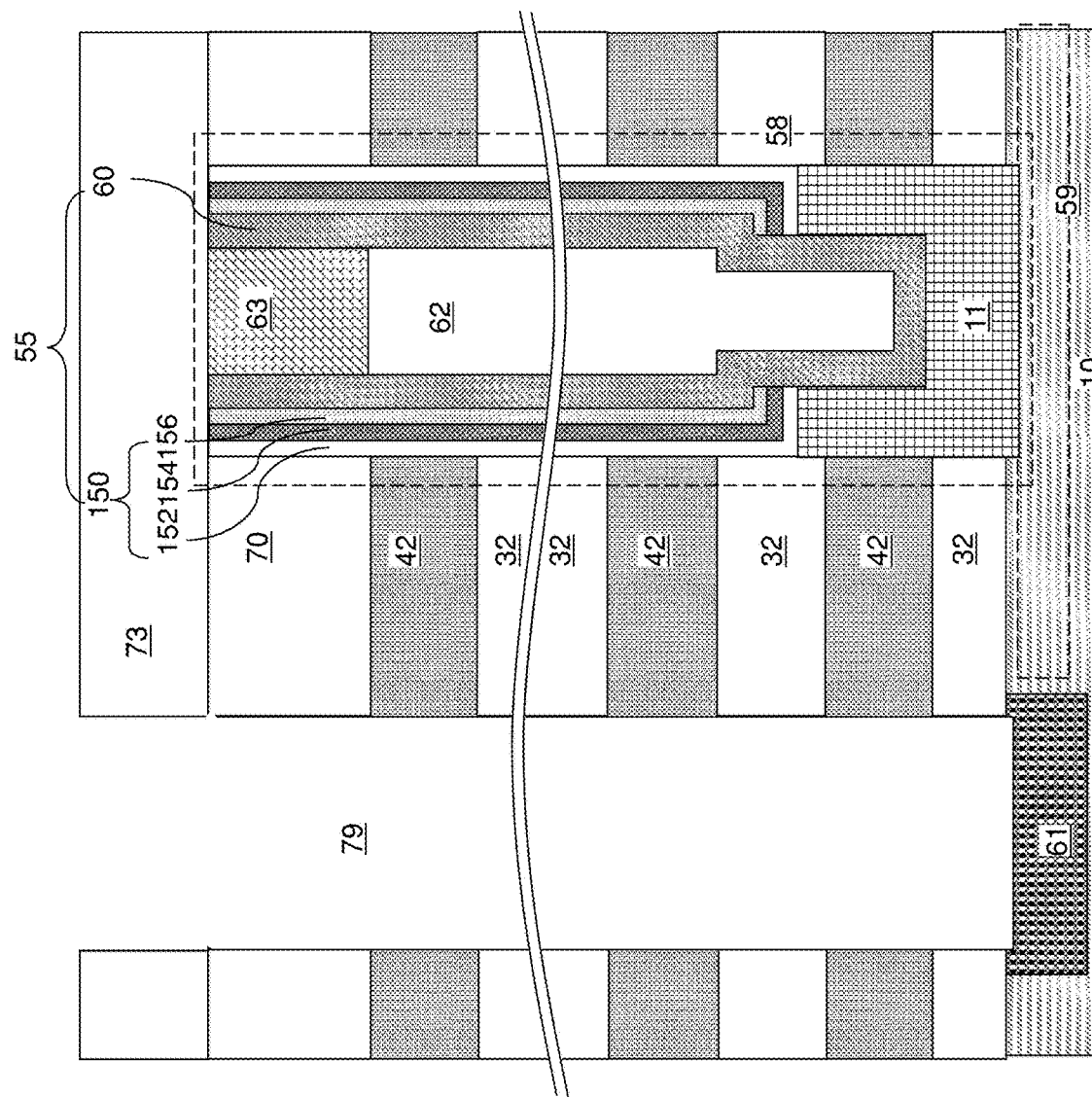
FIG. 9C is a magnified vertical cross-sectional view of a region of the first exemplary structure of FIG. 9A.

Referring to FIGS. 9A and 9B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 150 nm to 1500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 10:
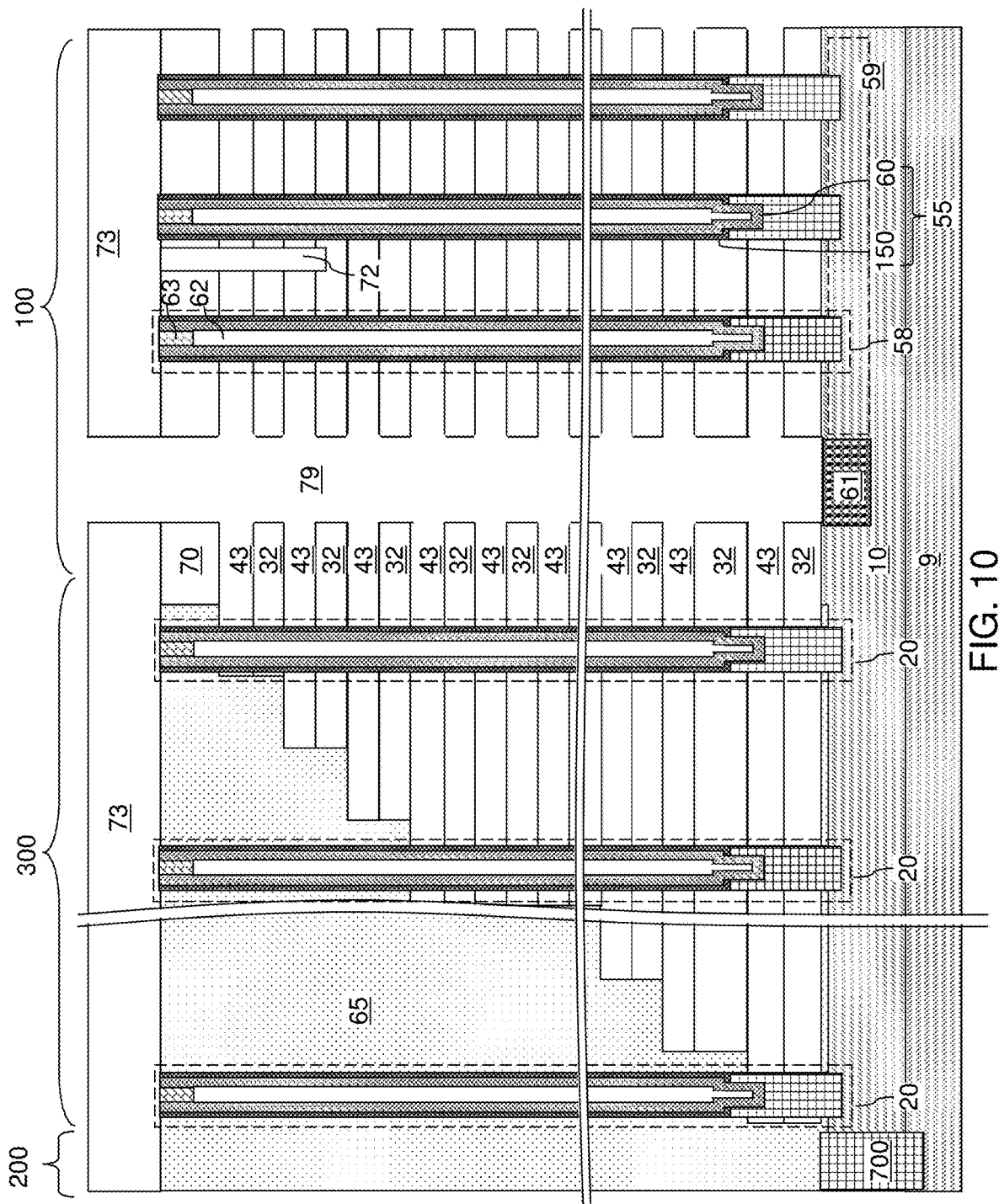
FIG. 10 is a schematic vertical cross-sectional view of the first exemplary structure after formation of backside recesses according to the first embodiment of the present disclosure.
Figure 11A:
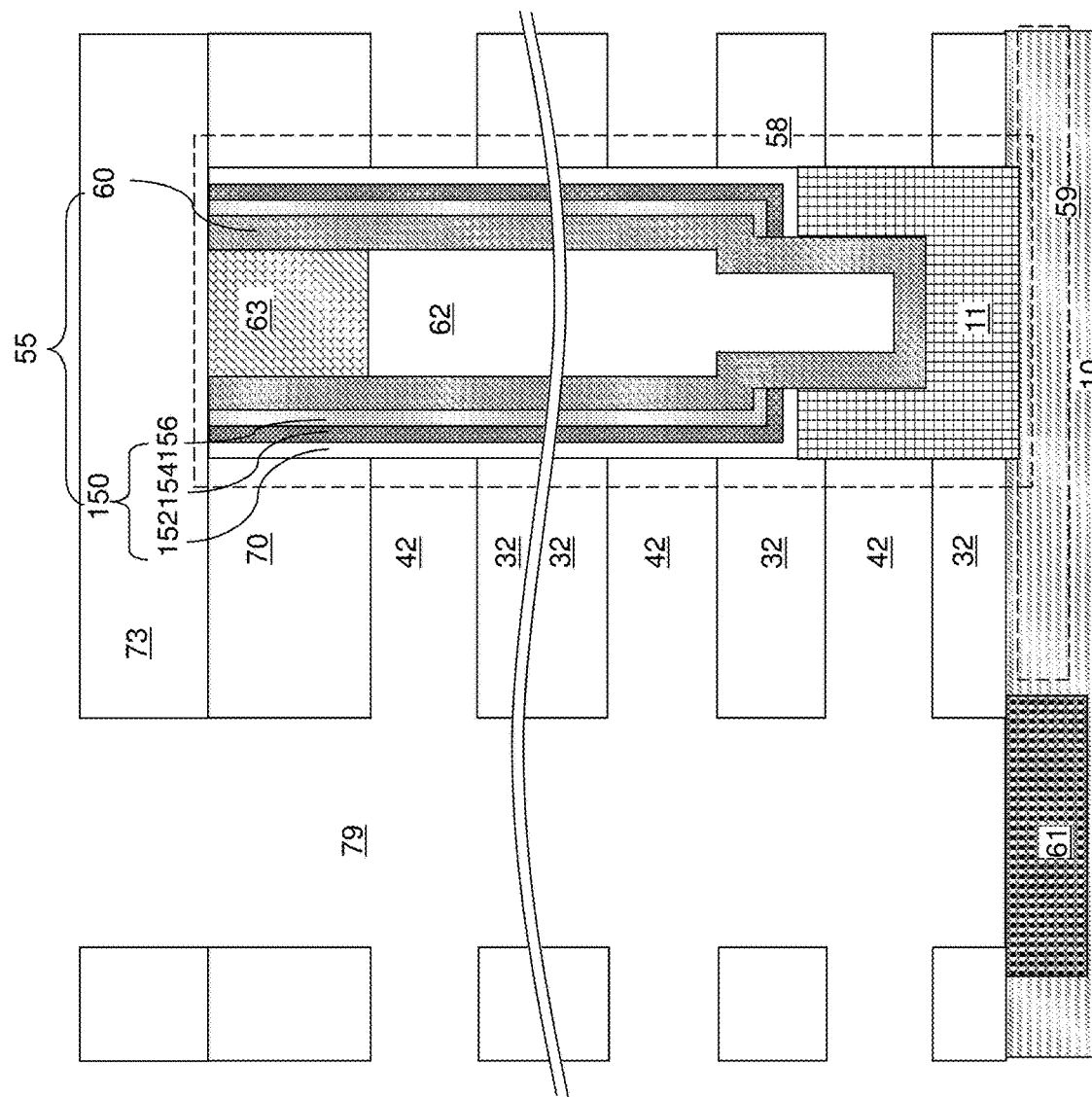
FIGS. 11A-11D are sequential vertical cross-sectional views of a region of the first exemplary structure during formation of electrically conductive layers according to the first embodiment of the present disclosure.

Referring to FIGS. 10 and 11A, an etchant that selectively etches the second material of the sacrificial material layers 42 with respect to the first material of the insulating layers 32 can be introduced into the backside trenches 79, for example, employing an etch process. FIG. 11A illustrates a region of the first exemplary structure of FIG. 10. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 150. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 150 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 11B:
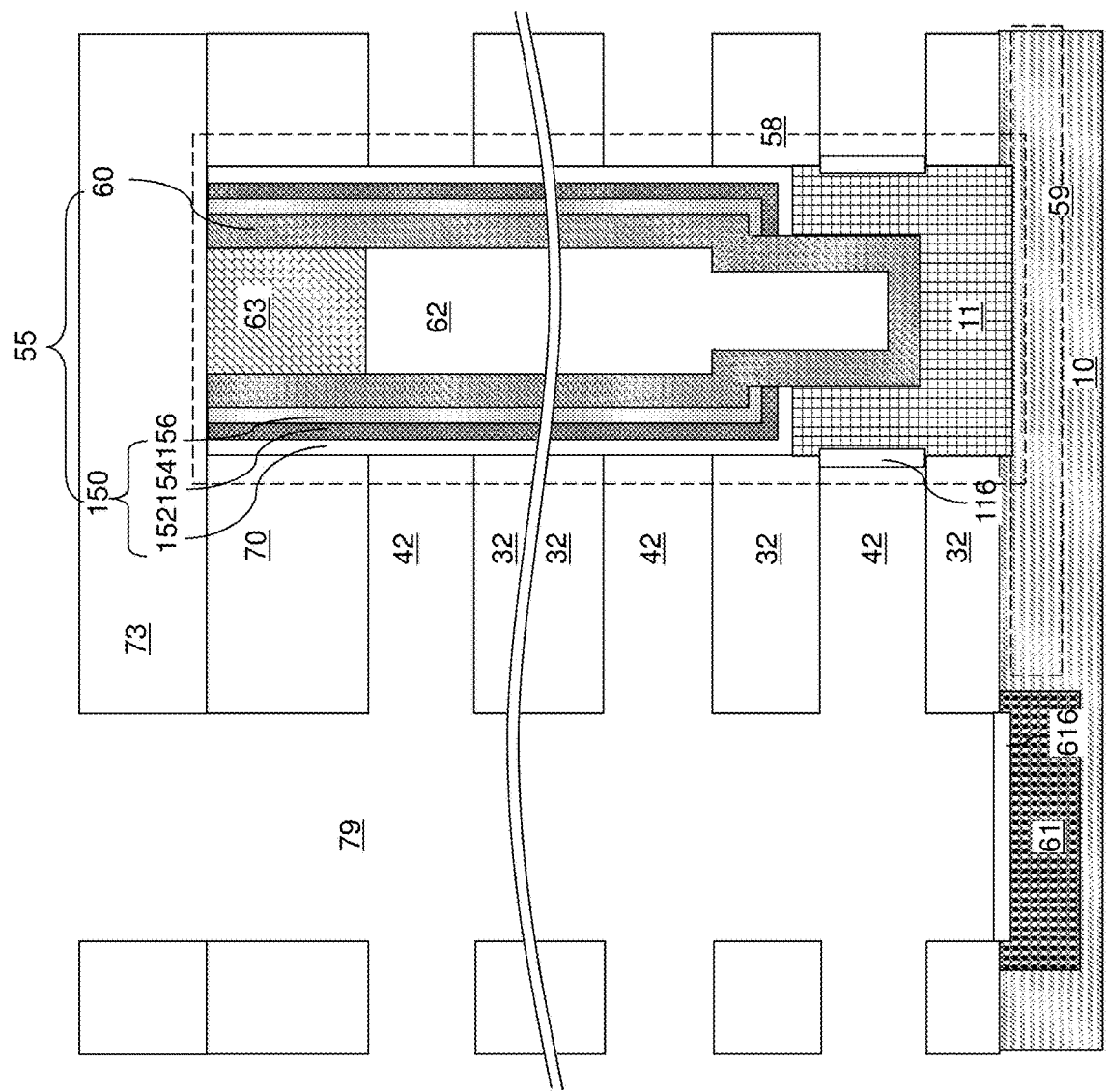

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses 43.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 11C:
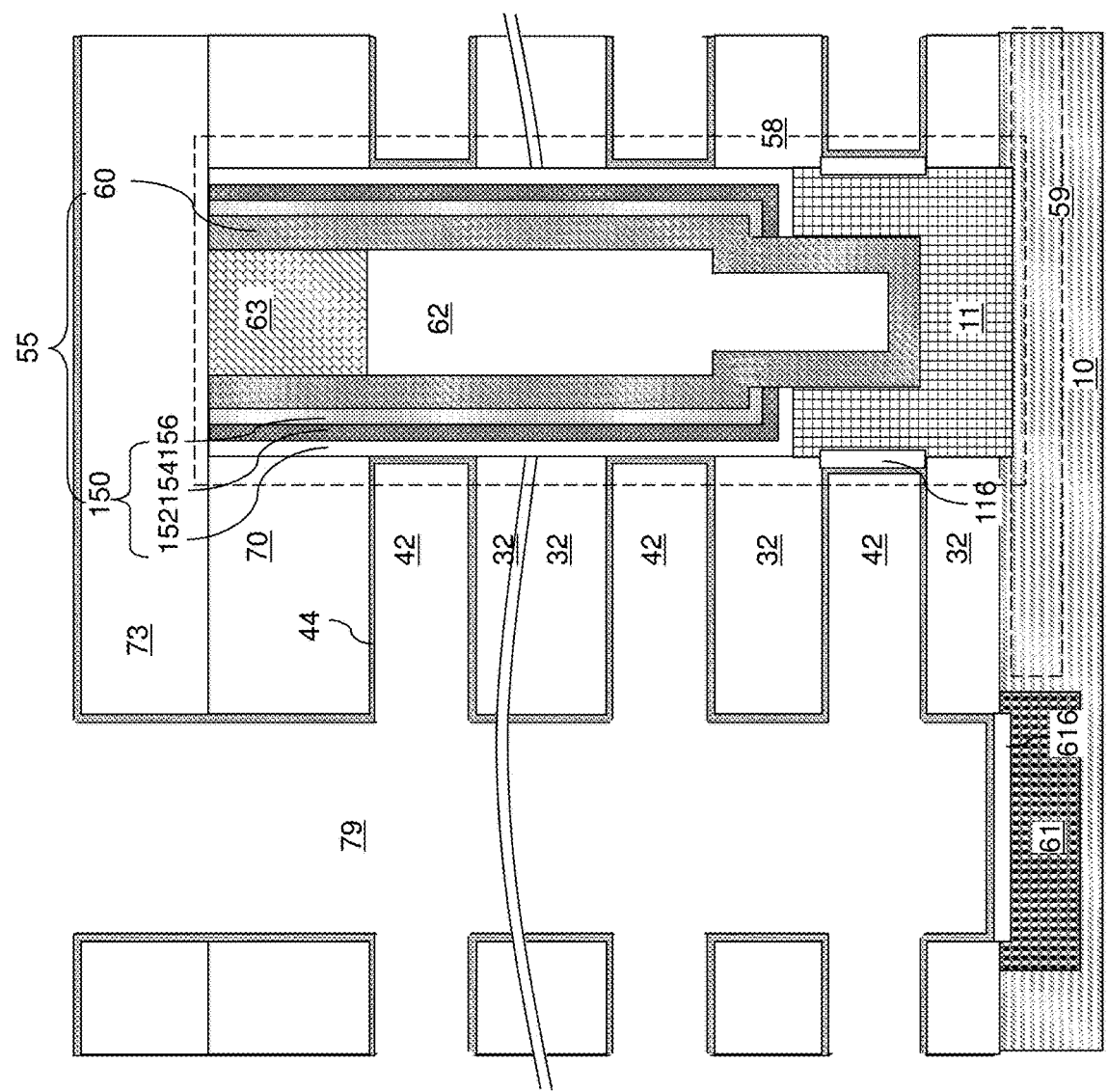

Referring to FIG. 11C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 11D:
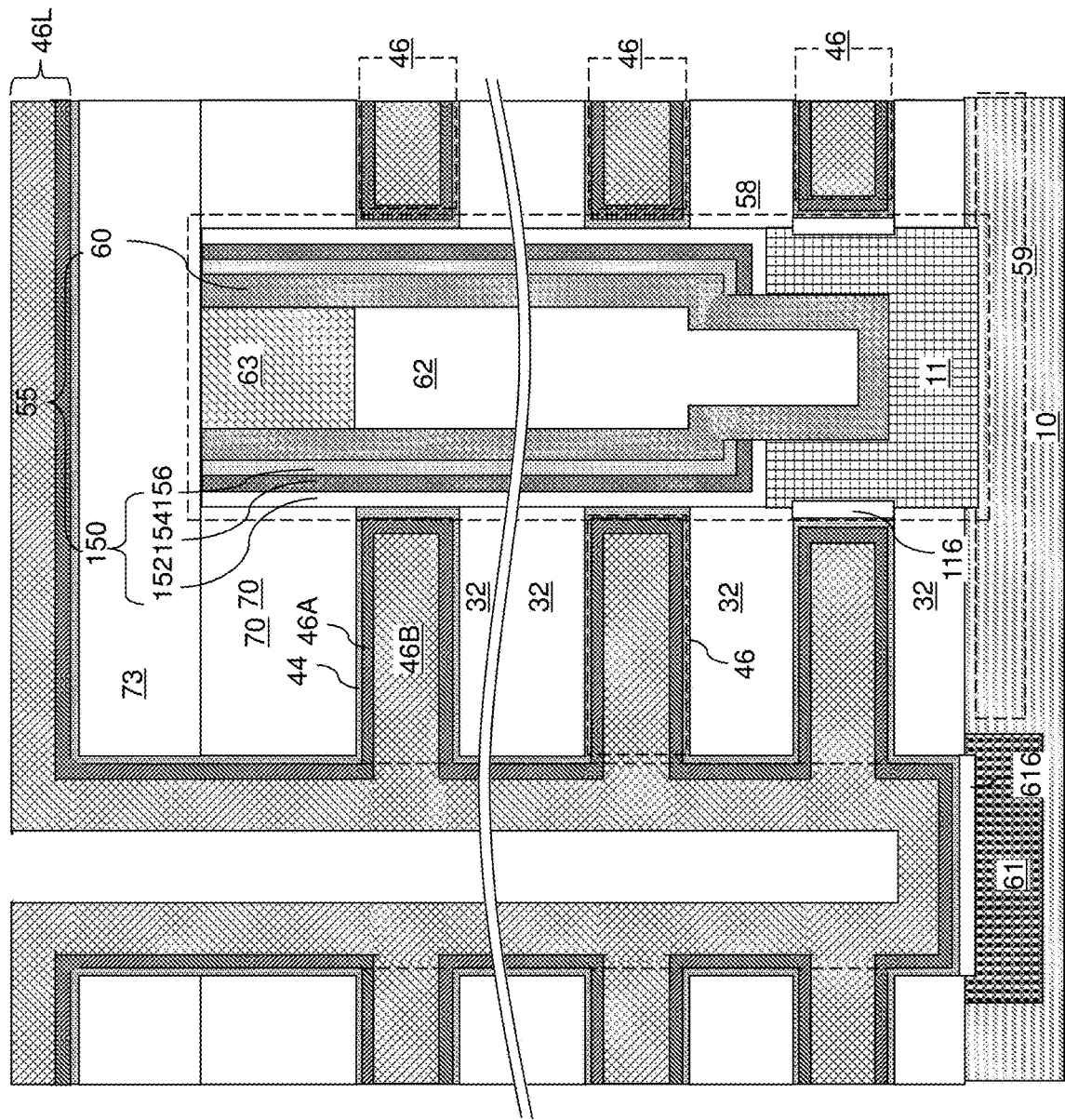

Referring to FIG. 11D, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as WF6. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 12A:
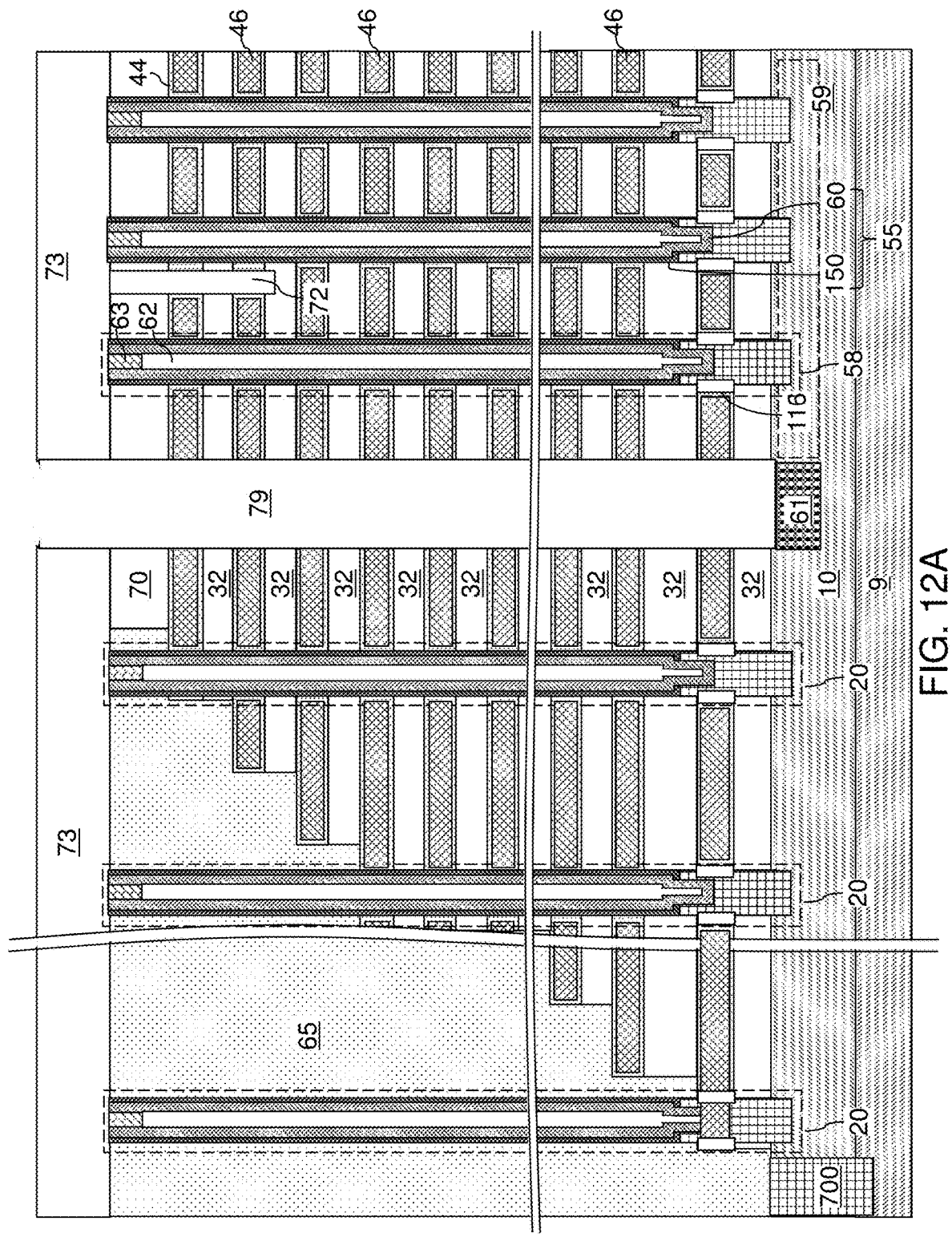
FIG. 12A is a schematic vertical cross-sectional view of the first exemplary structure after removal of a deposited conductive material from within the backside trench according to the first embodiment of the present disclosure.
Figure 12C:
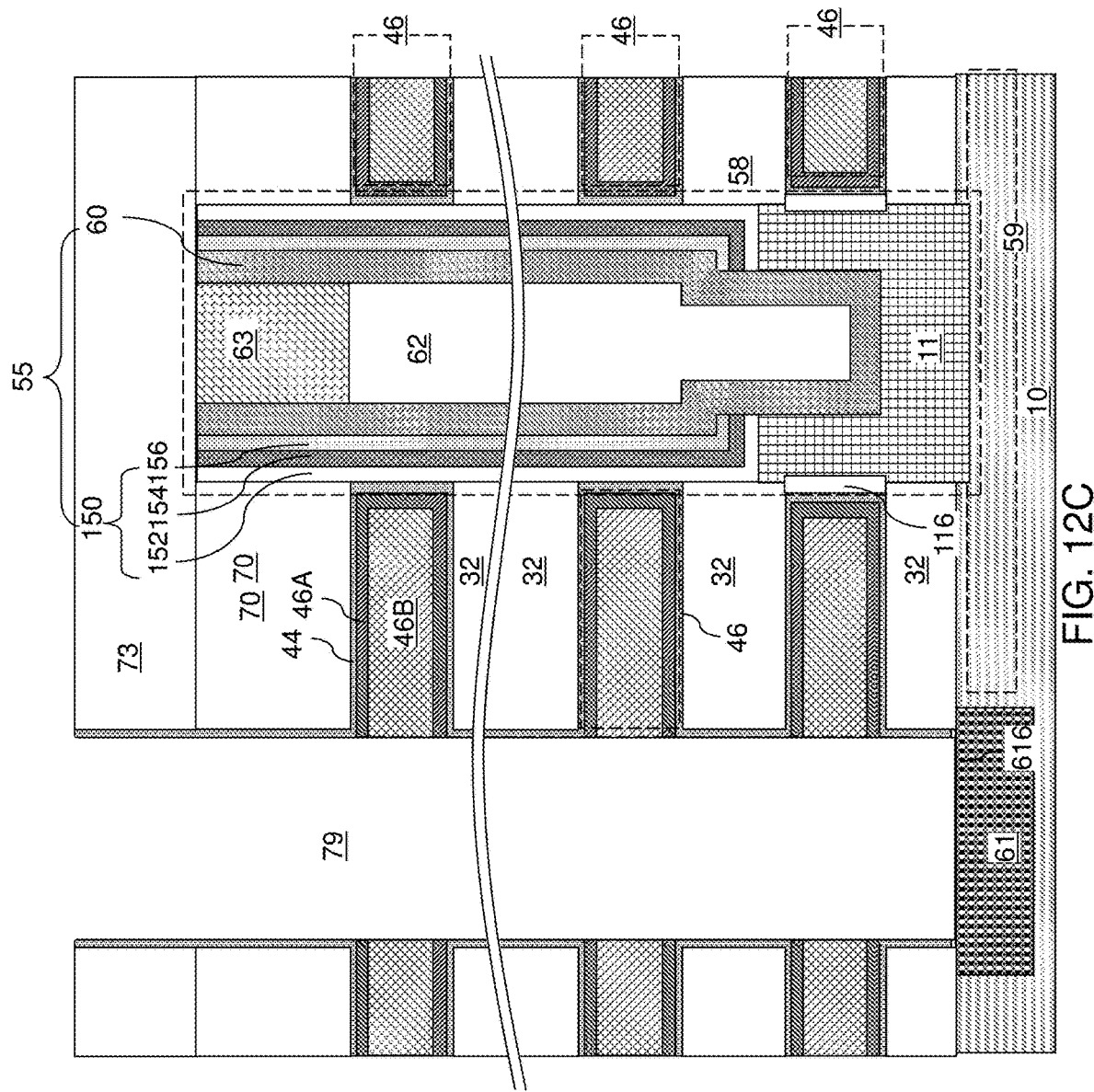
FIG. 12C is a magnified view of a region of the first exemplary structure of FIG.

Referring to FIGS. 12A-12C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Generally, a semiconductor channel such as a vertical semiconductor channel 60 can be formed on a first side of a layer stack including a memory film 150, and a plurality of control gate electrodes can be formed on a second side of the layer stack. In one embodiment, the plurality of control gate electrodes can comprise portions of the electrically conductive layers 46 that laterally surround the memory opening fill structures 58. The plurality of gate control electrodes may be arranged along a lengthwise direction of the semiconductor channel such as the vertical direction.

Figure 13:
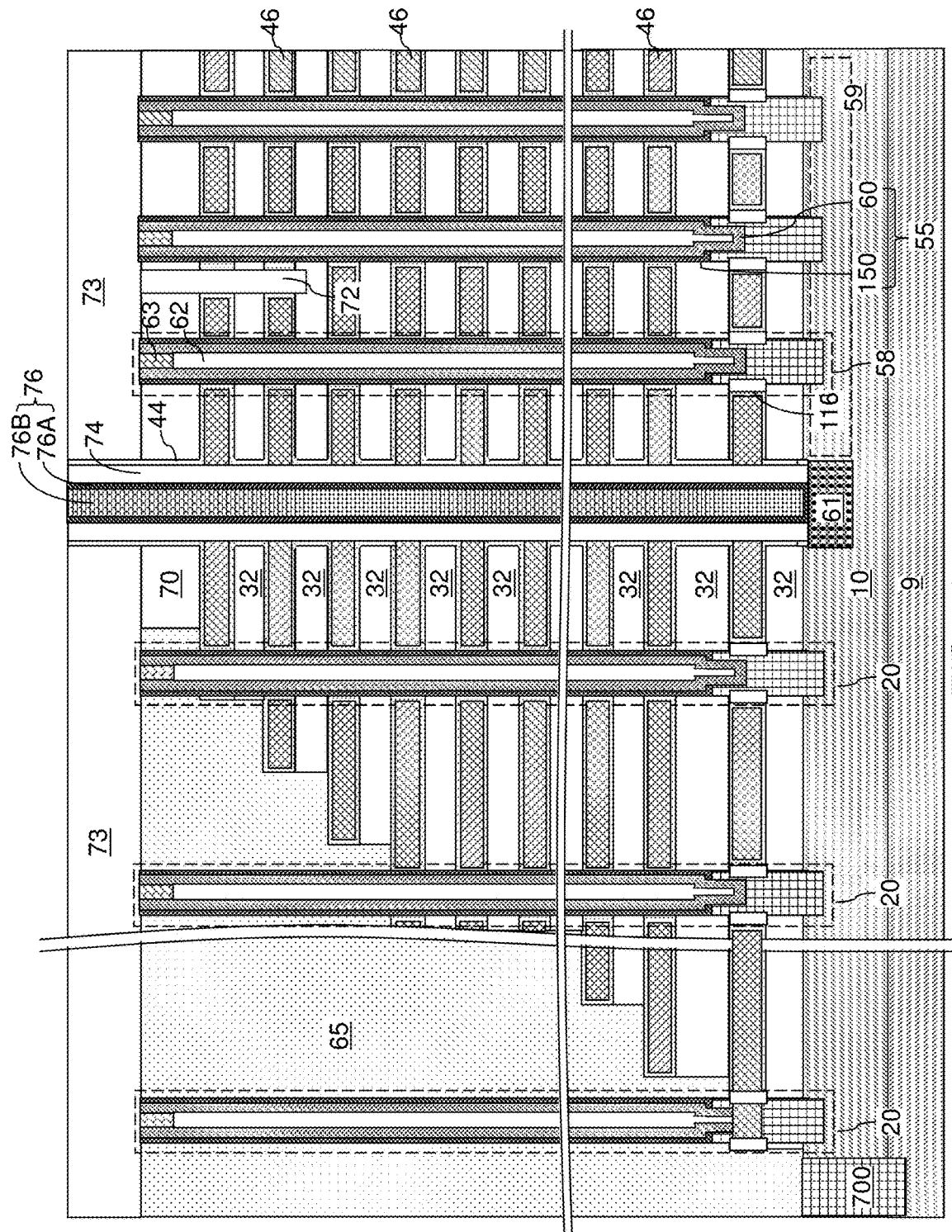
FIG. 13 is a schematic vertical cross-sectional view of the first exemplary structure after formation of an insulating spacer and a backside contact structure according to the first embodiment of the present disclosure.

Referring to FIG. 13, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the source region 61 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Referring to FIGS. 14A-14D, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines 98 are then formed in electrical contact with the drain contact via structures 88.

Figure 14A:
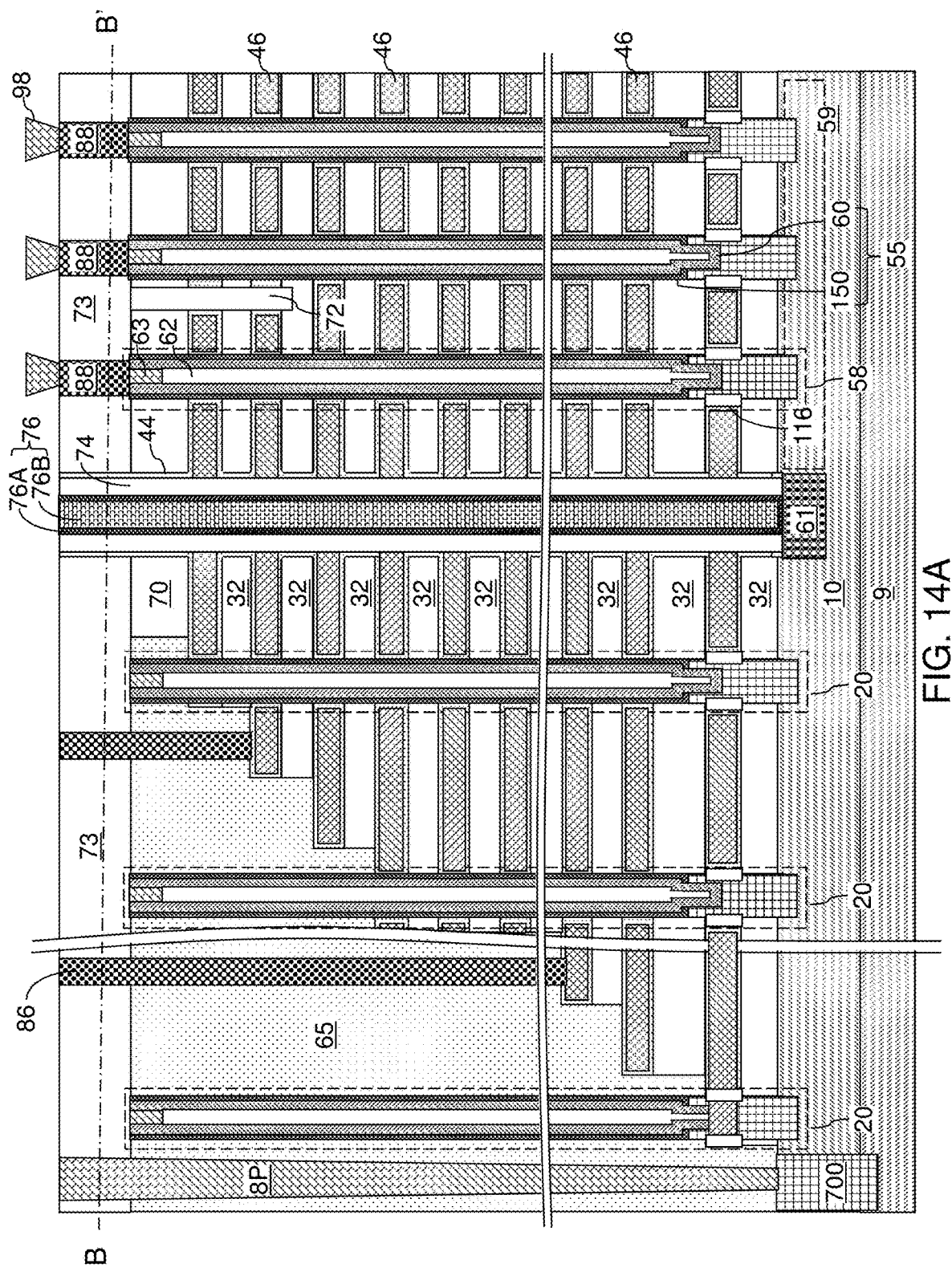
FIG. 14A is a schematic vertical cross-sectional view of the first exemplary structure after formation of additional contact via structures according to the first embodiment of the present disclosure.
Figure 14B:
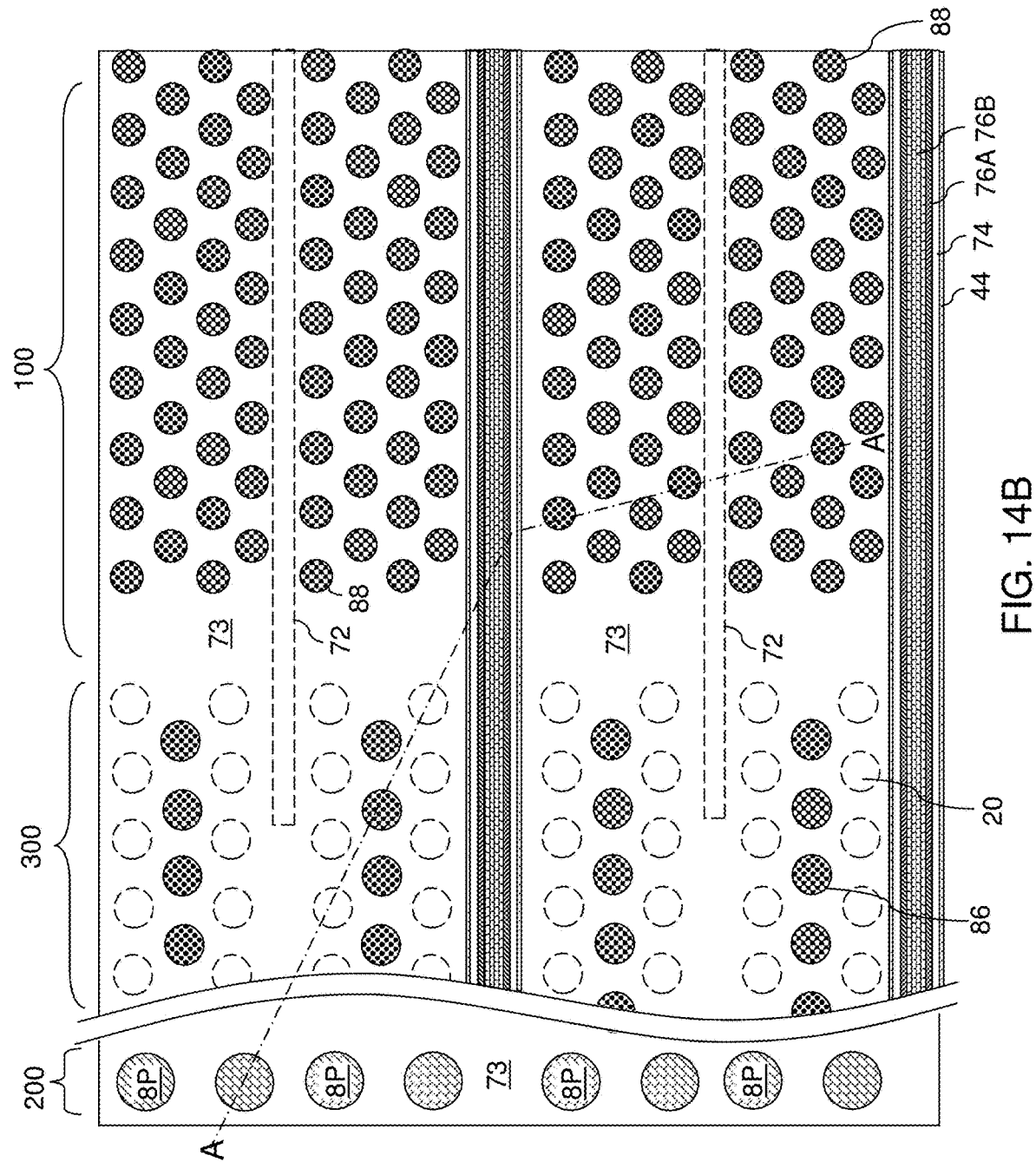
FIG. 14B is horizontal cross-sectional view along horizontal plane B-B' of the first exemplary structure of FIG. 14A. The vertical plane A-A' is the plane of the schematic vertical cross-sectional view of FIG. 14A.
Figure 14C:
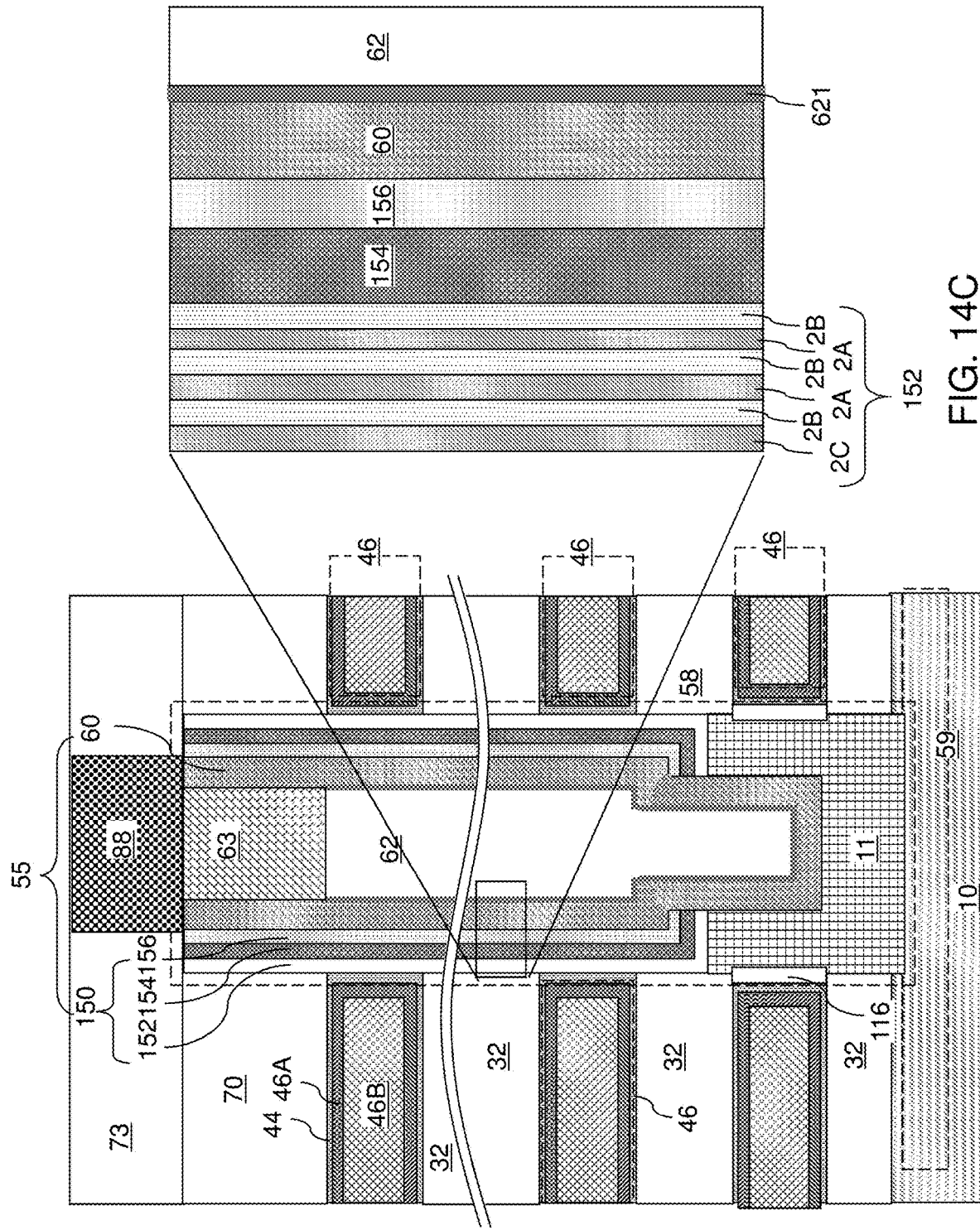
FIG. 14C is a magnified view of a region of the first exemplary structure of FIG. 14A that includes a memory opening fill structure.
Figure 15A:
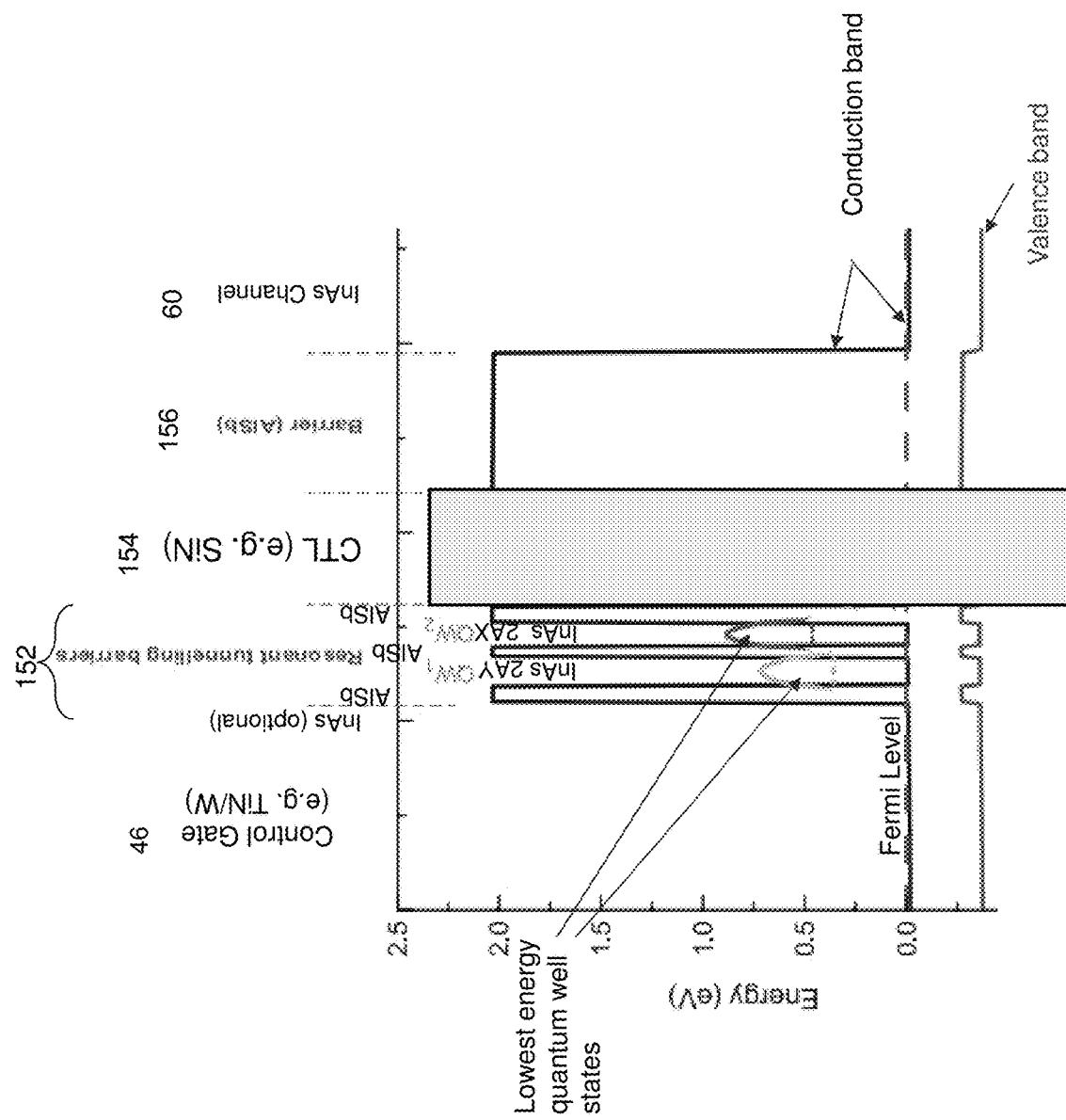
FIG. 15A is a band diagram of an exemplary memory film and an exemplary vertical semiconductor channel when no voltage is applied to a control gate electrode according to the first embodiment of the present disclosure.
Figure 15B:
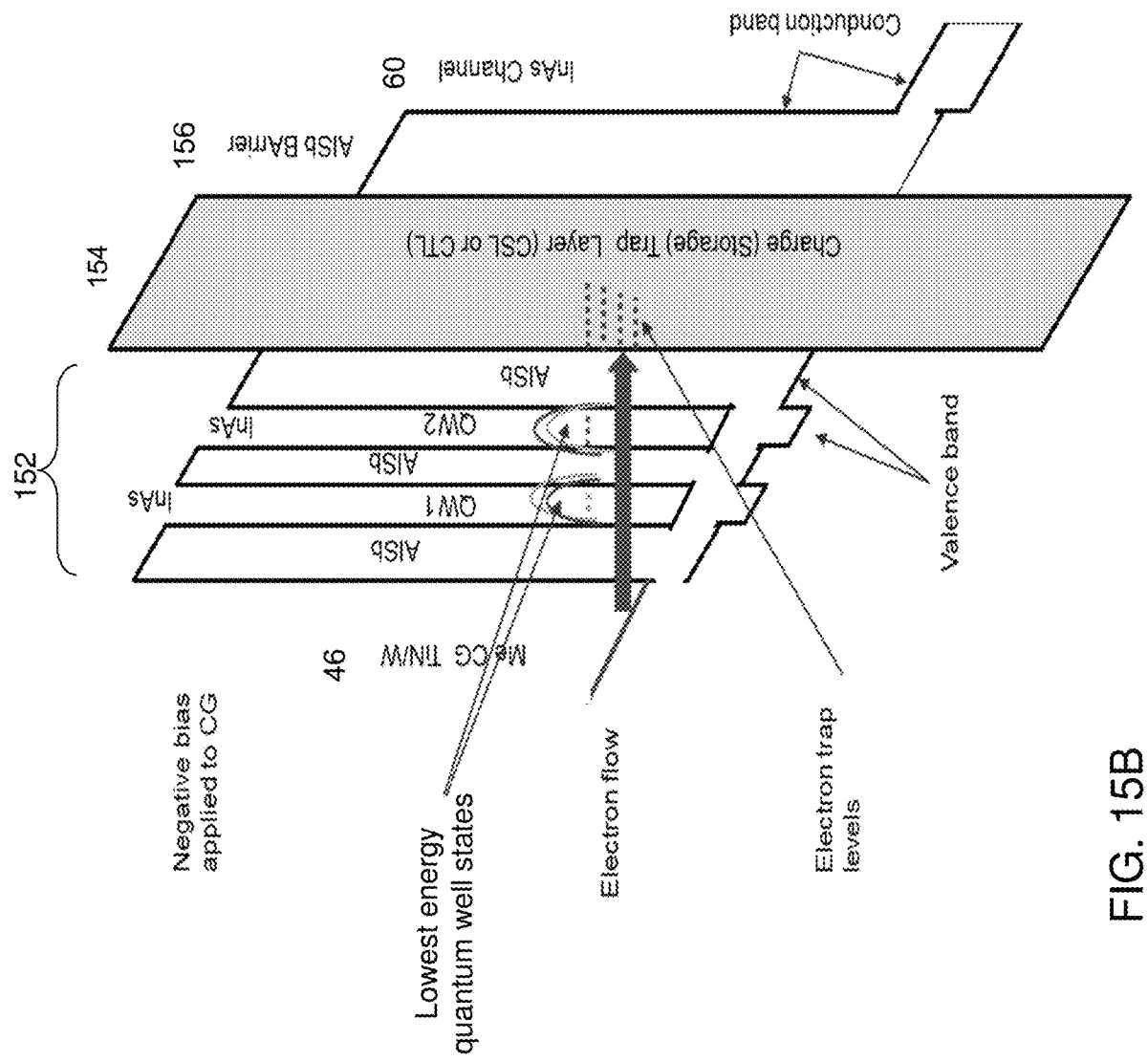
FIG. 15B is a band diagram of the exemplary memory film and the exemplary vertical semiconductor channel while a negative voltage is applied to the control gate electrode relative to the vertical semiconductor channel according to the first embodiment of the present disclosure.
Figure 15C:
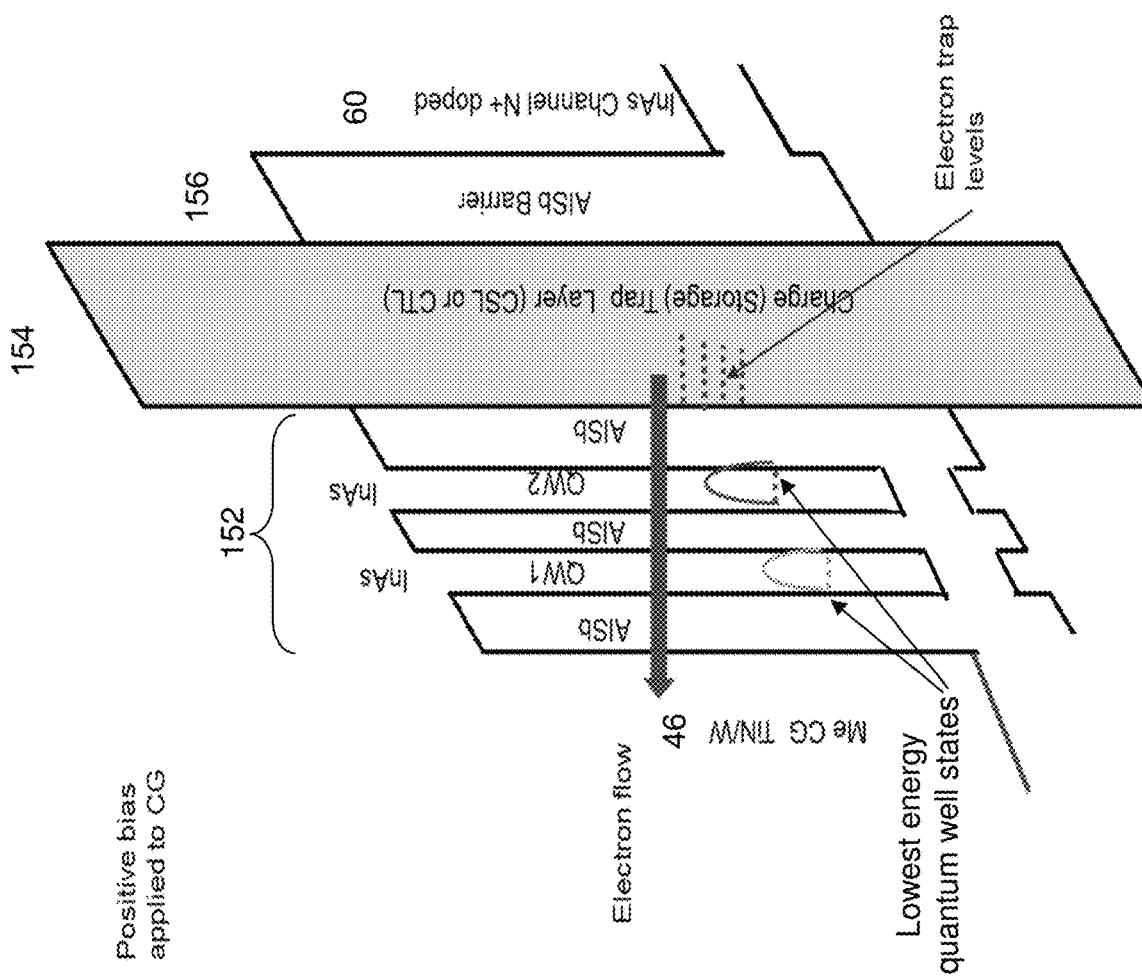
FIG. 15C is a band diagram of the exemplary memory film and the exemplary vertical semiconductor channel while a positive voltage is applied to the control gate electrode relative to the vertical semiconductor channel according to the first embodiment of the present disclosure.

FIGS. 15A-15C are band diagrams of an exemplary memory film 150 and an exemplary vertical semiconductor channel 60 of the memory device of FIG. 14C. FIG. 15A is a band diagram when no voltage is applied to the control gate electrode 46 according to the first embodiment of the present disclosure. FIG. 15B is a band diagram during a programming operation when a negative voltage is applied to the control gate electrode 46 relative to the vertical semiconductor channel 60 according to the first embodiment of the present disclosure. FIG. 15C is a band diagram during an erase operation when a positive voltage is applied to the control gate electrode relative to the vertical semiconductor channel according to the first embodiment of the present disclosure.

As shown in FIG. 15A, electrons stored in a charge storage layer 154 are isolated from the vertical semiconductor channel 60 by a very large conduction-band discontinuity between the charge storage layer 154 and the AlSb semiconductor barrier layer 156. Thus, the relatively thick, wide bandgap semiconductor barrier layer 156 substantially prevents electron tunneling between the vertical semiconductor channel 60 and the charge storage layer 154. Furthermore, the resonant barrier stack 152 allows elimination, or significant reduction, in the leakage current between the control gate electrode 46 and the charge storage layer 154 due to quantization and difference of electron energy levels in the two quantum well layers 2AX and 2AY. For example, the inner well layer 2AX located closer to the charge storage layer 154 may be thinner than the outer well layer 2AY located farther from the charge storage layer 154. Thus, the electron energy levels (i.e., the lowest energy quantum well states) in the inner well layer 2AX are higher than in the outer well layer 2AY. Since the electron energy levels do not line up in the two well layers (2AX, 2AY), substantially no electrons tunnel through the resonant barrier stack 152. Therefore, when no voltage is applied to the control gate electrode 46, i.e., when the device is in a thermodynamic equilibrium, electrons are confined inside charge storage layer 154, the triple resonant-tunneling barrier stack 152 is opaque to passage of electrons to and from the charge storage layer.

Referring to FIG. 15B, during a programming operation, a negative voltage is applied to the control gate electrode 46. This causes the electron energy levels of the two well layers (2AX, 2AY) to substantially align. This alignment permits resonant quantum tunneling of electrons through the resonant tunneling barrier stack 152. Thus, the electrons flow from the control gate electrode 46 through the resonant tunneling barrier stack 152 into the charge storage layer 154. The negative voltage may comprise any suitable voltage sufficient to align the electron energy levels of the well layers to permit resonant quantum tunneling of electrons through the resonant tunneling barrier stack 152. For example, the negative programming voltage may be in a range from −2.5 V to −3 V.

Referring to FIG. 15C, during an erase operation, a positive voltage is applied to the control gate electrode. In the illustrated example, the positive erase voltage may be in a range from 2.5 V to 3 V. Band bending and electrical field allow electrons to flow from the charge storage layer 154 to the control gate electrode 46, thereby removing electrons from the charge storage layer for the erase operation.

During a read operation, a positive voltage is applied to the bit lines 98 in a range from 0.5 V to 0.7V, the source region 61 is grounded, and a positive read voltage which is lower than the erase voltage is applied to the control gate electrodes 46. The read voltage may be in a range from 0.5 V to 1 V.

The memory devices of the embodiments of the present disclosure may comprise low voltage, low energy non-volatile memory devices that provide low voltage read/write/erase operations and good charge retention. Electrons stored in the charge storage layer are isolated by a very large conduction-band discontinuity with wide bandgap semiconductor layers (such as AlSb layers). A charge confinement model predicts a room-temperature thermally-activated storage time of an extraordinary 1,014 years for an embodiment of the memory device of the present disclosure.

Generally, in conventional 3D-NAND devices, writing and erase operations require application of a large voltage to the control gate electrodes, such as voltages greater than 20 V in magnitude. Program/erase operations in such conventional 3D-NAND devices are relatively slow, and induce voltage-accelerated failure mechanisms in dielectrics limiting endurance of the device.

The 3D-NAND structures of the embodiments of the present disclosure provide a non-volatile memory device that is especially suitable for applications requiring extreme low power operations. Lower power consumption is desired for many storage applications, and limits the number of drives that can be run in parallel for concurrent data farming/mining.

The embodiment 3D-NAND device is projected to provide a reduction in switching energy per unit area by a factor in a range from 100 to 1,000 compared to DRAM devices and flash memory devices. In some embodiments, the programming and erase voltages may be below 10 V, such as low as only 3~8 V, and can be chosen as resonant bias voltage for selected composition and geometry of the triple resonant tunneling barrier stack. The read voltages on word lines (control gates) can be then in the range of 1~3V. Operation voltages can be higher or lower depending on the choice of resonant tunneling barrier stack and its tunneling characteristics.

According to an aspect of the present disclosure, a memory device includes an alternating stack of insulating layers 32 and control gate layers 46, a memory opening 49 vertically extending through the alternating stack (32, 46), and a memory opening fill structure 58 containing a memory film 150 and a vertical semiconductor channel 60 located within the memory opening 49. The memory film 150 contains a resonant tunneling barrier stack 152, a semiconductor barrier layer 156, and a memory material layer 154 located between the resonant tunneling barrier stack 152 and the semiconductor barrier layer 156.

In one embodiment, the resonant tunneling barrier stack 152 comprises at least two semiconductor quantum wells. The least two semiconductor quantum wells comprise an inner quantum well and an outer quantum well located between the inner quantum well and the alternating stack. As shown in FIG. 15A, the inner quantum well comprises an inner semiconductor well layer 2AX located between a first barrier layer 2B and a second barrier layer 2B, and the outer quantum well comprises an outer semiconductor well layer 2AY located between the second barrier layer 2B and a third barrier layer 2B. In one embodiment, the inner semiconductor well layer 2AX is thinner than the outer semiconductor well layer 2AY.

In one embodiment, the inner semiconductor well layer 2AX and the outer semiconductor well layer 2AY have a narrower bandgap than the first, second and third barrier layers 2B. In one embodiment, the inner semiconductor well layer and the outer semiconductor well layer comprise indium arsenide, and the first, second and third barrier layers comprise aluminum antimonide.

In one embodiment, the memory material layer 154 comprises a dielectric charge storage material, the vertical semiconductor channel 60 comprises a first compound semiconductor material, and the semiconductor barrier layer 156 comprises a second compound semiconductor material having a wider bandgap than the first compound semiconductor material. In one embodiment, the memory material layer 154 comprises a silicon nitride layer and the vertical semiconductor channel 60 comprises an indium arsenide layer. In one embodiment, the semiconductor barrier layer 156 comprises an aluminum antimonide layer which is thicker than the resonant tunneling barrier stack 152.

In one embodiment shown in FIG. 14C, the semiconductor barrier layer 156 is located between the memory material layer 154 and the vertical semiconductor channel 60, and the resonant tunneling barrier stack 152 is located between the memory material layer 154 and the alternating stack (32, 46). In this embodiment, the semiconductor barrier layer 156 surrounds the vertical semiconductor channel 60, the memory material layer 154 surrounds the semiconductor barrier layer 156; and the resonant tunneling barrier stack 152 surrounds the memory material layer 154.

Figure 14D:
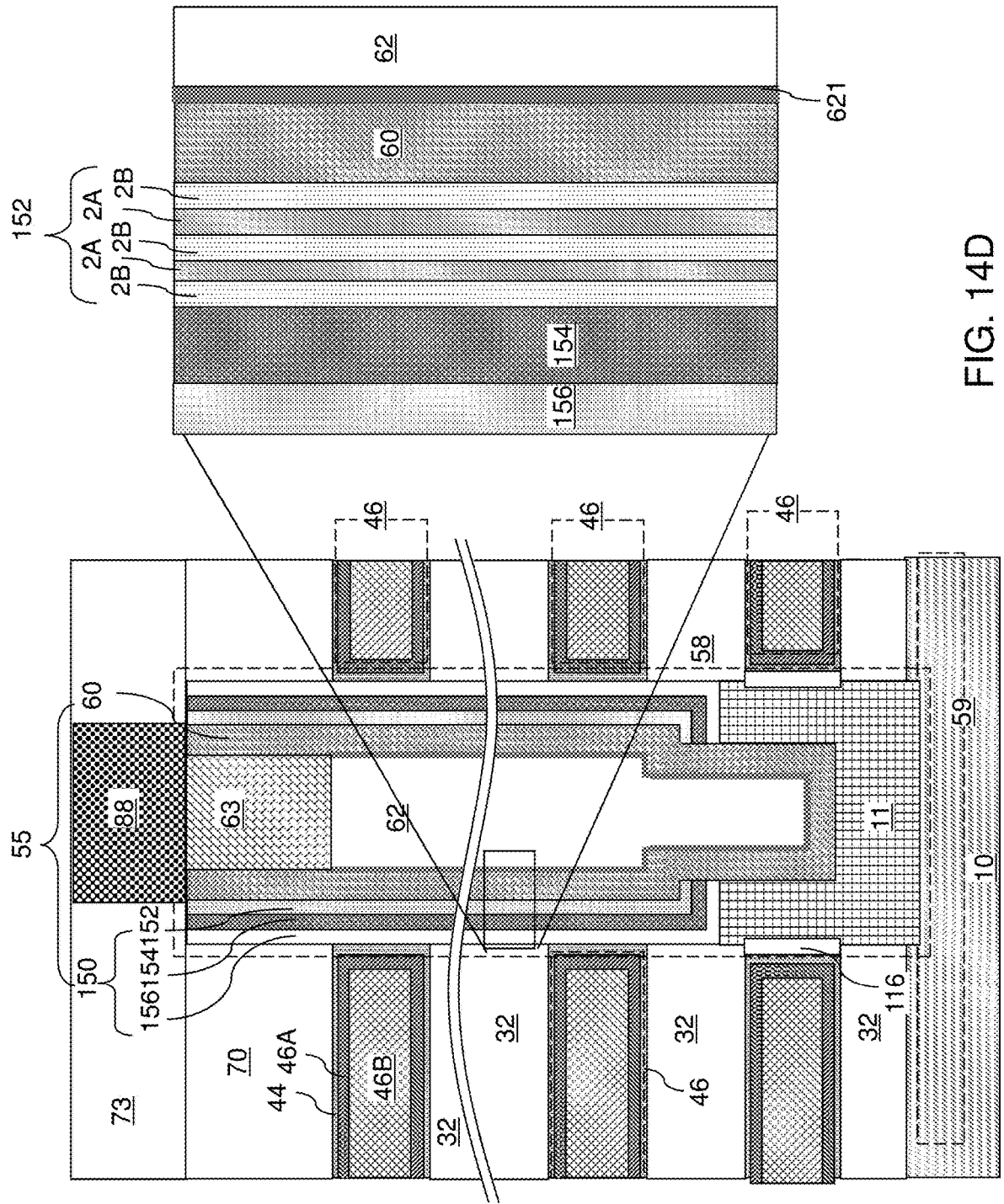
FIG. 14D is a magnified view of a region of the first exemplary structure of FIG. 14A that includes an alternative configuration of the memory opening fill structure.

In an alternative embodiment shown in FIG. 14D, the resonant tunneling barrier stack 152 is located between the memory material layer 154 and the vertical semiconductor channel 60, and the semiconductor barrier layer 156 is located between the memory material layer 154 and the alternating stack (32, 46). In this embodiment, the resonant tunneling barrier stack 152 surrounds the vertical semiconductor channel 60, the memory material layer 154 surrounds the resonant tunneling barrier stack 152, and the semiconductor barrier layer 156 surrounds the memory material layer 154.

In one embodiment shown in FIGS. 15B and 15C, a method of operating the memory device includes applying a negative voltage to at least one of the control gate electrodes 46 to program the memory material layer 154, and applying a positive voltage to at least one of the control gate electrodes 46 to erase the memory material layer 154.

Figure 16:
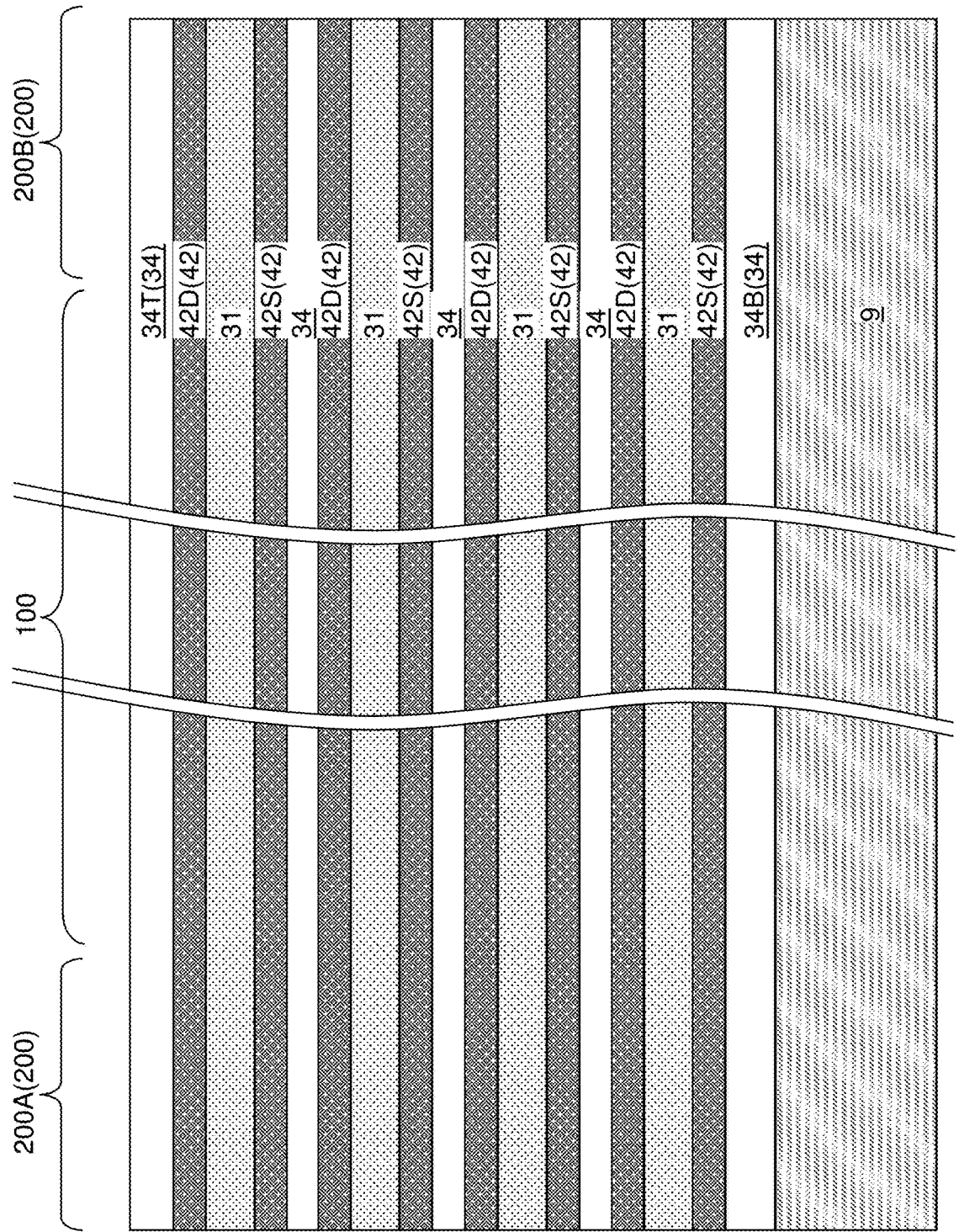
FIG. 16 is a vertical cross-sectional view of a second exemplary structure after formation of a vertical repetition of a unit layer stack that includes a source-level material layer, a channel-level material layer, a drain-level material layer, and an insulating layer according to a second embodiment of the present disclosure.

Referring to FIG. 16, a second exemplary structure according to a second embodiment of the present disclosure is illustrated. The second exemplary structure is used to form a NOR memory device rather than a NAND memory device of the first embodiment. The second exemplary structure can be formed by forming a bottommost insulating layer 34 over a substrate 9, and by forming at least one instance of a unit layer stack including a source-level material layer, a channel-level material layer, and a drain-level material layer. The at least one instance of the unit layer stack may be a single instance of the unit layer stack, or multiple instances of the unit layer stack. As used herein, a "unit layer stack" refers to a layer stack of multiple layers. If multiple instances of a unit layer stack are formed, the unit layer stack may function as a unit of repetition within a structure in which multiple instances of the unit layer stack are repeated. In case multiple instances of the unit layer stack are formed over the bottommost insulating layer 34B, then the unit layer stack may comprise a source-level material layer, a channel-level material layer, a drain-level material layer, and an insulating layer 34, which is also referred to as inter-transistor-isolation insulating layer. The source-level material layer and the drain-level material layer are vertically spaced from each other by the channel-level material layer. While in one embodiment the drain-level material layer overlies the source-level material layer within each unit layer stack, in alternative embodiments, the source-level material layer overlies the drain-level material layer. In other words, the locations of the source-level material layer and the drain-level material layer may be interchanged in each unit layer stack.

Generally, the source-level material layer and the drain-level material layer within each unit layer stack may be formed as, or may be subsequently replaced with, respective electrically conductive source and drain layers. In case the source-level material layer and the drain-level material layer within each unit layer stack are subsequently replaced with the respective electrically conductive source and drain layers, then the source-level material layer may be formed as a source-level sacrificial layer 42S, and the drain-level material layer may be formed as a drain-level sacrificial layer 42D within each unit layer stack. The source-level sacrificial layer 42S and the drain-level sacrificial layer 42D includes a first sacrificial material that may be subsequently removed selective to the materials of the insulating layers 34 and the channel-level material layer. In an illustrative example, the first sacrificial material of the source-level sacrificial layer 42S and the drain-level sacrificial layer 42D within each unit layer stack may comprise silicon nitride, borosilicate glass, organosilicate glass, a silicon-germanium alloy, amorphous carbon or diamond-like carbon, or a polymer material. The thickness of each of the source-level sacrificial layers 42S and the drain-level sacrificial layers 42D may be in a range from 10 nm to 100 nm, such as from 15 nm to 50 nm, although lesser and greater thicknesses may also be employed.

While in one embodiment the source-level material layer and the drain-level material layer are formed as the source-level sacrificial layer 42S and the drain-level sacrificial layer 42D that are subsequently replaced with a source layer and a drain layer, in alternative embodiments the source-level material layer and the drain-level material layer are formed as an electrically conductive source and drain layers, respectively. The source and drain layer comprise at least one electrically conductive material, which may comprise a metallic material (such as a conductive metallic nitride material, a metal, an intermetallic alloy, and/or a metal-semiconductor alloy, such as a silicide) and/or a heavily doped semiconductor material having a doping of an opposite conductivity type than the conductivity type the semiconductor channel (which may be present in the channel-level material layer or may be formed during replacement of the channel-level material layer within a channel-containing layer). In such alternative embodiments, subsequent processes for replacing the source-level sacrificial layers 42S and the drain-level sacrificial layers 42D with source layers and drain layers may be omitted.

The channel-level material layer within each unit layer stack may comprise a semiconductor channel, or may be subsequently replaced with a semiconductor channel. In one embodiment, if the channel-level material layer within each unit layer stack is subsequently replaced with a semiconductor channel, then the channel-level material layer may be formed as a channel-level sacrificial layer 31 including a sacrificial material, which is herein referred to as a second sacrificial material. The sacrificial material of the channel-level sacrificial layer 31 may comprise silicon nitride, borosilicate glass, organosilicate glass, a silicon-germanium alloy, amorphous carbon or diamond-like carbon, or a polymer material. In case the source-level material layers and the drain-level material layers comprise source-level sacrificial layers 42S and drain-level sacrificial layers 42D containing the first sacrificial material, the second sacrificial material may be different from the first sacrificial material. In an illustrative example, the first sacrificial material may comprise silicon nitride or a silicon-germanium alloy, and the second sacrificial material may comprise borosilicate glass or organosilicate glass. The thickness of each of the channel-level material layer, such as each channel-level sacrificial layer 31, may be in a range from 10 nm to 100 nm, such as from 15 nm to 50 nm, although lesser and greater thicknesses may also be employed.

In an alternative embodiment, the channel-level material layer within each unit layer stack is formed as a semiconductor channel. In this case, the semiconductor channel may comprise a high mobility, narrow bandgap compound semiconductor material, such as a III-V semiconductor material, for example InAs. The semiconductor channel can have a doping of a first conductivity type (e.g., n-type). In such embodiments, subsequent processes for replacing the channel-level sacrificial layer 31 with a semiconductor channel in each unit layer stack may be omitted.

Each insulating layer 34 (which is also referred to as an inter-transistor-isolation insulating layer) includes an insulating material, such as undoped silicate glass (i.e., silicon oxide). The thickness of each insulating layer 34 may be in a range from 10 nm to 100 nm, such as from 15 nm to 50 nm, although lesser and greater thicknesses may also be employed.

In one embodiment, multiple instances of a unit layer stack including a source-level sacrificial layer 42S, a channel-level sacrificial layer 31, a drain-level sacrificial layer 42D, and an inter-transistor-isolation insulating layer 34 may be formed over the bottommost insulating layer 34B. The total number of repetitions of the unit layer stack (42S, 31, 42D, 34) can be the same as the total number of levels of vertical field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device. In one embodiment, the total number of repetitions of the unit layer stack (42S, 31, 42D, 34) may be in a range from 2 to 512, such as from 4 to 256, although lesser and greater numbers may also be employed. The topmost layer of the multiple instances of the unit layer stack may be a topmost insulating layer 34T, which is the topmost one among the insulating layers 34.

The second exemplary structure may comprise a memory array region 100 in which memory openings and memory opening fill structures are subsequently formed, and a first contact region 200A and a second contact region 200B in which stepped surfaces and contact via cavities are subsequently formed. The first contact region 200A and the second contact region 200B are collectively referred to as contact regions 200.

Figure 17:
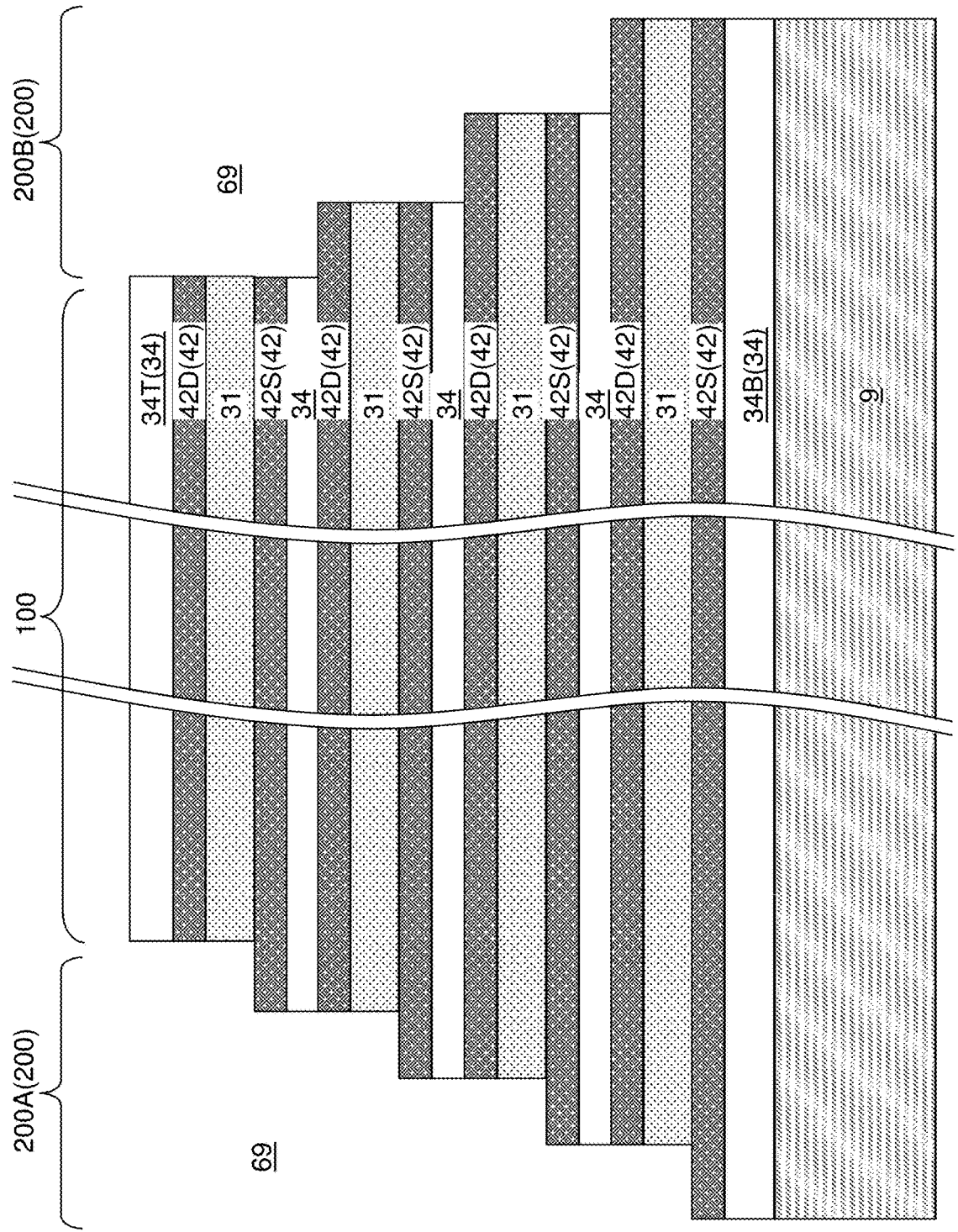
FIG. 17 is a vertical cross-sectional view of the second exemplary structure after formation of stepped surfaces and stepped cavities according to the second embodiment of the present disclosure.

Referring to FIG. 17, the multiple instances of the unit layer stack (42S, 31, 42D, 34) can be patterned for form stepped surfaces in the staircase regions (200A, 200B). For example, a trimmable mask layer (not shown) can be formed over the second exemplary structure, and can be patterned to cover each memory array region 100 and proximal portions of the staircase regions (200A, 200B) such that the edges of the trimmable mask layer are formed at location at which outermost vertical steps of stepped surfaces are to be subsequently formed. An anisotropic etch process can be performed to etch through one unit layer stack (42S, 31, 42D, 34) within areas that are not covered by the trimmable mask layer. The trimmable mask layer can be isotropically trimmed so that edges of the trimmable mask layer are formed at which second outermost vertical steps of the stepped surfaces are to be subsequently formed. An anisotropic etch process can be performed to etch through one unit layer stack (42S, 31, 42D, 34) within areas that are not covered by the trimmable mask layer. The isotropic trimming process for the trimmable mask layer and the anisotropic etch process can be repeatedly performed to form stepped surfaces within each of the staircase regions (200A, 200B).

In one embodiment, stepped surfaces in a pair of staircase regions (200A, 200B) located on each side of a memory array region 100 can be vertically offset such that one type of surfaces are physically exposed in one of the staircase regions (200A, 200B) and another type of surfaces are physically exposed in another of the staircase regions (200A, 200B). For example, horizontal surfaces of the source-side sacrificial layers 42S can be physically exposed in the source side staircase region 200A adjacent to one side of the memory array region 100, and horizontal surfaces of drain-level sacrificial layers 42D can be physically exposed in the drain side staircase region 200B adjacent to the opposite side of the memory array region 100. The vertical offset between the horizontal steps in each pair of staircase regions (200A, 200B) located on opposite sides of the same memory array region 100 can be about one half of the unit layer stack (42S, 31, 42D, 34), such as the sum of the thickness of a channel-level sacrificial layer 31 and the thickness of a drain-level sacrificial layer 42D. In this case, an etch mask layer (not shown) such as a patterned photoresist layer can cover the memory array region 100 and one of the staircase regions (e.g., 200A), and vertically recess the other staircase region (e.g., 200B) by the thickness of one half of the unit layer stack (42S, 31, 42D, 34).

Stepped cavities 69 having stepped bottom surfaces can be formed in the staircase regions (200A, 200B). The lateral extent of each type of layer within the multiple instances of the unit layer stack (42S, 31, 42D, 34) can decrease with a vertical distance from the substrate 9 upon patterning the stepped surfaces on the multiple instances of the unit layer stack (42S, 31, 42D, 34). The trimmable mask layer can be removed after forming the topmost vertical steps.

Figure 18A:
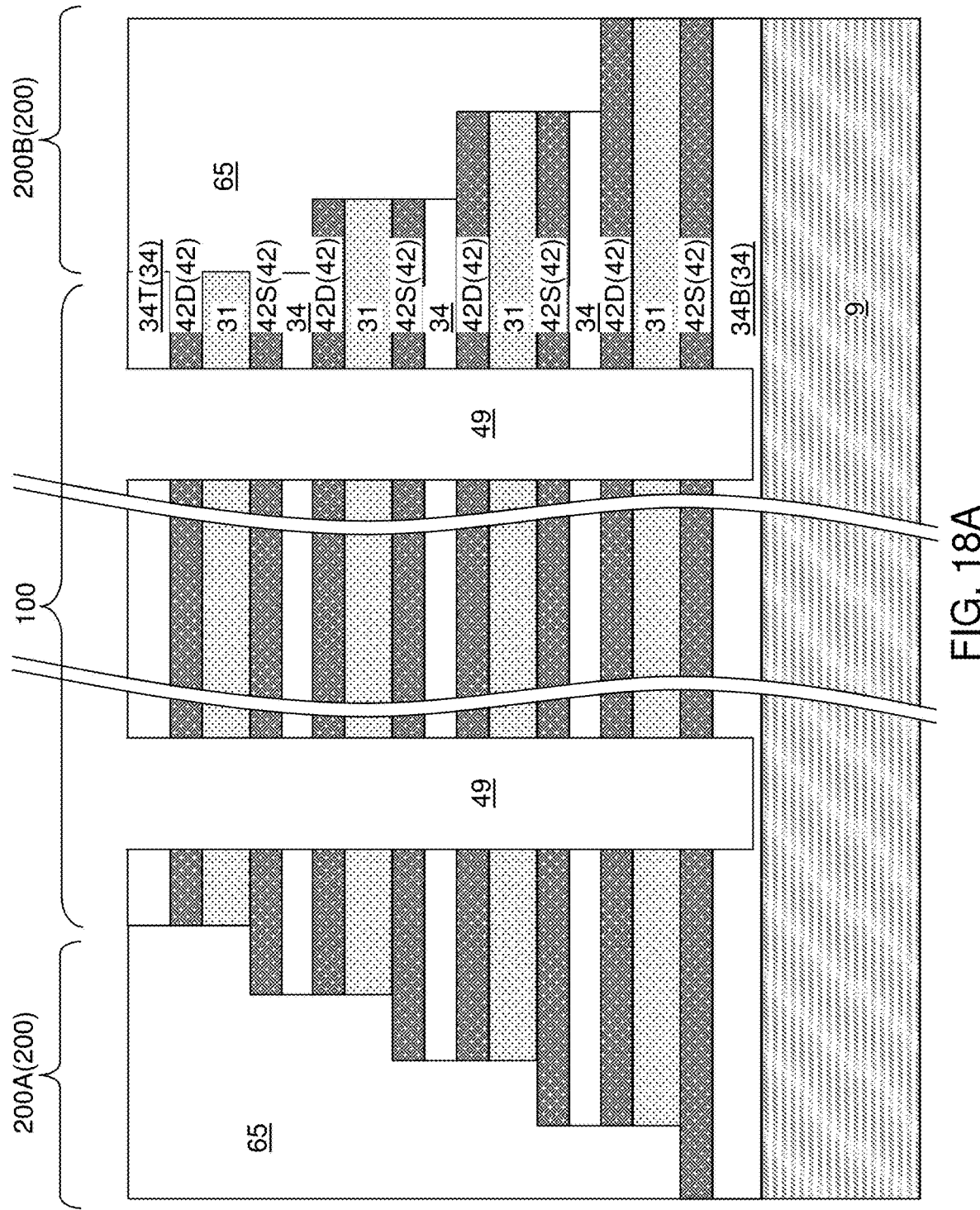
FIG. 18A is a vertical cross-sectional view of the second exemplary structure after formation of memory openings according to the second embodiment of the present disclosure.

Referring to FIGS. 18A-18C, a retro-stepped dielectric material portion 65 (i.e., an insulating fill material portion) can be formed in each stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 34, for example, by chemical mechanical planarization (CMP). Each remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

A lithographic material stack (not shown) including at least a photoresist layer can be formed over the topmost insulating layer 34T and the retro-stepped dielectric material portion 65, and can be lithographically patterned to form openings therein. The openings include a first set of openings formed over the memory array region 100 and an optional second set of openings (not illustrated) formed over the staircase regions (200A, 200B). The pattern in the lithographic material stack can be transferred through the topmost insulating layer 34 or the retro-stepped dielectric material portion 65, the multiple instances of the unit layer stack (42S, 31, 42D, 34), and the bottommost insulating layer 34B by at least one anisotropic etch that employs the patterned lithographic material stack as an etch mask. Portions of the multiple instances of the unit layer stack (42S, 31, 42D, 34) located in the memory array region 100 and underlying the first set of openings in the patterned lithographic material stack are etched to form memory openings 49. The memory openings 49 are formed through the topmost insulating layer 34 and the entirety of the multiple instances of the unit layer stack (42S, 31, 42D, 34) in the memory array region 100. Unmasked regions of the multiple instances of the unit layer stack (42S, 31, 42D, 34) and the retro-stepped dielectric material portions 65 located in the staircase regions (200A, 200B) that underlie the second set of openings in the patterned lithographic material stack can be etched to form optional support openings (not shown).

The memory openings 49 extend through the entirety of the multiple instances of the unit layer stack (42S, 31, 42D, 34). The chemistry of the anisotropic etch process employed to etch through the materials of the multiple instances of the unit layer stack (42S, 31, 42D, 34) can alternate to optimize etching of the respective materials in the multiple instances of the unit layer stack (42S, 31, 42D, 34). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can extend from the top surface of the multiple instances of the unit layer stack (42S, 31, 42D, 34) to at least the horizontal plane including the topmost surface of the substrate 9. Each of the memory openings 49 may include a sidewall (or a plurality of sidewalls) that extends substantially perpendicular to the topmost surface of the substrate 9. A two-dimensional array of memory openings 49 can be formed in the memory array region 100 through the multiple instances of the unit layer stack (42S, 31, 42D, 34). In one embodiment, the two-dimensional array of memory openings 49 can be formed as clusters of periodic two-dimensional arrays such as hexagonal arrays.

Figure 19A:
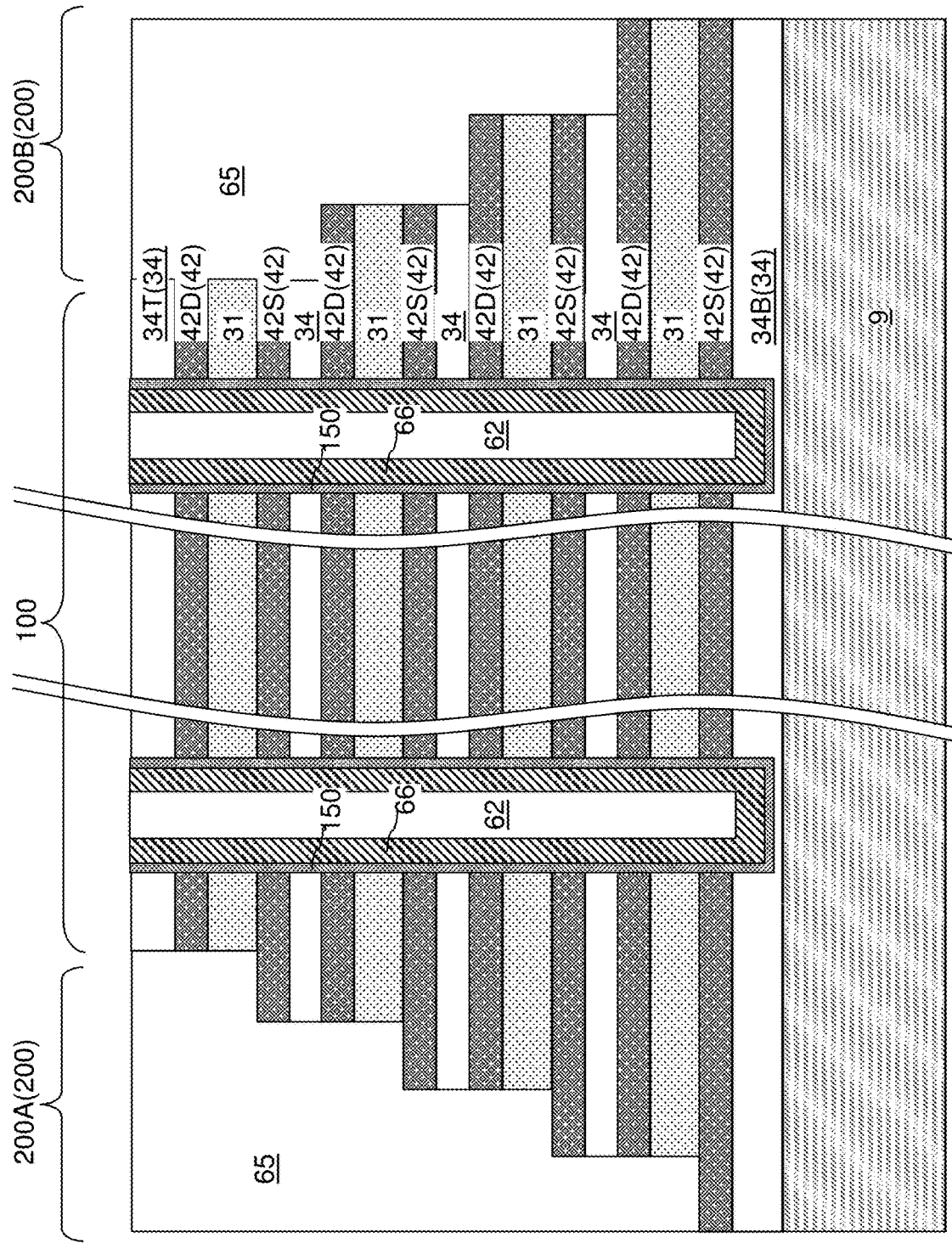
FIG. 19A is a vertical cross-sectional view of the second exemplary structure after formation of a memory film, a control gate electrode, and a dielectric core in each memory opening according to the second embodiment of the present disclosure.
Figure 19B:
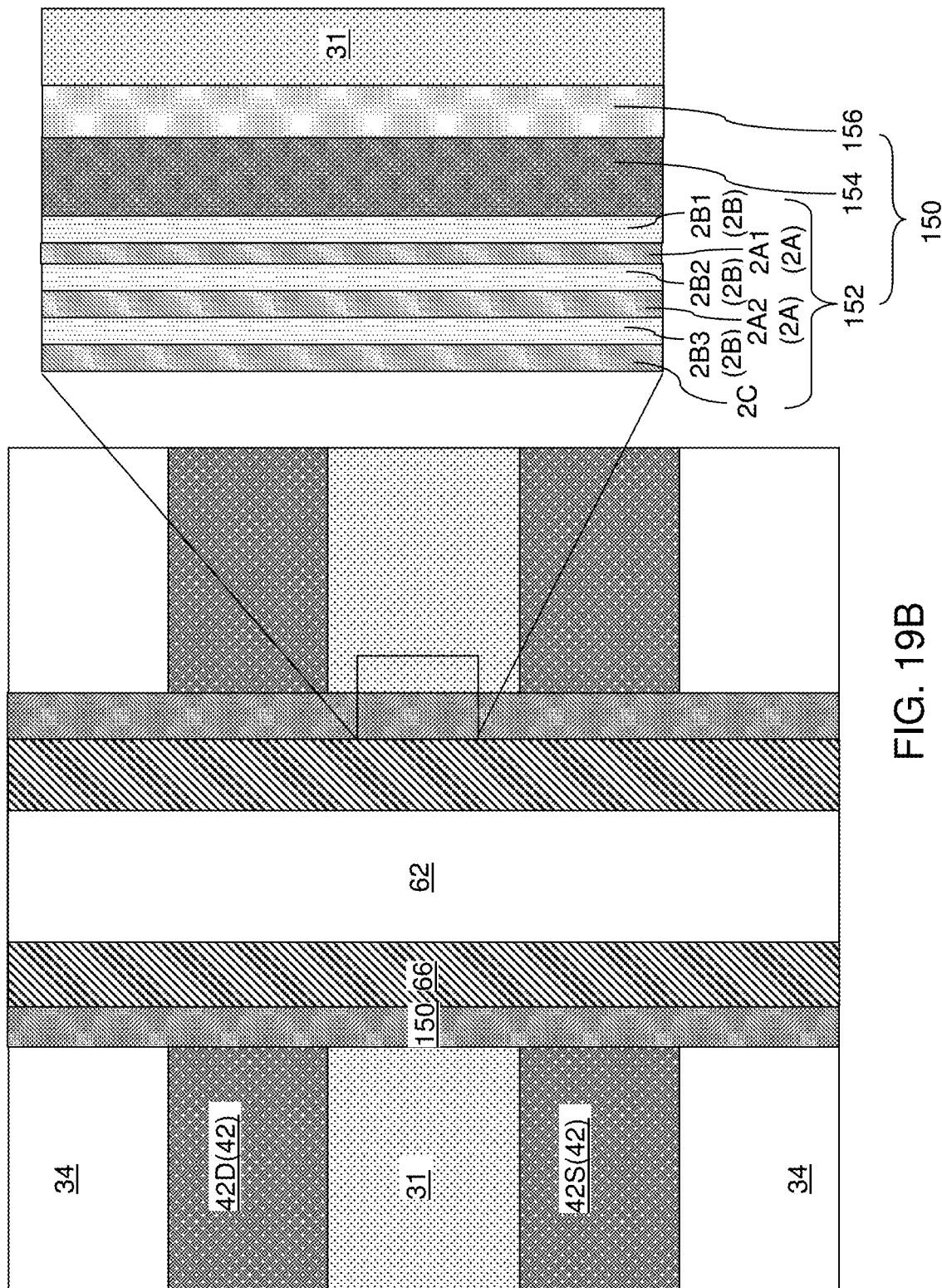
FIG. 19B is a vertical cross-sectional view of a region of the second exemplary structure around a memory opening at the processing step of FIG. 19A.

Referring to FIGS. 19A and 19B, a memory film 150 can be formed on the physically exposed surfaces of the memory openings 49 and over the topmost insulating layer 34 by a series of conformal deposition processes. The memory film 150 includes the resonant tunneling barrier stack 152, the memory material layer 154, and the semiconductor barrier layer 156 described above with respect to the first embodiment. The memory film 150 that is formed in the second exemplary structure may have the same structure as the memory film 150 in the first exemplary structure. The layers within the memory film 150 in the second exemplary structure may be formed in a reverse order relative to the order of formation of the layers within the memory film 150 shown in FIG. 5C of the first exemplary structure. In other words, the semiconductor barrier layer 156 can be formed first, and the memory material layer 154 can be formed next, and the resonant tunneling barrier stack 152 can be formed last.

The semiconductor barrier layer 156 may have a relatively wide bandgap and relatively high thickness which prevents electron tunneling therethrough. Thus, the semiconductor barrier layer 156 may function as a blocking layer in a charge storage NAND device. In one embodiment, the semiconductor barrier layer comprises a compound semiconductor material having a band gap greater than 2 eV. The semiconductor barrier layer 156 may comprise aluminum antimonide have a direct band gap of about 2.22 eV. The thickness of the homogeneous barrier layer 156 may be at least 8 nm, such as in a range from 8 nm to 20 nm, such as from 10 nm to 12 nm, although lesser and greater thicknesses may also be employed. The semiconductor barrier layer 156 may comprise a homogeneous barrier layer having a homogeneous material composition throughout. The semiconductor barrier layer 156 can be formed directly on the physically exposed sidewalls of the multiple instances of the unit layer stack (42S, 31, 42D, 34).

The memory material layer 154 can be deposited as a continuous material layer by a conformal deposition process such as a chemical vapor deposition process or an atomic layer deposition process. The memory material layer 154 includes a memory material, i.e., a material that can store data by selecting a state of the material. For example, the memory material layer 154 may include a charge storage material such as silicon nitride, polysilicon, or a metallic material. The memory material layer 154 can be formed as a single memory material layer of homogeneous composition, or can include a stack of multiple memory material layers. In one embodiment, the memory material layer 154 may comprise an insulating charge trapping material, such as one or more silicon nitride segments. The memory material layer 154 can be formed, for example, by chemical vapor deposition (CVD), atomic layer deposition (ALD), physical vapor deposition (PVD), or any suitable deposition technique for storing electrical charges therein. The thickness of the memory material layer 154 can be in a range from 2 nm to 20 nm, although lesser and greater thicknesses can also be employed. In one embodiment, the memory material layer 154 may comprise a charge storage layer consisting essentially of silicon nitride and having a thickness in a range from 4 nm to 6 nm, although lesser and greater thicknesses may also be employed.

The resonant tunneling barrier stack 152 includes at least two semiconductor quantum wells. Each semiconductor quantum well includes a well layer 2A located between two barrier layers 2B. The well layer 2A comprises a semiconductor material having a relatively narrow first bandgap, and the barrier layers 2B comprise a semiconductor material having a relatively wide second bandgap which is wider than the first bandgap. For example, the well layer 2A and the barrier layers 2B of the semiconductor quantum well comprise compound semiconductor layers, such as Group III-V semiconductor layers. In one embodiment, the well layer 2A may have a direct bandgap less than 1 eV, such as less than 0.5 eV, for example, 0.3 eV to 0.45 eV. For example, the well layer 2A may comprise indium arsenide, which has a direct bandgap of about 0.36 eV. In one embodiment, the barrier layers 2B may have a direct bandgap greater than 1.5 eV, such as than greater than 2 eV, for example, 2.1 eV to 2.3 eV. For example, the barrier layers 2B may comprise aluminum antimonide, which has a direct bandgap of about 2.22 eV. Other semiconductor layers may be used instead of InAs and/or AlSb. In one embodiment, resonant tunneling barrier stack 152 includes two semiconductor quantum wells comprising three wide bandgap semiconductor barrier layers 2B interlaced with two narrow bandgap semiconductor well layers 2A. Optionally, an optional InAs interface layer 2C may be located on a sidewall of the memory opening (i.e., may comprise the outer surface of the resonant tunneling barrier stack 152).

Each of the barrier layers 2B may have a thickness in a range from 1 nm to 3 nm, such as from 1.2 nm to 2 nm, although lesser and greater thicknesses may also be employed. Each of the well layers 2A may have a thickness in a range from 1 nm to 4 nm, such as from 2 nm to 3 nm, although lesser and greater thicknesses may also be employed. In a non-limiting illustrative example, a resonant tunneling barrier stack 152 may comprise, from outside to inside (which corresponds to the order of deposition), an optional semiconductor interface layer 2C composed of InAs and having a thickness in a range from 1 nm to 1.5 nm, a first semiconductor barrier layer 2B1 composed of AlSb and having a thickness of about 1.8 nm, a first semiconductor well layer 2A1 composed of InAs and having a thickness of about 3 nm, a second semiconductor barrier layer 2B2 composed of AlSb and having a thickness of about 1.2 nm, a second semiconductor well layer 2A2 composed of InAs and having a thickness of about 2.4 nm, and a third semiconductor barrier layer 2B3 composed of AlSb and having a thickness of about 1.8 nm.

At least one conductive material can be conformally deposited on the physically exposed surfaces of the memory film 150 in each memory opening 49. The at least one conductive material can be deposited directly on an inner cylindrical sidewall of the resonant tunneling barrier stack 152 in each memory opening 40. The at least one conductive material may comprise at least one metallic material or a heavily-doped semiconductor material. For example, the at least one conductive material may comprise a conductive metallic nitride material (such as TiN, TaN, WN, or MoN), an elemental metal (such as Ti, Ta, W, Mo, Co, Ru, etc.), an intermetallic alloy, or a metal-semiconductor alloy material (such as a metal silicide material).

A dielectric fill material such as silicon oxide can be deposited in remaining volumes of the memory openings 49. Portions of the dielectric fill material, the at least one conductive material, and the memory film 150 that are formed above the horizontal plane including the top surface of the topmost insulating layer 34 can be removed by a planarization process, which may employ a chemical mechanical polishing (CMP) process and/or a recess etch process. Each remaining portion of the dielectric fill material constitutes a dielectric core 62. Each remaining portion of the at least one conductive material constitutes a control gate electrode 66, which is employed to inject electrical charges into, and/or to extract electrical charges from, the memory material layer 154. Thus, each memory opening can be filled with a memory opening fill structure (150, 66, 62) that includes a memory film 150, a control gate electrode 66, and a dielectric core 62.

Generally, a memory film 150 can be formed in each memory opening 49. The memory film 150 comprises a layer stack that includes a resonant tunneling barrier stack 152, a semiconductor barrier layer 156, and a memory material layer 154 located between the resonant tunneling barrier stack 152 and the semiconductor barrier layer 156. The semiconductor barrier layer 156 can be formed directly on a sidewall of the memory opening 49, and a control gate electrode 66 is formed directly on the resonant tunneling barrier stack 152.

The resonant tunneling barrier stack comprises at least two semiconductor quantum wells, which may comprise three wide bandgap semiconductor barrier layers 2B interlaced with two narrow bandgap semiconductor well layers 2A. For example, the least two semiconductor quantum wells may comprise a first quantum well and an second quantum well that is formed between the first quantum well and the control gate electrode 66. The first quantum well may comprise a first semiconductor well layer 2A1 that is formed between a first barrier layer 2B1 and a second barrier layer 2B2, and the second quantum well comprises a second semiconductor well layer 2A2 that is formed between the second barrier layer 2B2 and a third barrier layer 2B3. The first semiconductor well layer 2A1 is thinner than the second semiconductor well layer 2A2. In one embodiment, the memory material layer 154 can be formed directly on an inner sidewall of the semiconductor barrier layer 156, and the resonant tunneling barrier stack 152 may be formed directly on an inner sidewall of the memory material layer 154.

Figure 20A:
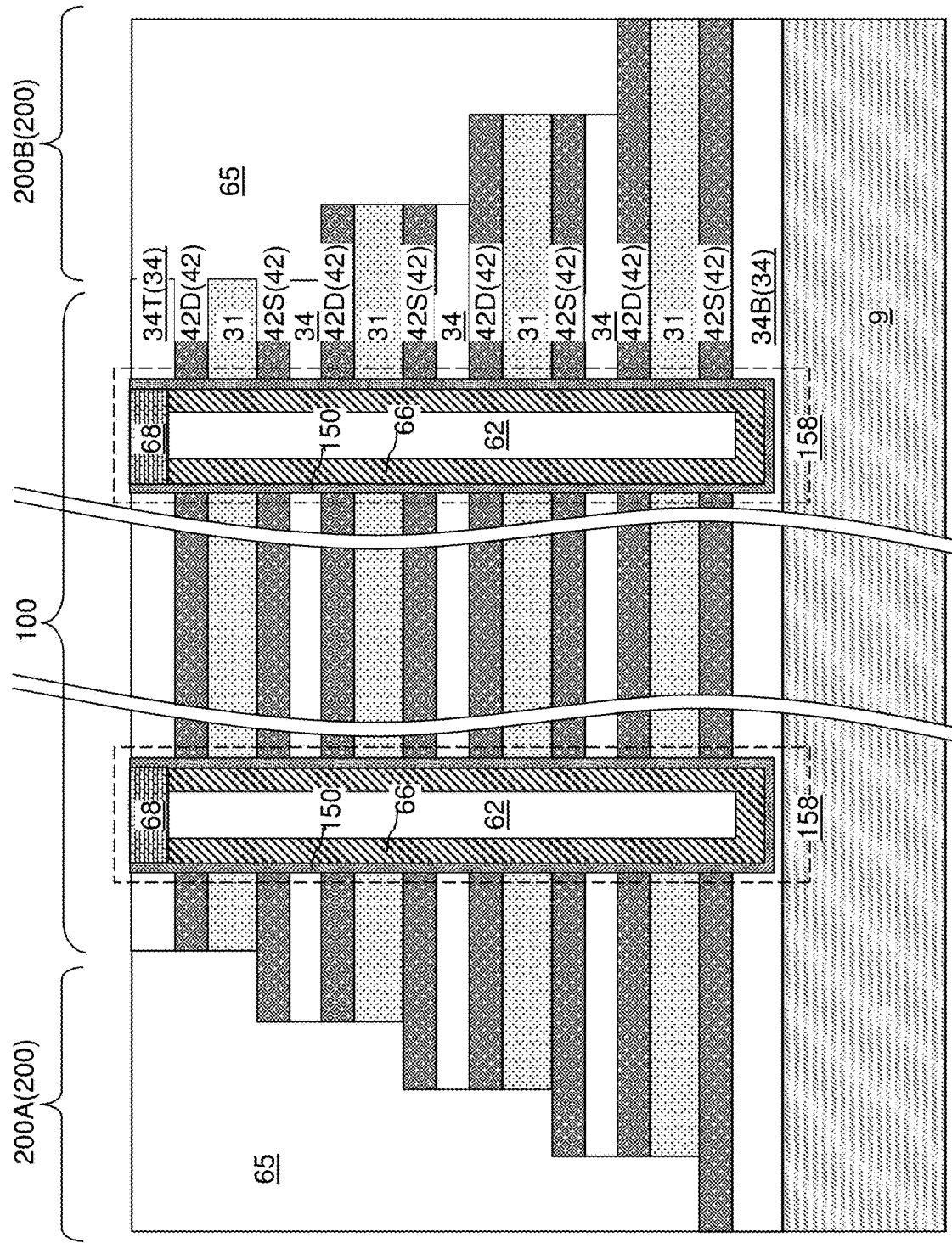
FIG. 20A is a vertical cross-sectional view of the second exemplary structure after formation of a contact pad structure at an upper portion of each memory opening according to the second embodiment of the present disclosure.

Referring to FIGS. 20A and 20B, top portions of the dielectric cores 62 and optionally top portions of the control gate electrodes 66 can be vertically recessed to form cavity regions. A conductive material, such as a metallic material can be deposited in the cavity regions. Excess portions of the conductive material can be removed from above the horizontal plane including the top surface of the topmost insulating layer 34. Each remaining portion of the conductive material constitutes a contact pad structure 68. In one embodiment, the contact pad structures 68 can include a layer stack of a metallic nitride liner (TaN, TiN, or WN) and a conductive fill material such as a metallic material (such as W, Ru, Co, or Mo), a doped semiconductor material, and/or a metal silicide material. Each contact pad structure 68 contacts a top end of a respective control gate electrode 66. Optionally, the contact pad structure 68 may be omitted. The set of all material portions filling a memory opening 49 constitutes a memory opening fill structure 158. In one embodiment, each memory opening fill structure 158 may comprise a memory film 150, a control gate electrode 66, an optional dielectric core 62, and an optional contact pad structure 68.

Figure 21A:
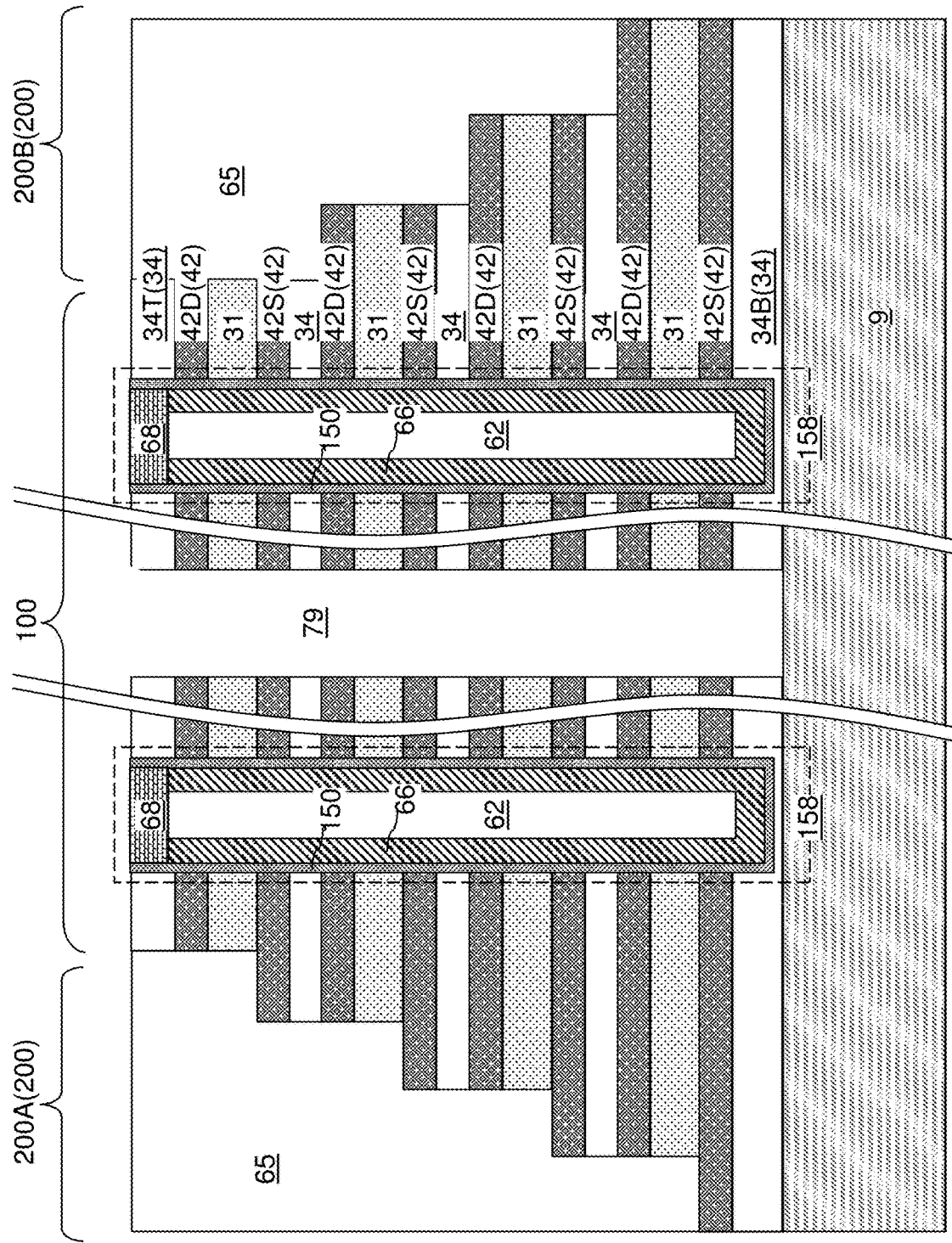
FIG. 21A is a vertical cross-sectional view of the second exemplary structure after formation of backside trenches according to the second embodiment of the present disclosure.

Referring to FIGS. 21A and 21B, a photoresist layer (not shown) can be applied over the topmost insulating layer 34, and can be lithographically patterned to form openings in areas between clusters of memory opening fill structures 158 and support pillar structures (if present). The pattern in the photoresist layer can be transferred through the topmost insulating layer 34 and the multiple instances of the unit layer stack (42S, 31, 42D, 34) employing an anisotropic etch to form backside trenches 79, which can vertically extend from the top surface of the topmost insulating layer 34 to the top surface of the substrate 9, and can laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 158 can be arranged in rows that extend along the first horizontal direction hd1. Each backside trench 79 can have a uniform width that is invariant along the lengthwise direction (i.e., along the first horizontal direction hd1). Multiple rows of memory opening fill structures 158 can be located between a neighboring pair of backside trenches 79. The photoresist layer can be removed, for example, by ashing.

Figure 22:
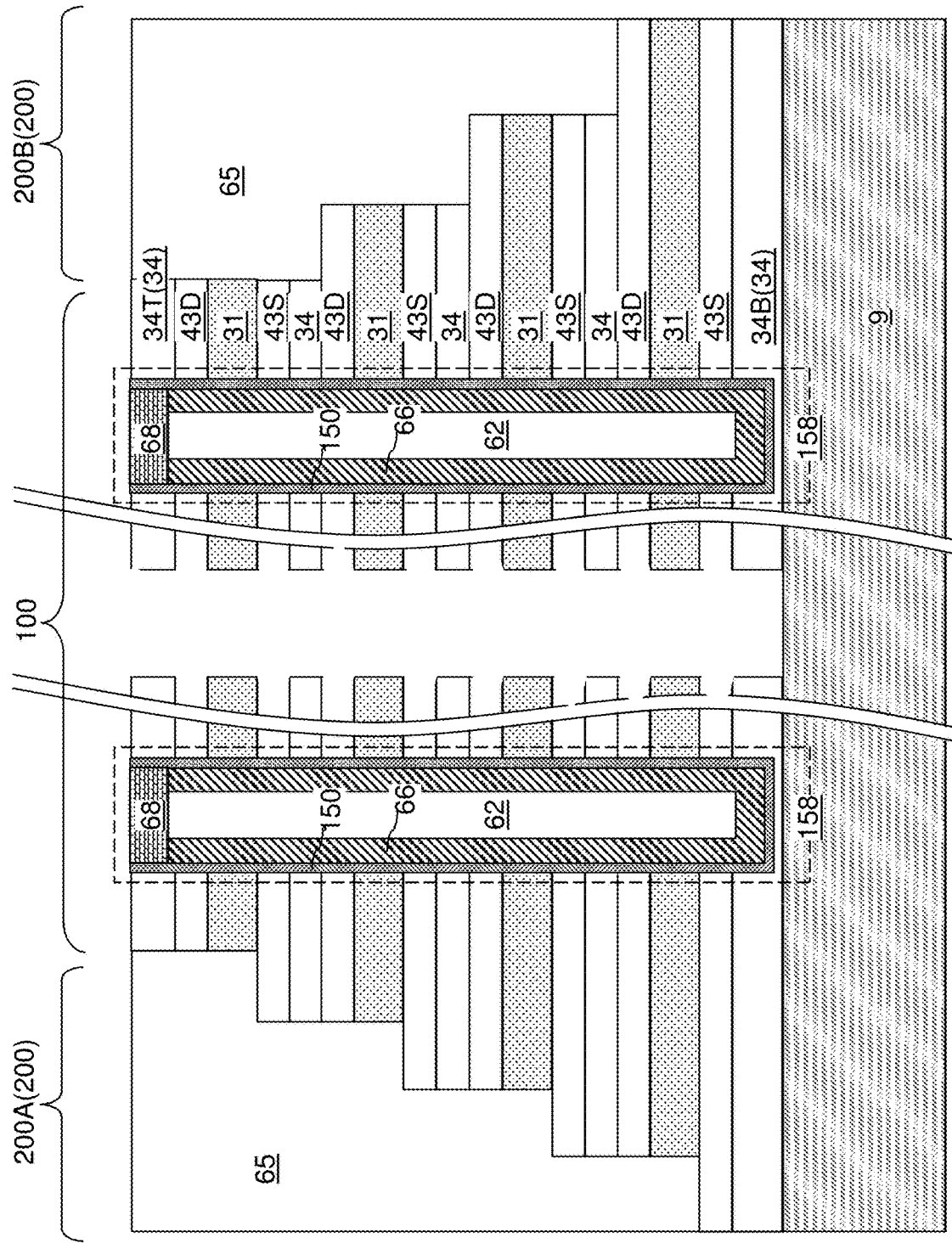
FIG. 22 is a vertical cross-sectional view of the second exemplary structure after formation of source-level backside recesses and drain-level backside recesses according to the second embodiment of the present disclosure.

Referring to FIG. 22, an etchant that selectively etches the materials of the source-level sacrificial layers 42S and drain-level sacrificial layers 42D with respect to the materials of the insulating layers 34, the channel-level sacrificial layers 31, the retro-stepped dielectric material portions 65, and semiconductor barrier layers 156 can be introduced into the backside trenches 79. Source-level backside recesses 43S and drain-level backside recesses 43D are formed in volumes from which the source-level sacrificial layers 42S and drain-level sacrificial layers 42D are removed by the selective etching, respectively. In one embodiment, the source-level sacrificial layers 42S and drain-level sacrificial layers 42D can include silicon nitride, and the materials of the insulating layers 34 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source-level sacrificial layers 42S and the drain-level sacrificial layers 42D include silicon nitride, then the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source-level sacrificial layers 42S and drain-level sacrificial layers 42D are removed. The memory openings 49 in which the memory opening fill structures 158 are formed are herein referred to as front side openings or front side cavities in contrast with the source-level backside recesses 43S and the drain-level backside recesses 43D. Each of the plurality of source-level backside recesses 43S and the drain-level backside recesses 43D can extend substantially parallel to the top surface of the substrate 9. In one embodiment, each backside recess (43S, 43D) can have a uniform height throughout.

Figure 23:
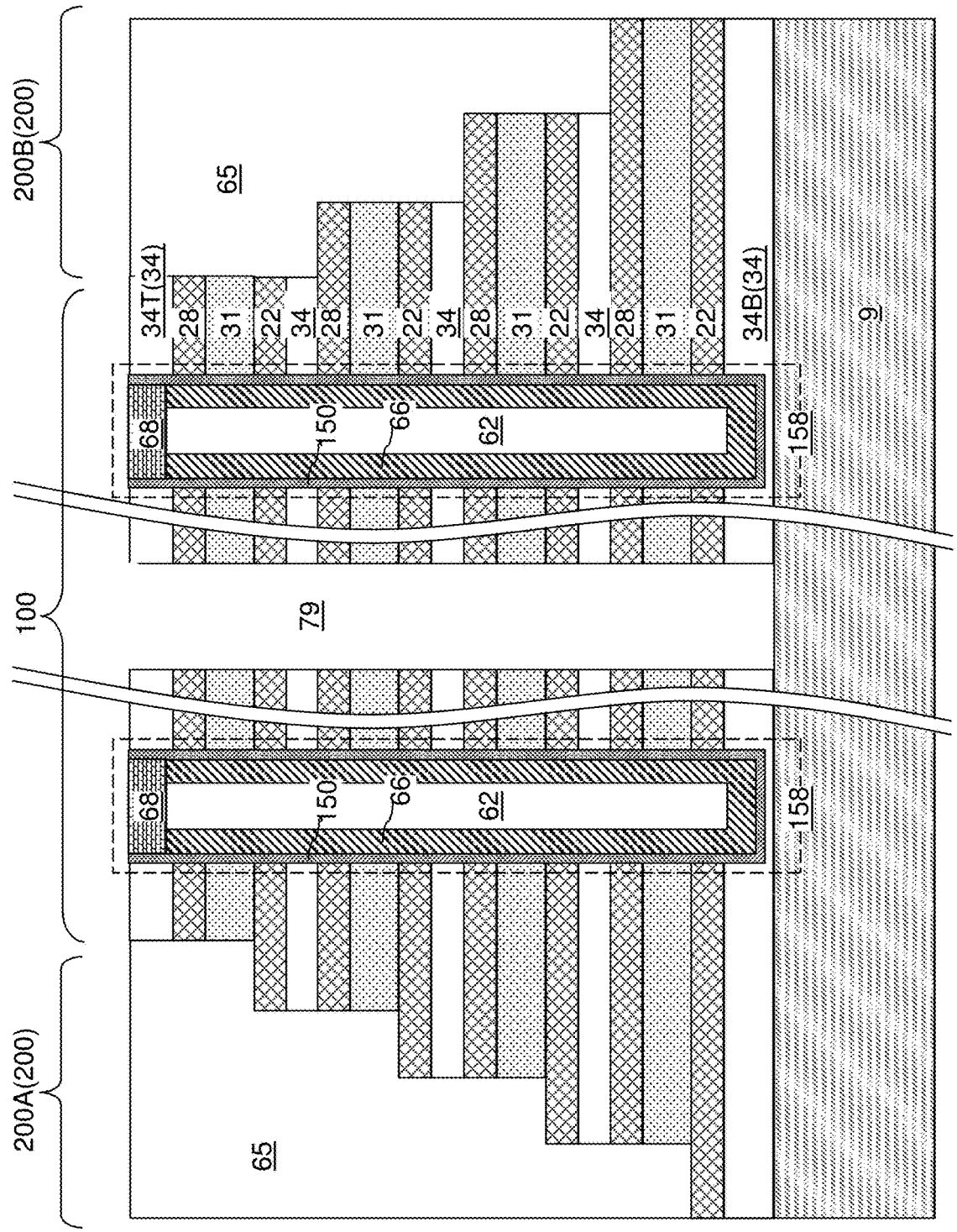
FIG. 23 is a vertical cross-sectional view of the second exemplary structure after formation of source layers and drain layers according to the second embodiment of the present disclosure.

Referring to FIG. 23, at least one electrically conductive material can be deposited in the source-level backside recesses 43S and the drain-level backside recesses 43D through the backside trenches 79. The at least one electrically conductive material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. Alternatively or additionally, the at least one electrically conductive material may comprise a heavily doped semiconductor material. In case a heavily doped semiconductor material is deposited directly on the horizontal surfaces of the channel-level sacrificial layers 31, or in case semiconductor channels having a doping a first conductivity type are present in lieu of the channel-level sacrificial layers 31, the heavily doped semiconductor material has a doping of a second conductivity type that is the opposite of the first conductivity type.

The at least one electrically conductive material fills all volumes of the source-level backside recesses 43S and the drain-level backside recesses 43D. Portions of the at least one electrically conductive material deposited at peripheral portions of the backside trenches 79 or above the topmost insulating layer 34 can be removed by an etch process, which may include an isotropic etch process and/or an anisotropic etch process. Remaining portions of the at least one electrically conductive material that fills the source-level backside recesses 43S constitute source layers 22, each of which functions as the source electrode of a respective set of NOR transistors. Remaining portions of the at least one electrically conductive material that fills the drain-level backside recesses 43D constitute drain layers 28, each of which functions as the drain electrode of the respective set of NOR transistors. Generally, the source-level sacrificial layer 42S and the drain-level sacrificial layers 42D are replaced with the source layers 22 and the drain layers 28 (i.e., source lines and bit lines), respectively.

Figure 24:
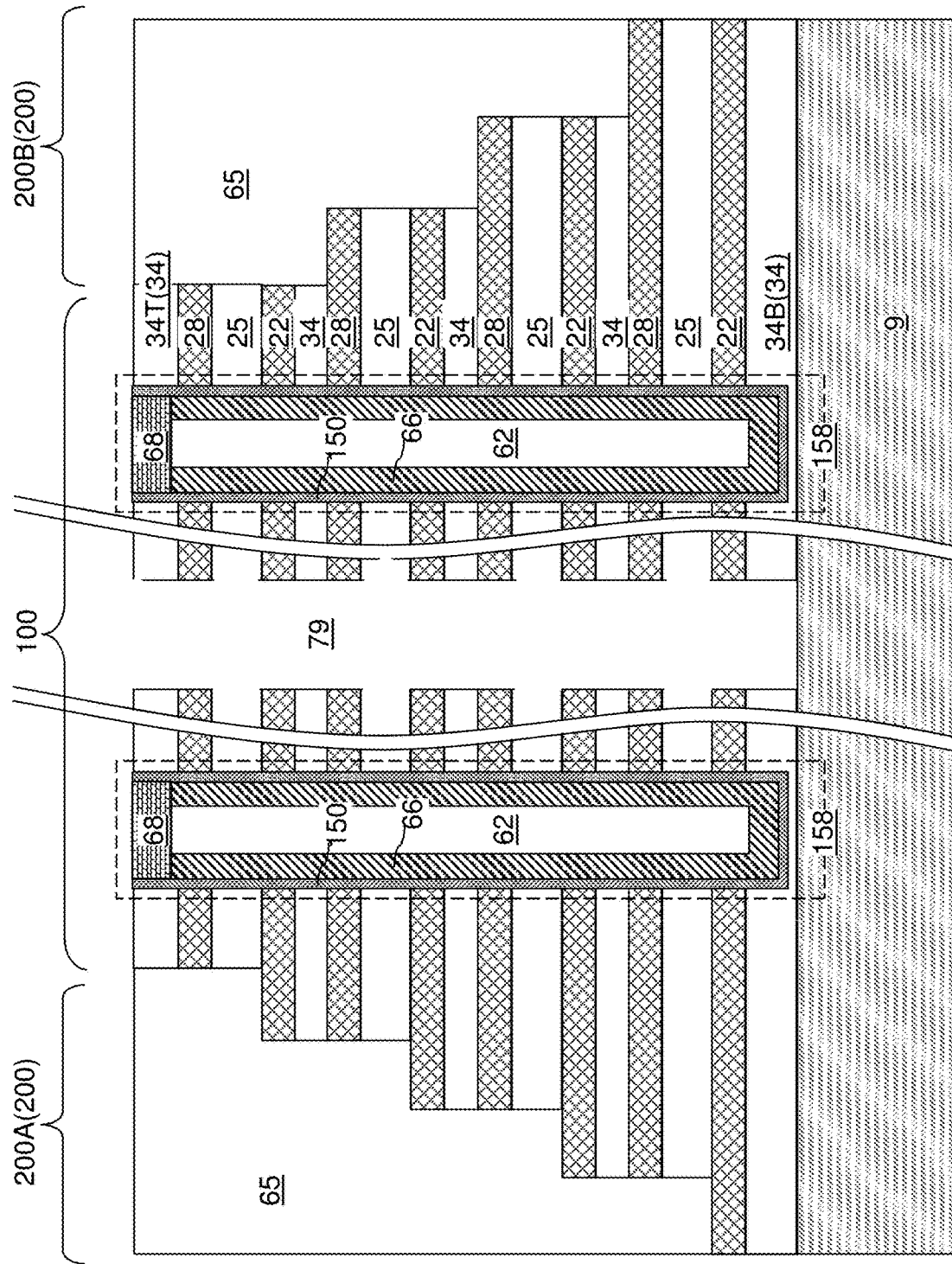
FIG. 24 is a vertical cross-sectional view of the second exemplary structure after formation of channel-level backside recesses according to the second embodiment of the present disclosure.

Referring to FIG. 24, an etchant that selectively etches the materials of the channel-level sacrificial layers 31 with respect to the materials of the insulating layers 34, the retro-stepped dielectric material portions 65, the source layers 22, and the drain layers 28 can be introduced into the backside trenches 79, for example, employing an etch process. Channel-level backside recesses 25 are formed in volumes from which the channel-level sacrificial layers 31 are removed. In one embodiment, the channel-level sacrificial layer 31 can include borosilicate glass or organosilicate glass, and the materials of the insulating layers 34 and the retro-stepped dielectric material portion 65 can include undoped silicate glass having an etch rate in 100:1 dilute hydrofluoric acid that is less than 1%, and/or less than 0.1%, of the etch rate of borosilicate glass or organosilicate glass.

The etch process can be a wet etch process employing a wet etch solution, or can be a gas phase (dry) etch process in which the etchant is introduced in a vapor phase into the backside trenches 79. For example, if the channel-level sacrificial layers 31 include borosilicate glass or organosilicate glass, the etch process can be a wet etch process employing 100:1 dilute hydrofluoric acid or 1,000:1 dilute hydrofluoric acid.

Each channel-level backside recess 25 can be a laterally extending cavity having a lateral dimension that is greater than the vertical extent of the cavity. In other words, the lateral dimension of each channel-level backside recess 25 can be greater than the height of the respective channel-level backside recess 25. A plurality of channel-level backside recesses 25 can be formed in the volumes from which the material of the channel-level sacrificial layers 25 is removed. Each of the plurality of channel-level backside recesses 25 can extend substantially parallel to the top surface of the substrate 9. In one embodiment, each channel-level backside recess 25 can have a uniform height throughout.

Figure 25:
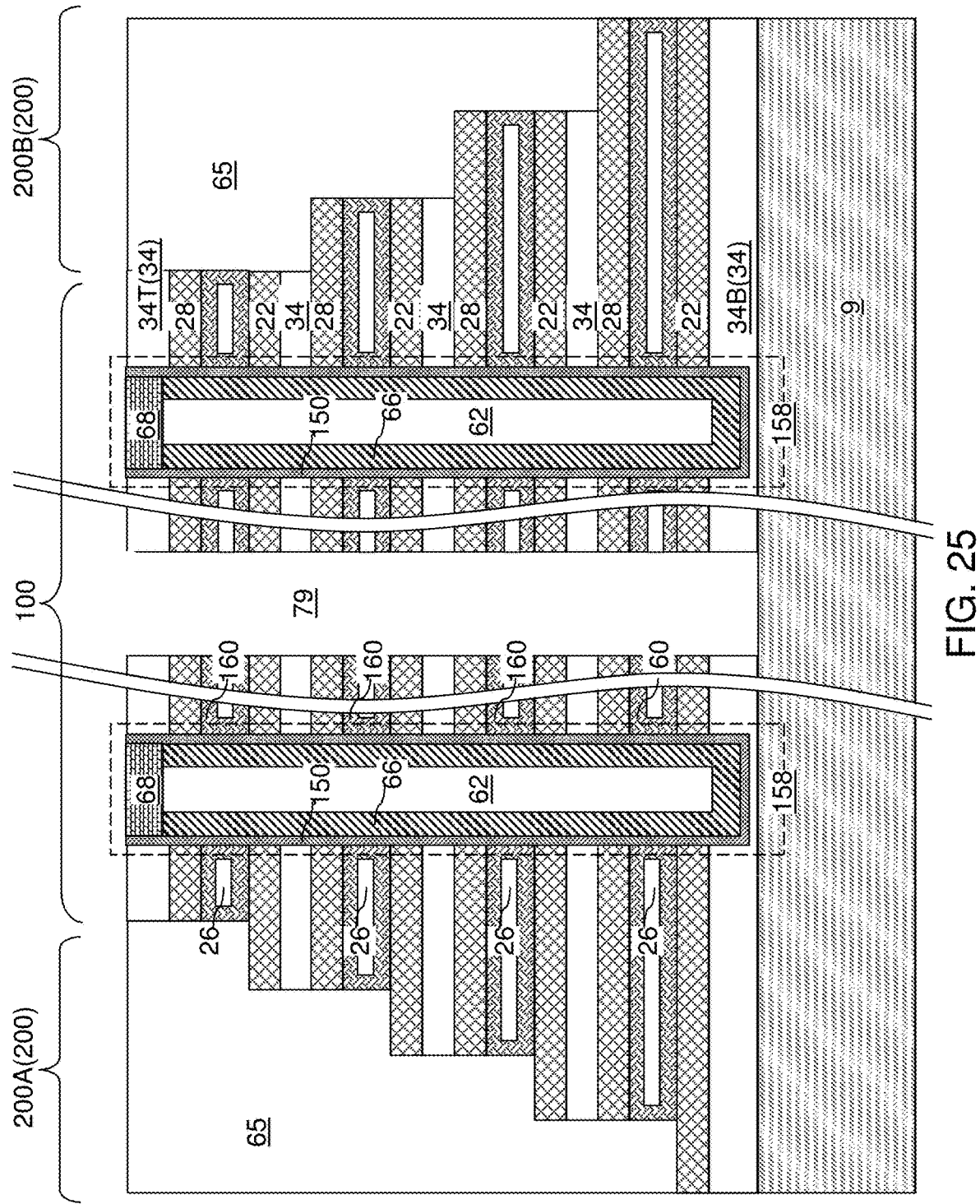
FIG. 25 is a vertical cross-sectional view of the second exemplary structure after formation of channel-containing layers according to the second embodiment of the present disclosure.

Referring to FIG. 25, a semiconductor channel material can be deposited directly on the physically exposed surfaces of the source layers 22 and the drain layers 28 and directly on physically exposed sidewall segments of the semiconductor barrier layers 156. In one embodiment, the semiconductor channel material includes a high mobility, narrow bandgap semiconductor material, such as indium arsenide (InAs). Use of a narrow bandgap semiconductor material for the semiconductor channel material provides the advantage of enhanced charge carrier mobility in a semiconductor channel. The semiconductor channel material can have a first conductivity type, which may be p-type or n-type. The semiconductor channel material can be deposited by a conformal deposition process such as a low pressure chemical vapor deposition (LPCVD) process or an atomic layer deposition (ALD) process. The thickness of the deposited semiconductor channel material may, or may not, be less than one half of the height of each channel-level backside recess 25. In one embodiment, the thickness of the deposited semiconductor channel material may be in a range from 2 nm to 10 nm, although lesser and greater thicknesses can also be employed. Generally, the semiconductor channel material may partially or fully fill the channel-level backside recesses 25.

In case the chancel-level backside recesses 25 are not fully filled with the semiconductor channel material, a dielectric fill material may be optionally deposited in the remaining volumes of the channel-level backside recesses 25 by a conformal or non-conformal deposition process. For example, a doped silicate glass, an undoped silicate glass, or organosilicate glass may be optionally deposited in unfilled volumes of the channel-level backside recesses 25 to form dielectric material portions.

Portions of the dielectric fill material and the semiconductor channel material that are deposited outside the channel-level backside recesses 25 can be removed by an etch back process, which may comprise at least one anisotropic etch process and/or at least one isotropic etch process. For example, portions of the dielectric fill material and the semiconductor channel material that are located in the backside trenches 79 or above the topmost insulating layer 34 can be removed by the etch back process. Each remaining portion of the semiconductor channel material located within a channel-level backside recess 25 constitutes a semiconductor channel 160. Each remaining portion of the dielectric fill material located within a channel-level backside recess 25 constitutes a channel-level dielectric region 26. Alternatively, in case the dielectric fill material is not employed, a channel-level dielectric region 26 which comprises an air gap may be formed within each channel-level backside recess 25.

A channel-containing layer (160, 26) can be formed within each channel-level backside recess 25. Each channel-containing layer (160, 26) may comprise a respective combination of a semiconductor channel 160 and an optional channel-level dielectric region 26. The channel-level dielectric region 26 may comprise a dielectric fill material and/or an air gap. In this case, each channel-level material layer is formed as a channel-level sacrificial layer 34, and is replaced with a channel-containing layer (160, 26) including a semiconductor channel 160.

In an alternative embodiment, the order of formation of the source and drain layer and the channel-containing layer is reversed. The steps of FIGS. 24 and 25 may be performed first, followed by the steps of FIGS. 22 and 23.

Figure 26:
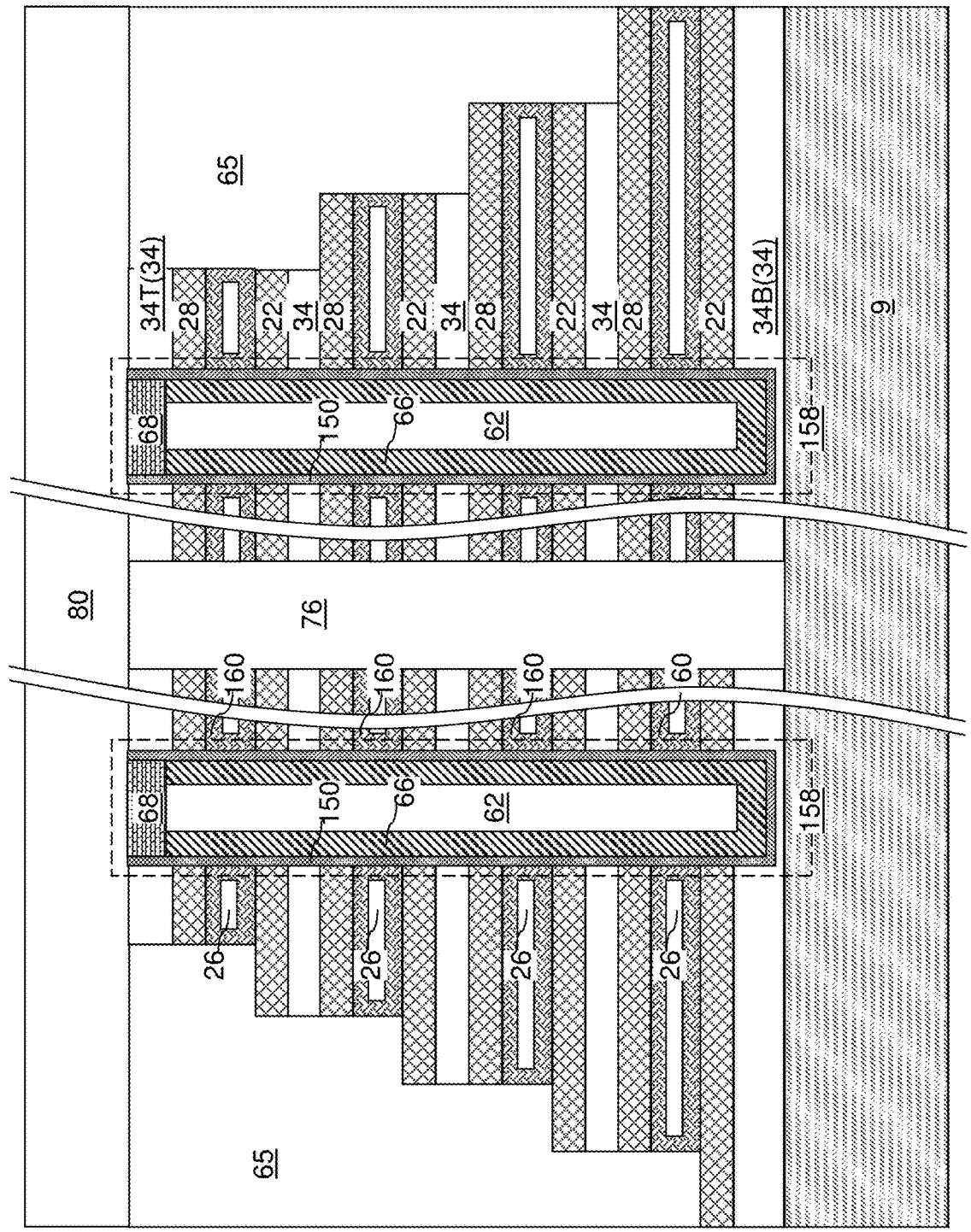
FIG. 26 is a vertical cross-sectional view of the second exemplary structure after formation of backside trench fill structures and a contact-level dielectric layer according to the second embodiment of the present disclosure.

Referring to FIG. 26, a dielectric material such as silicon oxide can be deposited in each backside trench 79 and over the topmost insulating layer 34T. Portions of the dielectric material that are deposited in the backside trenches 79 form backside trench fill structures 76, which may consist essentially of the dielectric material. Portions of the dielectric material that is deposited over the topmost insulating layer 34 can constitute a contact-level dielectric layer 80. Each backside trench fill structure 76 can vertically extend through the multiple instances of a unit layer stack including a source layer 22, a channel-containing layer (160, 26), a drain layer 28, and an inter-transistor-isolation insulating layer 34.

Figure 27A:
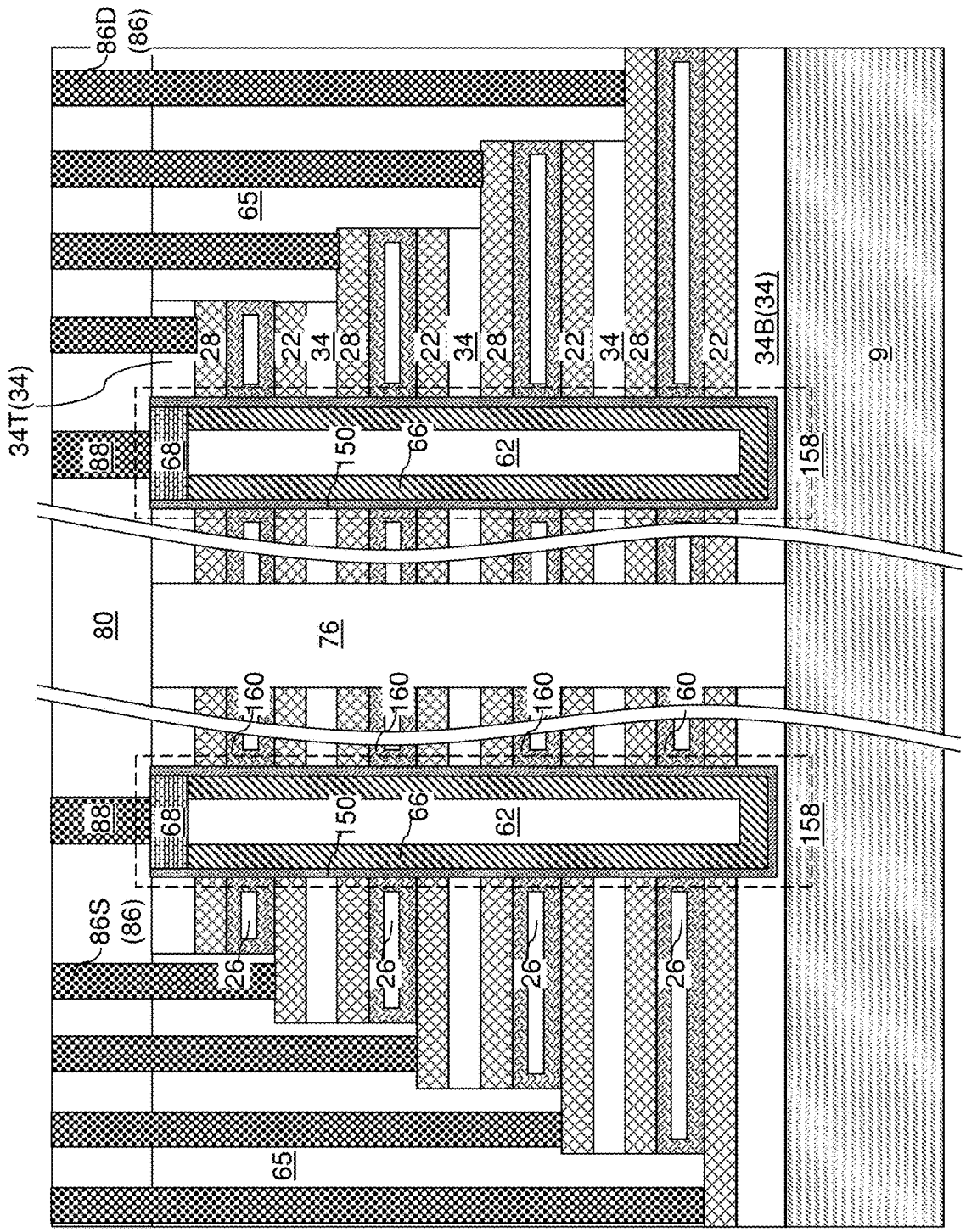
FIG. 27A is a vertical cross-sectional view of the second exemplary structure after formation of various contact via structures according to the second embodiment of the present disclosure.
Figure 27B:
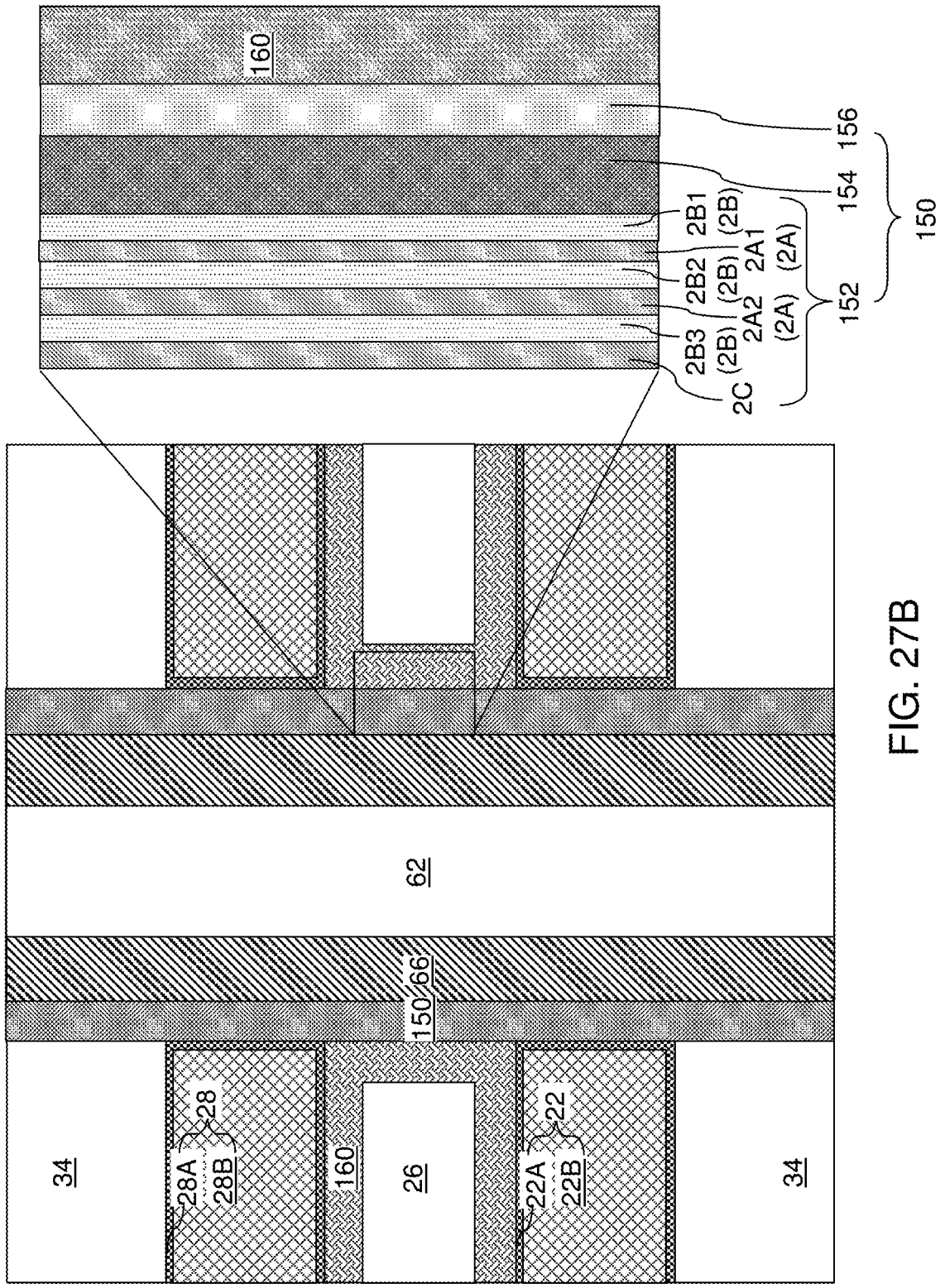
FIG. 27B is a vertical cross-sectional view of a region of the second exemplary structure of FIG. 27A around a memory opening fill structure.

Referring to FIGS. 27A and 27B, contact via structures (88, 86) can be formed through the contact-level dielectric layer 80 and optionally through a retro-stepped dielectric material portion 65. The contact via structures (88, 86) include word line contact via structures 88 each of which contacts a respective one of the contact pad structures 68 (if present, or one of the control gate electrodes 66), and is electrically connected to a respective control gate electrode 66. Word line interconnect lines can be subsequently formed over the contact-level dielectric layer 80. Each of the word line interconnect lines can be in electrical contact with a respective one of the control gate electrodes 66 through a respective contact via structure 88 and optionally through a respective contact pad structure 68.

Further, the contact via structures (88, 86) include layer contact via structures 86 that contact a respective one of the source layers 22 and the drain layers 28 within the respective staircase regions (200A, 200B). The layer contact via structures 86 include source layer contact via structures 86S and drain layer contact via structures 86D. Each source layer contact via structure 86S contacts a respective one of the source layers 22. Each drain layer contact via structure 86D contacts a respective one of the drain layers 28. Source interconnect lines (not shown) and drain interconnect lines (not shown) can be subsequently formed over the contact-level dielectric layer 80 to electrically connect each of the layer contact via structures (86S, 86D) to a respective node of a driver circuit, which includes source line drivers, bit line drivers, and a sensing circuit.

Figure 28:
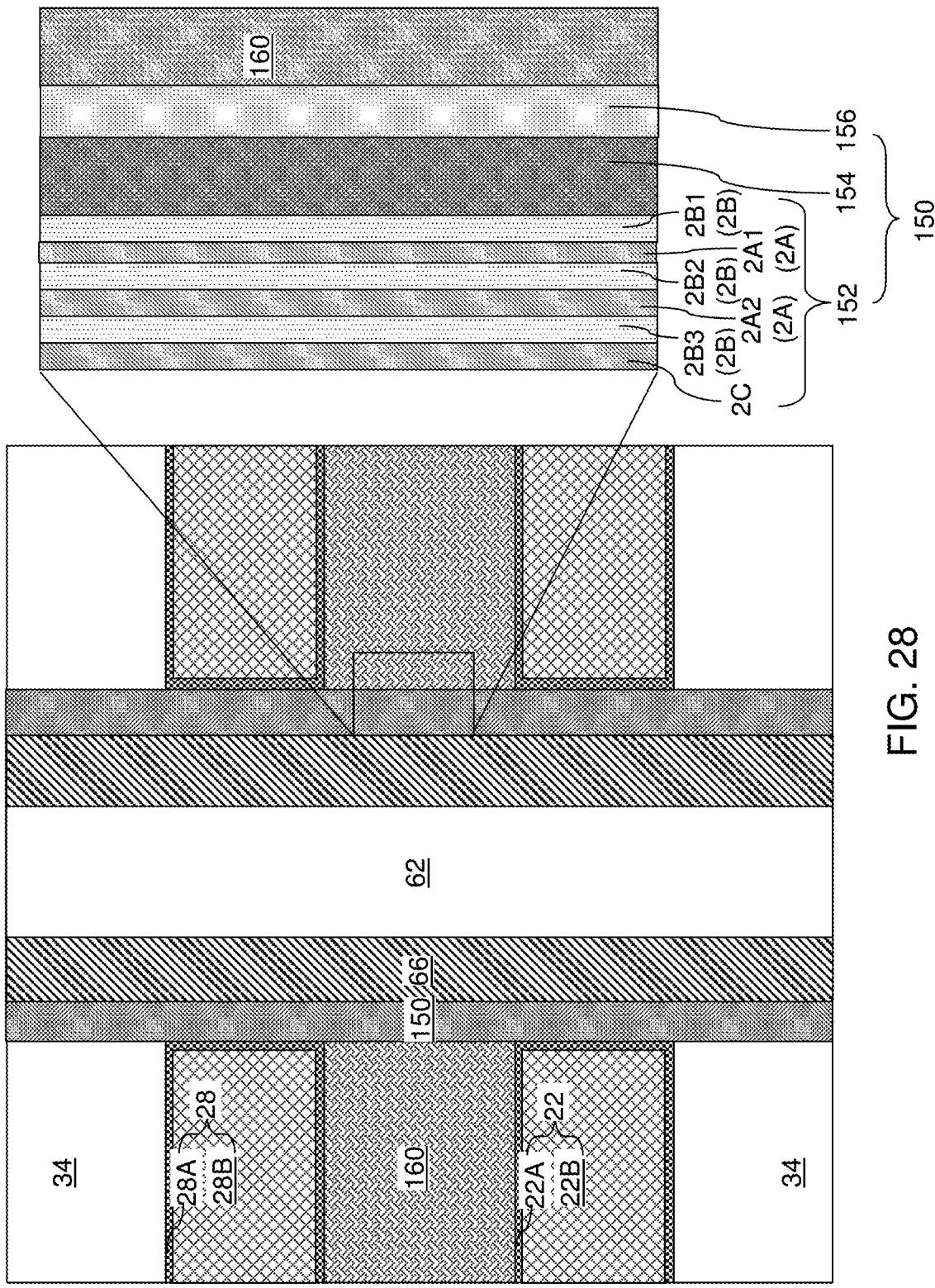
FIG. 28 is a vertical cross-sectional view of a region of a first alternative configuration of the second exemplary structure according to the second embodiment of the present disclosure.

Referring to FIG. 28, a first alternative configuration of the second exemplary structure can be derived from the second exemplary structure of FIGS. 27A and 27B by modifying a subset of processing steps. Specifically, a semiconductor channel 160 may be formed in lieu of the channel-level sacrificial layer 31 within each unit layer stack at processing steps that correspond to the processing steps of FIG. 16. Thus, each unit layer stack as initially formed may comprise a source-level sacrificial layer 42S, a semiconductor channel 160, a drain-level sacrificial layer 42D, and an insulating layer 34. Each semiconductor channel 160 may comprise the same material as the semiconductor channels 160 in the second exemplary structure of FIGS. 27A and 27B. Further, the processing steps of FIGS. 24 and 25 can be omitted. In other words, there is no need to replace the channel-level sacrificial layer 31 because each unit layer stack as originally formed includes a respective semiconductor channel 160.

Figure 29:
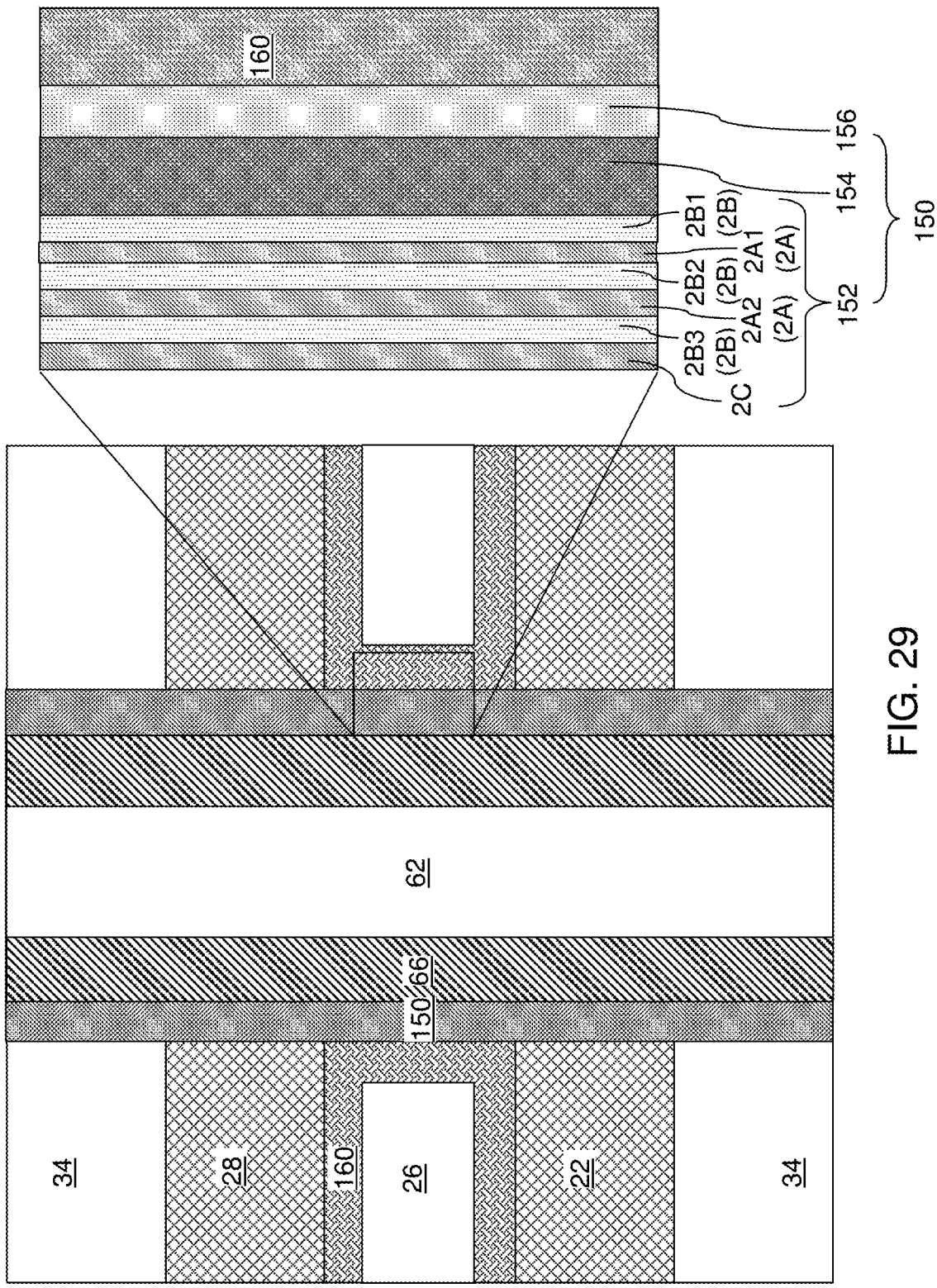
FIG. 29 is a vertical cross-sectional view of a region of a second alternative configuration of the second exemplary structure according to the second embodiment of the present disclosure.

Referring to FIG. 29, a second alternative configuration of the second exemplary structure can be derived from the second exemplary structure of FIGS. 27A and 27B by modifying a subset of processing steps. Specifically, a source layer 22 including a first conductive material can be formed in lieu of a source-level sacrificial layer 42S in each unit layer stack, and a drain layer 28 including a second conductive material can be formed in lieu of a drain-level sacrificial layer 42D in each unit layer stack. The source layer 22 and the drain layer 28 in the second alternative configuration of the second exemplary structure may include any conductive material that may be employed for the source layers 22 and the drain layers 28 in the second exemplary structure illustrated in FIGS. 27A and 27B. The source layers 22 and the drain layers 28 may comprise the same conductive material, or may comprise different conductive materials.

Figure 30:
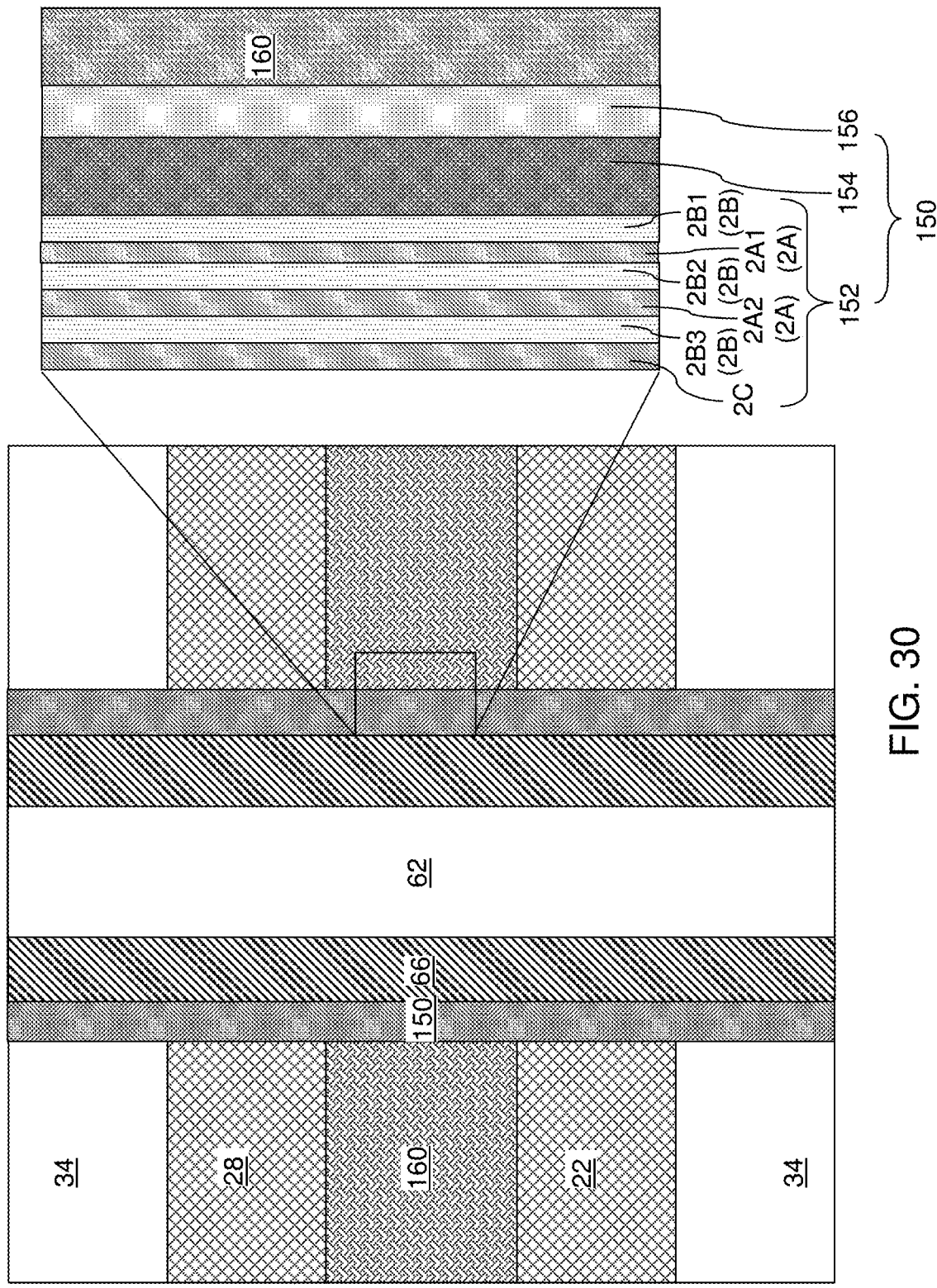
FIG. 30 is a vertical cross-sectional view of a region of a third alternative configuration of the second exemplary structure according to the second embodiment of the present disclosure.

Referring to FIG. 30, a third alternative configuration of the second exemplary structure can be derived from the second alternative configuration of the second exemplary structure by forming a semiconductor channel 160 in lieu of a channel-level sacrificial layer 31 within each unit layer stack at processing steps that correspond to the processing steps of FIG. 16. Thus, each unit layer stack as initially formed may comprise a source layer 22, a semiconductor channel 160, a drain layer 28, and an insulating layer 34. Each semiconductor channel 160 may comprise the same material as the semiconductor channels 160 in the second exemplary structure of FIGS. 27A and 27B. Further, the processing steps of FIGS. 24 and 25 can be omitted.

Figure 31:
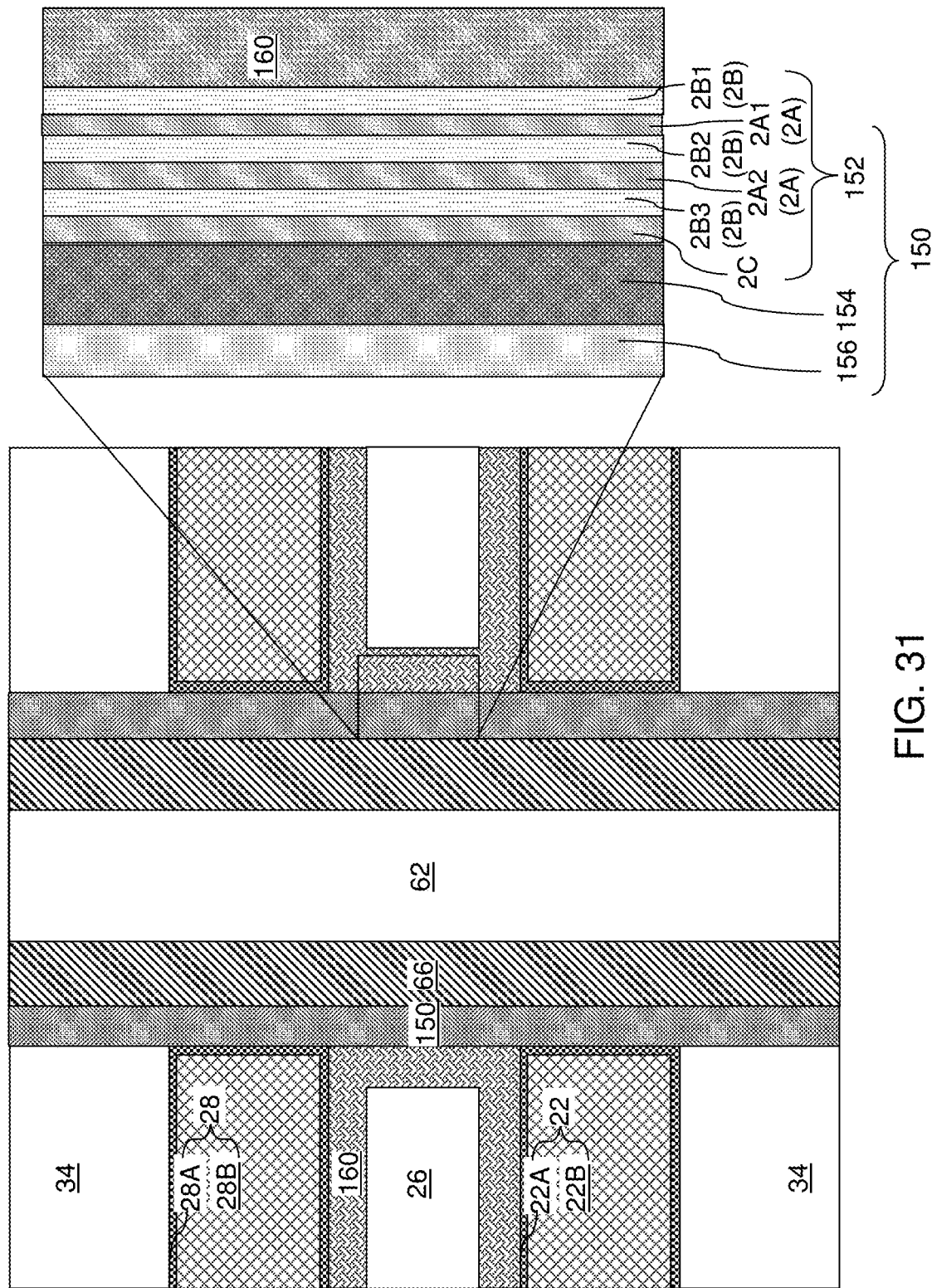
FIG. 31 is a vertical cross-sectional view of a region of a fourth alternative configuration of the second exemplary structure according to the second embodiment of the present disclosure.

Referring to FIG. 31, a fourth alternative configuration of the second exemplary structure can be derived from the second exemplary structure shown in FIG. 27B by interchanging the position of the resonant tunneling barrier stack 152 and the semiconductor barrier layer 156, similar to the configuration shown in FIG. 14D. In this structure, the resonant tunneling barrier stack 152 is located between the memory material layer 154 and the semiconductor channel 160, and the semiconductor barrier layer 156 is located between the memory material layer 154 and the select gate electrode 66.

Referring to all figures and to the first and second embodiments of the present disclosure, a three-dimensional memory device containing a plurality of levels of memory elements includes a memory film 150 containing a layer stack that includes a resonant tunneling barrier stack 152, a semiconductor barrier layer 156, and a memory material layer 154 located between the resonant tunneling barrier stack and the semiconductor barrier layer, a semiconductor channel (60, 16), and a control gate electrode (46, 66).

Referring to FIGS. 16-31 and according to the second embodiment of the present disclosure, the three-dimensional memory device comprises at least one instance of a unit layer stack (22, 160, 26, 28, 34) including a source layer 22, a channel-containing layer {(160, 26) or 160} that contains the semiconductor channel 160, and a drain layer 28 that are stacked along a vertical direction over a substrate 9, a memory opening 49 vertically extending through the at least one instance of the unit layer stack (22, 160, 26, 28, 34), and a memory opening fill structure 158 located in the memory opening 49 and comprising the memory film 150 and the control gate electrode 66 in contact with an inner sidewall of the memory film 150.

In one embodiment, the resonant tunneling barrier stack 152 comprises at least two semiconductor quantum wells. In one embodiment, the at least two semiconductor quantum wells comprise a first quantum well (2B1, 2A1, 2B2) and a second quantum well (2B2, 2A2, 2B3) located between the first quantum well (2B1, 2A1, 2B2) and the control gate electrode 66. In one embodiment, the first quantum well (2B1, 2A1, 2B2) comprises a first semiconductor well layer 2A1 located between a first barrier layer 2B1 and a second barrier layer 2B2; and the second quantum well (2B2, 2A2, 2B3) comprises a second semiconductor well layer 2A2 located between the second barrier layer 2B2 and a third barrier layer 2B3.

In one embodiment, the first semiconductor well layer 2A1 is thinner than the second semiconductor well layer 2A2. In one embodiment, the first semiconductor well layer 2A1 and the second semiconductor well layer 2A2 have a narrower bandgap than the first, second, and third barrier layers (2B1, 2B2, 2B3). In one embodiment, the first semiconductor well layer 2A1 and the second semiconductor well layer 2A2 comprise, and/or consist essentially of, indium arsenide, and the first, second, and third barrier layers (2B1, 2B2, 2B3) comprise, and/or consist essentially of, aluminum antimonide.

In one embodiment, the memory material layer 154 comprises a dielectric charge storage material; the semiconductor channel 160 comprises a first compound semiconductor material; and the semiconductor barrier layer 156 comprises a second compound semiconductor material having a wider bandgap than the first compound semiconductor material. In one embodiment, the memory material layer 154 comprises a silicon nitride layer and the semiconductor channel 160 comprises an indium arsenide layer. In one embodiment, the semiconductor barrier layer 156 comprises an aluminum antimonide layer which is thicker than the resonant tunneling barrier stack 152.

In some embodiments shown in FIGS. 27B to 30, the semiconductor barrier layer 156 is located between the memory material layer 154 and the semiconductor channel 160; and the resonant tunneling barrier stack 152 is located between the memory material layer 154 and the control gate electrode 66. In this embodiment, the semiconductor barrier layer 156 is surrounded by the semiconductor channel 160; the memory material layer 154 is surrounded by the semiconductor barrier layer 156; and the resonant tunneling barrier stack 152 is surrounded by the memory material layer 154.

In the alternative embodiment shown in FIG. 31, the resonant tunneling barrier stack 152 is located between the memory material layer 154 and the semiconductor channel 160, and the semiconductor barrier layer 156 is located between the memory material layer 154 and the control gate electrode 66. In one embodiment, the semiconductor barrier layer 156 surrounds the control gate electrode 66; the memory material layer 154 surrounds the semiconductor barrier layer 156; and the resonant tunneling barrier stack 152 surrounds the memory material layer 154.

The various configurations of the second exemplary structure may be employed to provide a three-dimensional memory array including a vertical stack of multiple two-dimensional NOR memory devices. The resonant tunneling barrier stack 152 permits low power programming and erase operations.

Figure 32A:
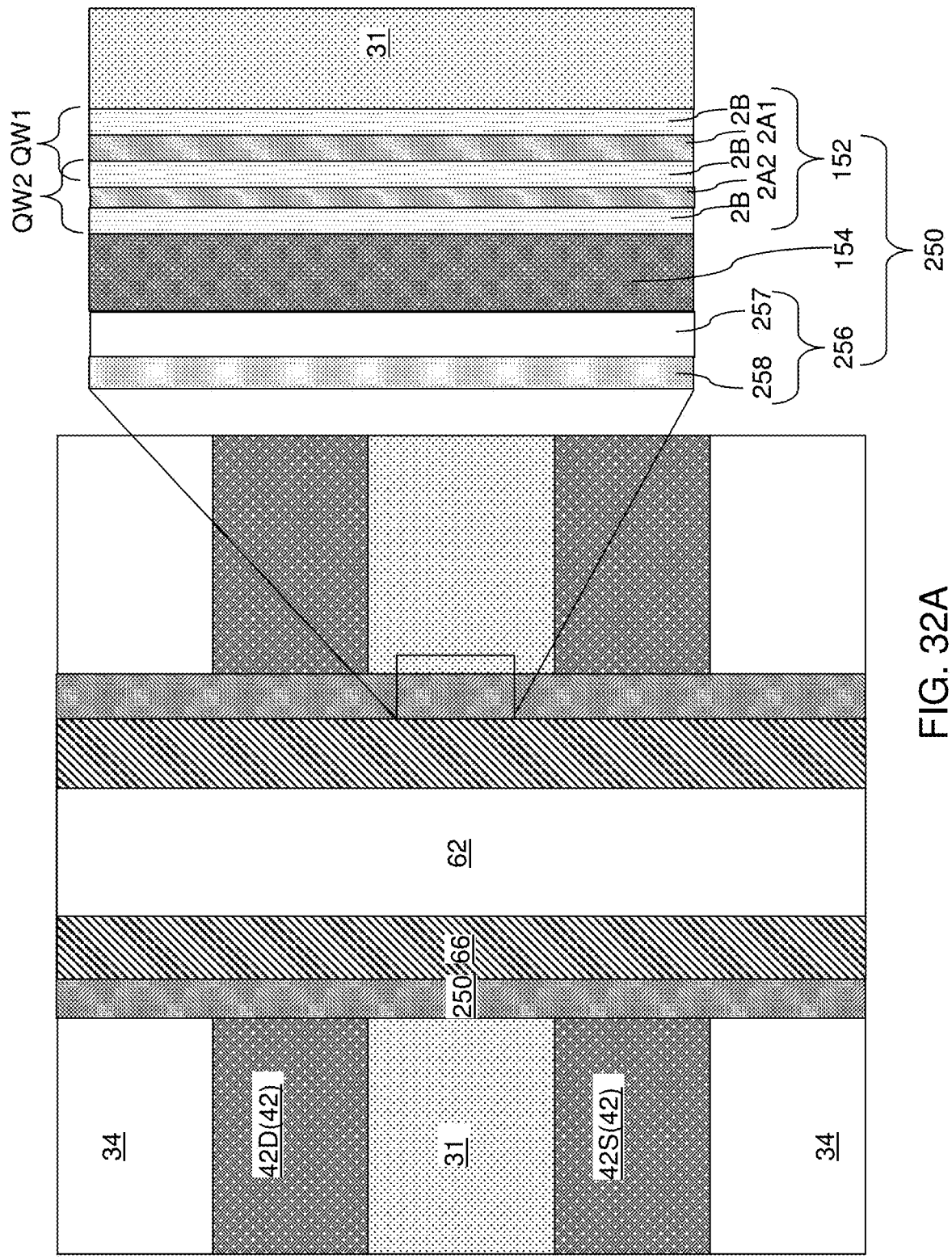
FIG. 32A is a vertical cross-sectional view of a region of a first configuration of a third exemplary structure after formation of a memory opening fill structure according to a third embodiment of the present disclosure.
Figure 32B:
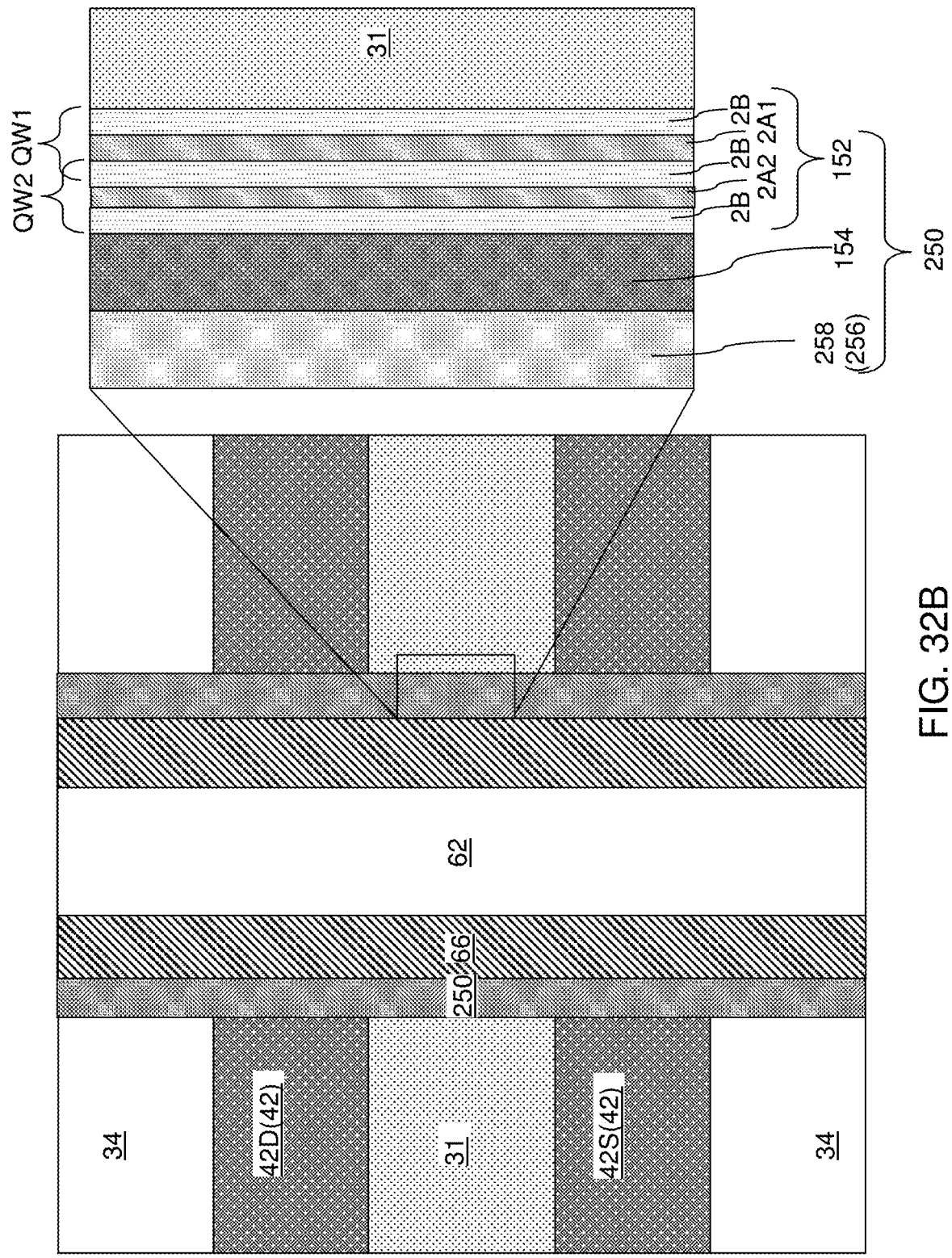
FIG. 32B is a vertical cross-sectional view of a region of a second configuration of a third exemplary structure after formation of a memory opening fill structure according to the third embodiment of the present disclosure.

FIGS. 32A and 32B are vertical cross-sectional view of a region of a third exemplary structure after formation of a memory opening fill structure according to a third embodiment of the present disclosure. FIG. 32A illustrates a first configuration of the third exemplary structure, and FIG. 32B illustrates a second configuration of the third exemplary structure.

Referring collectively to FIGS. 32A and 32B, the various configurations of the third exemplary structure can be derived from the second exemplary structure illustrated in FIGS. 18A-18C by forming a memory film 250, a control gate electrode 66, and a dielectric core 62. In the third embodiment, the semiconductor barrier layer 156 is replaced with a dielectric blocking barrier layer 256. Thus, in the third exemplary structure of the third embodiment, the memory film 250 includes the dielectric blocking barrier layer 256, the above described memory material layer 154, and the above described resonant tunneling barrier stack 152.

Generally at least one instance of a unit layer stack (42S, 31, 42D, 34) including a source-level material layer (which may be a source-level sacrificial layer 42S or a source layer 22 as described above), a channel-level material layer (which may be a channel-level sacrificial layer 31 or may comprise a semiconductor channel 160), and a drain-level material layer (which may be drain-level sacrificial layer 42D or a drain layer 28) can be formed over a substrate (9, 10). The unit layer stack (42S, 31, 42D, 34) may be the same as any of the unit layer stacks described above. The source-level material layer and the drain-level material layer are formed as, or are subsequently replaced with, an electrically conductive source layer 22 and an electrically conductive drain layer 28, respectively. The channel-level material layer comprises a semiconductor channel 160 or is replaced with the semiconductor channel 160. A memory opening 49 can be formed through the at least one instance of the unit layer stack (42S, 31, 42D, 34).

A memory film 250 can be formed on the physically exposed surfaces of the memory openings 49 and over the topmost insulating layer 34 by a series of conformal deposition processes. The memory film 250 includes the resonant tunneling barrier stack 152, the memory material layer 154, and the dielectric blocking barrier layer 256.

The resonant tunneling barrier stack 152 can be formed directly on a sidewall of each memory opening 49. The resonant tunneling barrier stack 152 comprises at least two semiconductor quantum wells (QW1, QW2). In one embodiment, the resonant tunneling barrier stack 152 may comprise a layer stack that includes, from outside to inside and in the order of deposition, a first barrier layer 2B, a first semiconductor well layer 2A1, a second barrier layer 2B, a second semiconductor well layer 2A2, and a third barrier layer 2B. In one embodiment, the least two semiconductor quantum wells (QW1, QW2) comprise a first quantum well QW1 and a second quantum well QW2 that is formed after formation of the first quantum well QW1. In one embodiment, the first quantum well QW1 comprises the first semiconductor well layer 2A1 located between a first barrier layer 2B and a second barrier layer 2B. In one embodiment, the second quantum well QW2 comprises the second semiconductor well layer 2A2 located between the second barrier layer 2B and a third barrier layer 2B. The first semiconductor well layer 2A1 is thinner than the second semiconductor well layer 2A2.

The semiconductor well layers (2A1, 2A2) comprise a semiconductor material having a relatively narrow first bandgap, and the barrier layers 2B comprise a semiconductor material having a relatively wide second bandgap which is wider than the first bandgap. For example, the semiconductor well layers (2A1, 2A2) and the barrier layers 2B of the semiconductor quantum wells (QW1, QW2) comprise compound semiconductor layers, such as Group III-V semiconductor layers. In one embodiment, the semiconductor well layers (2A1, 2A2) may have a direct bandgap less than 1 eV, such as less than 0.5 eV, for example, 0.3 eV to 0.45 eV. For example, the semiconductor well layers (2A1, 2A2) may comprise indium arsenide, which has a direct bandgap of about 0.36 eV. In one embodiment, the barrier layers 2B may have a direct bandgap greater than 1.5 eV, such as than greater than 2 eV, for example, 2.1 eV to 2.3 eV. For example, the barrier layers 2B may comprise aluminum antimonide, which has a direct bandgap of about 2.22 eV. Other semiconductor layers may be used instead of InAs and/or AlSb. In one embodiment, resonant tunneling barrier stack 152 includes two semiconductor quantum wells comprising three wide bandgap semiconductor barrier layers 2B interlaced with two narrow bandgap semiconductor well layers (2A, 2B).

Each of the barrier layers 2B may have a thickness in a range from 1 nm to 3 nm, such as from 1.2 nm to 2 nm, although lesser and greater thicknesses may also be employed. Each of the semiconductor well layers (2A1, 2A2) may have a thickness in a range from 1 nm to 4 nm, such as from 2 nm to 3 nm, although lesser and greater thicknesses may also be employed. In a non-limiting illustrative example, a resonant tunneling barrier stack 152 may comprise, from outside to inside (which corresponds to the order of deposition), a first semiconductor barrier layer 2B composed of AlSb and having a thickness of about 1.8 nm, a first semiconductor well layer 2A1 composed of InAs and having a thickness of about 2.4 nm, a second semiconductor barrier layer 2B composed of AlSb and having a thickness of about 1.2 nm, a second semiconductor well layer 2A2 composed of InAs and having a thickness of about 3.0 nm, and a third semiconductor barrier layer 2B composed of AlSb and having a thickness of about 3.0 nm.

The memory material layer 154 can be deposited as a continuous material layer by a conformal deposition process such as a chemical vapor deposition process or an atomic layer deposition process. The memory material layer 154 includes a memory material, i.e., a material that can store data by selecting a state of the material. For example, the memory material layer 154 may include a charge storage material such as silicon nitride, polysilicon, or a metallic material. The memory material layer 154 can be formed as a single memory material layer of homogeneous composition, or can include a stack of multiple memory material layers. In one embodiment, the memory material layer 154 may comprise a dielectric charge storage material, i.e., an insulating charge trapping material, such as one or more silicon nitride segments. The memory material layer 154 can be formed, for example, by chemical vapor deposition (CVD), atomic layer deposition (ALD), physical vapor deposition (PVD), or any suitable deposition technique for storing electrical charge therein. The thickness of the memory material layer 154 can be in a range from 2 nm to 20 nm, although lesser and greater thicknesses can also be employed. In one embodiment, the memory material layer 154 may comprise a charge storage layer consisting essentially of silicon nitride and having a thickness in a range from 4 nm to 6 nm, although lesser and greater thicknesses may also be employed.

The dielectric blocking barrier layer 256 can include at least one dielectric material. In one embodiment, the at least one dielectric material has a sufficiently high band gap and a sufficient thickness to prevent tunneling of electrical charge carriers (such as electrons or holes). In the first configuration illustrated in FIG. 32A, the dielectric blocking barrier layer 256 may comprise a layer stack including a silicon oxide layer 257 and a dielectric metal oxide layer 258. The silicon oxide layer 257 comprises, and/or consists of, a silicon oxide material, such as undoped silicate glass. The silicon oxide layer 257 can be deposited on the dielectric metal oxide layer 258 by a conformal deposition process such as a chemical vapor deposition or an atomic layer deposition process. The thickness of the silicon oxide layer 257 may be in a range from 2 nm to 8 nm, such as from 3 nm to 5 nm, although lesser and greater thicknesses may also be employed. The dielectric metal oxide layer 258 comprises a dielectric metal oxide material such as aluminum oxide, titanium oxide, tantalum oxide, yttrium oxide, lanthanum oxide, or any other dielectric oxide of at least one transition metal having a dielectric constant greater than 7.9 (which is the dielectric constant of silicon nitride). The dielectric metal oxide layer 258 can be deposited directly on sidewalls of each memory opening 49 by a conformal deposition process such as a chemical vapor deposition process and/or an atomic layer deposition process. The thickness of the dielectric metal oxide layer 258 may be in a range from 1.5 nm to 6 nm, such as from 2 nm to 3 nm, although lesser and greater thicknesses may also be employed.

In the second configuration illustrated in FIG. 32B, the dielectric blocking barrier layer 256 may consist of the dielectric metal oxide layer 258. The dielectric metal oxide layer 258 comprises a dielectric metal oxide material such as aluminum oxide, titanium oxide, tantalum oxide, yttrium oxide, lanthanum oxide, or any other dielectric oxide of at least one transition metal having a dielectric constant greater than 7.9 (which is the dielectric constant of silicon nitride). The dielectric metal oxide layer 258 can be deposited directly on sidewalls of each memory opening 49 by a conformal deposition process such as a chemical vapor deposition process or an atomic layer deposition process. The thickness of the dielectric metal oxide layer 258 may be in a range from 4 nm to 12 nm, such as from 5 nm to 8 nm, although lesser and greater thicknesses may also be employed.

Generally, the dielectric blocking barrier layer 256 has a greater band gap than a component layer within the resonant tunneling barrier stack 152. For example, the dielectric blocking barrier layer 256 can have a greater band gap than the semiconductor well layers (2A1, 2A2) within the resonant tunneling barrier stack 152. In one embodiment, the dielectric blocking barrier layer 256 may have a greater band gap than each component layer within the resonant tunneling barrier stack 152. For example, the dielectric blocking barrier layer 256 can have a greater band gap than the semiconductor well layers (2A1, 2A2) and the semiconductor barrier layers 2B. Upon subsequent formation of the control gate electrode 66, the dielectric blocking barrier layer 256 is formed between the memory material layer 154 and the control gate electrode 66.

In one embodiment, the dielectric blocking barrier layer 256 comprises at least one dielectric oxide material. In one embodiment, the dielectric blocking barrier layer 256 comprises a silicon oxide layer 257 in contact with the dielectric metal oxide layer 258. In one embodiment, the dielectric blocking barrier layer 256 consists of only the dielectric metal oxide layer 258. In one embodiment, the dielectric metal oxide layer 258 contacts the memory material layer 154, and is laterally spaced from the resonant tunneling barrier stack 152 by the memory material layer 154.

At least one conductive material can be conformally deposited on the physically exposed surfaces of the memory film 250 in each memory opening 49. The at least one conductive material can be deposited directly on an inner cylindrical sidewall of the dielectric blocking barrier layer 256 in each memory opening 49. The at least one conductive material may comprise at least one metallic material or a heavily-doped semiconductor material. For example, the at least one conductive material may comprise a conductive metallic nitride material (such as TiN, TaN, WN, or MoN), an elemental metal (such as Ti, Ta, W, Mo, Co, Ru, etc.), an intermetallic alloy, or a metal-semiconductor alloy material (such as a metal silicide material).

A dielectric fill material such as silicon oxide can be deposited in remaining volumes of the memory openings 49. Portions of the dielectric fill material, the at least one conductive material, and the memory film 250 that are formed above the horizontal plane including the top surface of the topmost insulating layer 34 can be removed by a planarization process, which may employ a chemical mechanical polishing (CMP) process and/or a recess etch process. Each remaining portion of the dielectric fill material constitutes a dielectric core 62. Each remaining portion of the at least one conductive material constitutes a control gate electrode 66, which is employed to inject electrical charge carriers (e.g., electrons or holes) into and/or to extract electrical charge carriers from the memory material layer 154 through the resonant tunneling barrier stack 152. Thus, each memory opening can be filled with a memory opening fill structure (250, 66, 62) that includes a memory film 250, a control gate electrode 66, and a dielectric core 62.

Generally, a memory film 250 can be formed in each memory opening 49. The memory film 250 comprises a layer stack that includes a resonant tunneling barrier stack 152, the dielectric blocking barrier layer 256, and a memory material layer 154 located between the resonant tunneling barrier stack 152 and the dielectric blocking barrier layer 256. The resonant tunneling barrier stack 152 can be formed directly on a sidewall of the memory opening 49. The control gate electrode 66 can be formed on an inner sidewall of the memory film 250. Specifically, the control gate electrode 66 can be formed directly on the dielectric blocking barrier layer 256. The dielectric blocking barrier layer 256 is surrounded by the memory material layer 154, and the memory material layer 154 is surrounded by the resonant tunneling barrier stack 152.

Figure 33A:
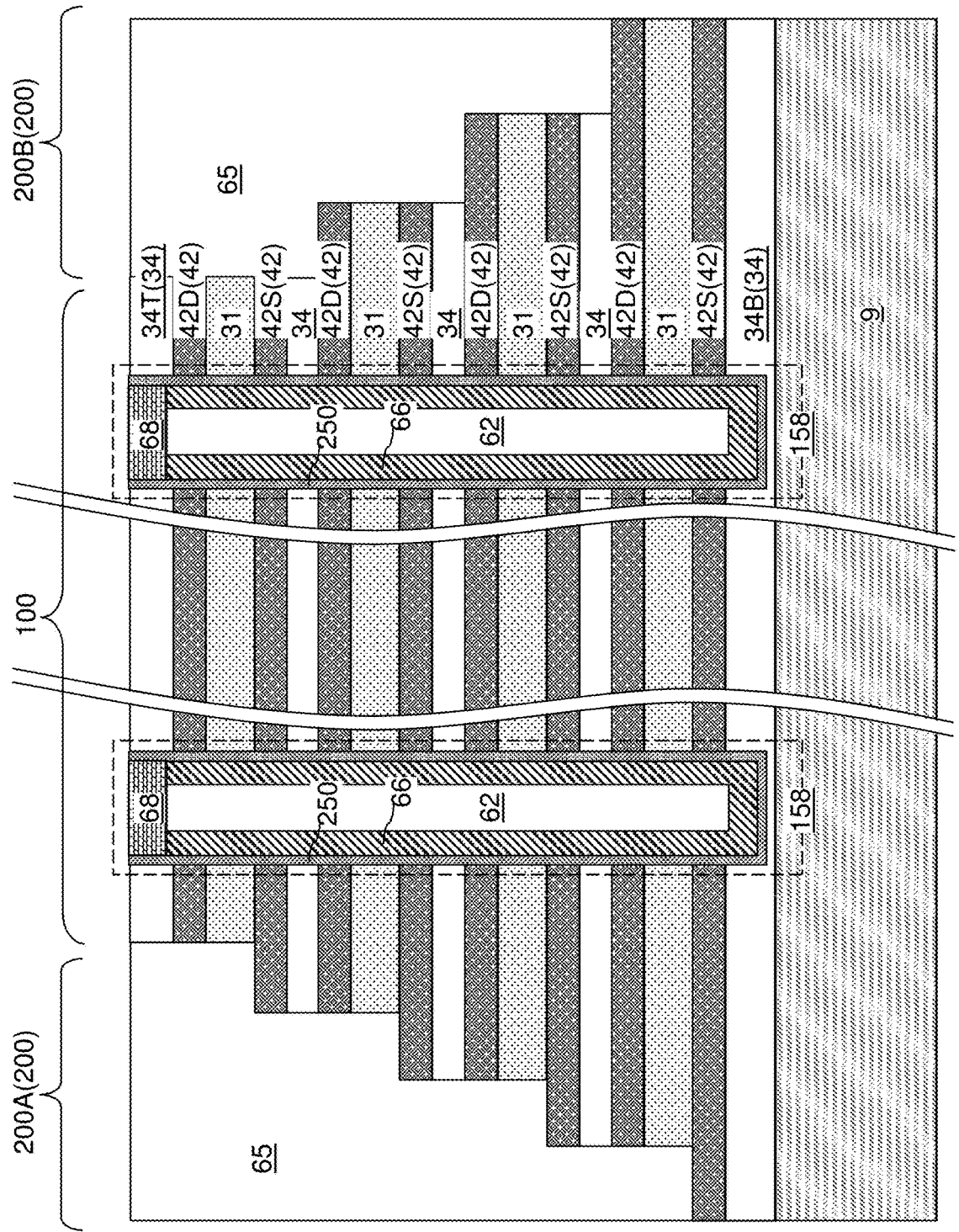
FIG. 33A is a vertical cross-sectional view of the third exemplary structure after formation of a contact pad structure at an upper portion of each memory opening according to the third embodiment of the present disclosure.

Referring to FIGS. 33A and 33B, top portions of the dielectric cores 62 and optionally top portions of the control gate electrodes 66 can be vertically recessed to form cavity regions. A conductive material, such as a metallic material can be deposited in the cavity regions. Excess portions of the conductive material can be removed from above the horizontal plane including the top surface of the topmost insulating layer 34T. Each remaining portion of the conductive material constitutes a contact pad structure 68. In one embodiment, the contact pad structures 68 can include a layer stack of a metallic nitride liner (TaN, TiN, or WN) and a conductive fill material such as a metallic material (such as W, Ru, Co, or Mo), a doped semiconductor material, and/or a metal silicide material. Each contact pad structure 68 contacts a top end of a respective control gate electrode 66. Optionally, the contact pad structure 68 may be omitted. The set of all material portions filling a memory opening 49 constitutes a memory opening fill structure 158. In one embodiment, each memory opening fill structure 158 may comprise a memory film 250, a control gate electrode 66, an optional dielectric core 62, and an optional contact pad structure 68.

Figure 34A:
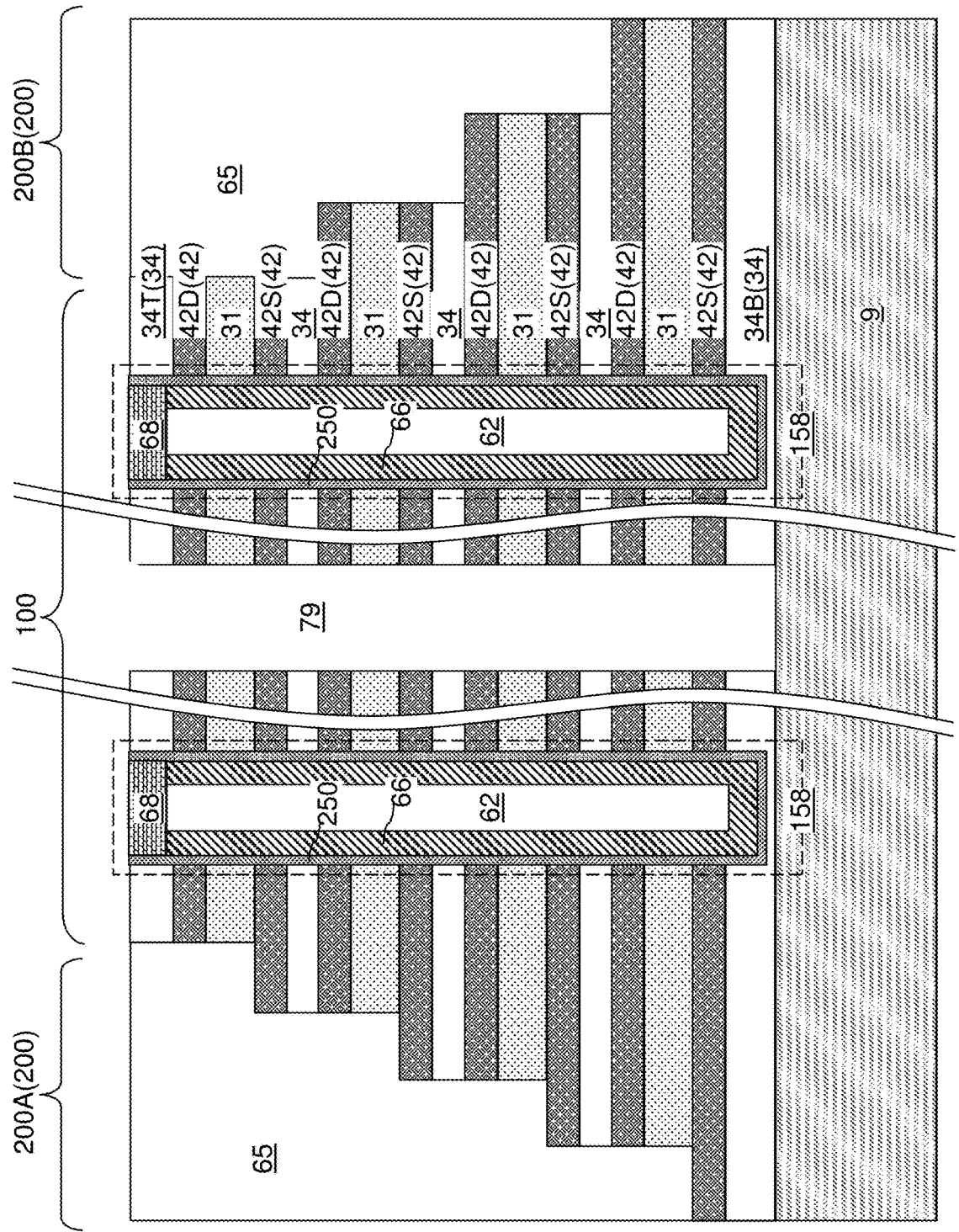
FIG. 34A is a vertical cross-sectional view of the third exemplary structure after formation of backside trenches according to the third embodiment of the present disclosure.

Referring to FIGS. 34A and 34B, a photoresist layer (not shown) can be applied over the topmost insulating layer 34T, and can be lithographically patterned to form openings in areas between clusters of memory opening fill structures 158 and support pillar structures (if present). The pattern in the photoresist layer can be transferred through the topmost insulating layer 34 and the multiple instances of the unit layer stack (42S, 31, 42D, 34) employing an anisotropic etch to form backside trenches 79, which can vertically extend from the top surface of the topmost insulating layer 34 to the top surface of the substrate 9, and can laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 158 can be arranged in rows that extend along the first horizontal direction hd1. Each backside trench 79 can have a uniform width that is invariant along the lengthwise direction (i.e., along the first horizontal direction hd1). Multiple rows of memory opening fill structures 158 can be located between a neighboring pair of backside trenches 79. The photoresist layer can be removed, for example, by ashing.

Figure 35:
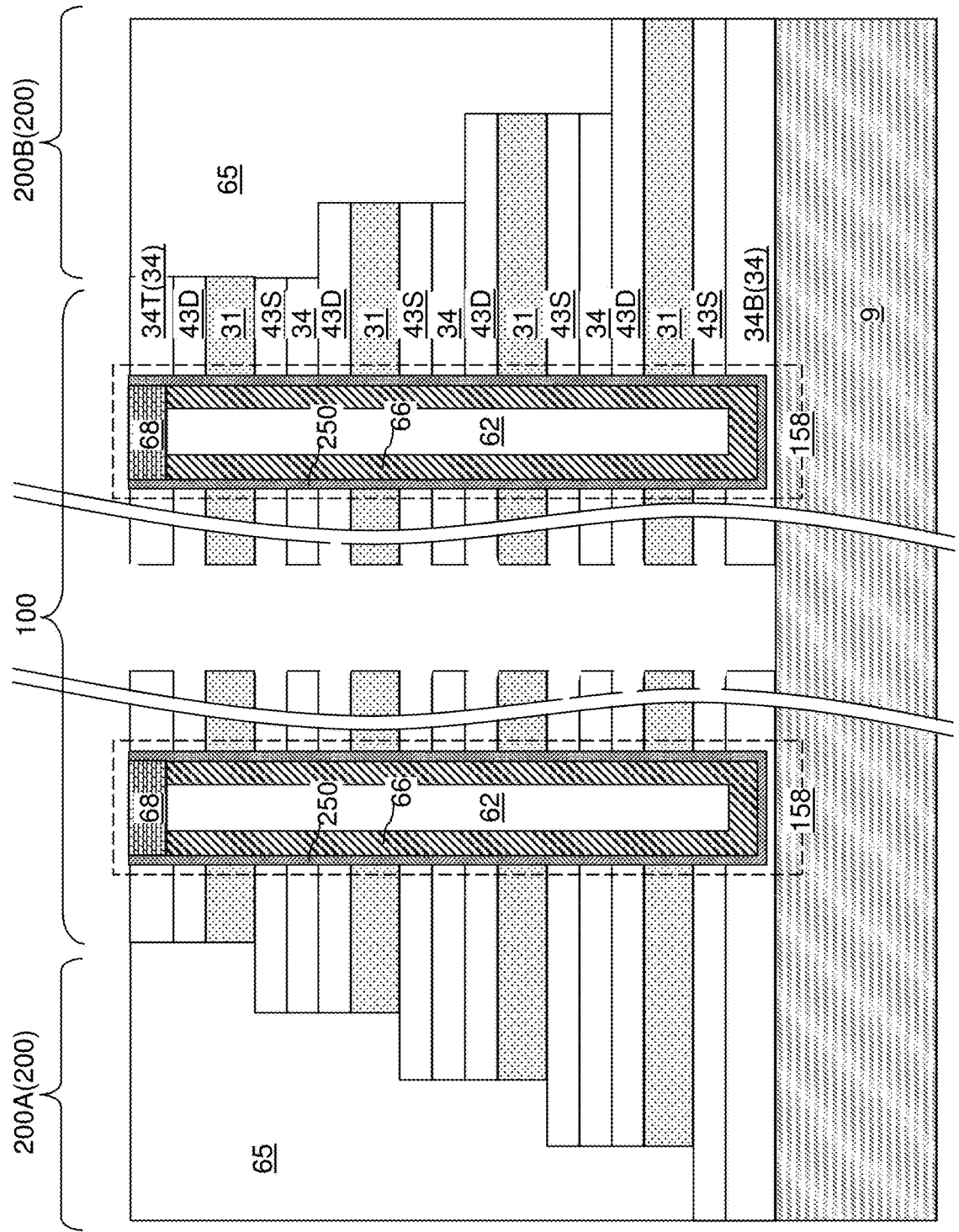
FIG. 35 is a vertical cross-sectional view of the third exemplary structure after formation of source-level backside recesses and drain-level backside recesses according to the third embodiment of the present disclosure.

Referring to FIG. 35, an etchant that selectively etches the materials of the source-level sacrificial layers 42S and drain-level sacrificial layers 42D with respect to the materials of the insulating layers 34, the channel-level sacrificial layers 31, the retro-stepped dielectric material portions 65, and the resonant tunneling barrier stacks 152 can be introduced into the backside trenches 79. Source-level backside recesses 43S and drain-level backside recesses 43D are formed in volumes from which the source-level sacrificial layers 42S and drain-level sacrificial layers 42D are removed by the selective etching, respectively. In one embodiment, the source-level sacrificial layers 42S and drain-level sacrificial layers 42D can include silicon nitride, and the materials of the insulating layers 34 and the retro-stepped dielectric material portion 65 can include silicon oxide.

The etch process can be a wet etch process employing a wet etch solution, or can be a gas phase (dry) etch process in which the etchant is introduced in a vapor phase into the backside trenches 79. For example, if the source-level sacrificial layers 42S and the drain-level sacrificial layers 42D include silicon nitride, then the etch process can be a wet etch process in which the exemplary structure is immersed within a wet etch tank including phosphoric acid, which etches silicon nitride selective to silicon oxide, silicon, and various other materials.

Each backside recess (43S, 43D) can be a laterally extending cavity having a lateral dimension that is greater than the vertical extent of the cavity. In other words, the lateral dimension of each backside recess (43S, 43D) can be greater than the height of the backside recess (43S, 43D). A plurality of source-level backside recesses 43S and the drain-level backside recesses 43D can be formed in the volumes from which the materials of the source-level sacrificial layers 42S and drain-level sacrificial layers 42D are removed. The memory openings 49 in which the memory opening fill structures 158 are formed are herein referred to as front side openings or front side cavities in contrast with the source-level backside recesses 43S and the drain-level backside recesses 43D. Each of the plurality of source-level backside recesses 43S and the drain-level backside recesses 43D can extend substantially parallel to the top surface of the substrate 9. In one embodiment, each backside recess (43S, 43D) can have a uniform height throughout.

Figure 36:
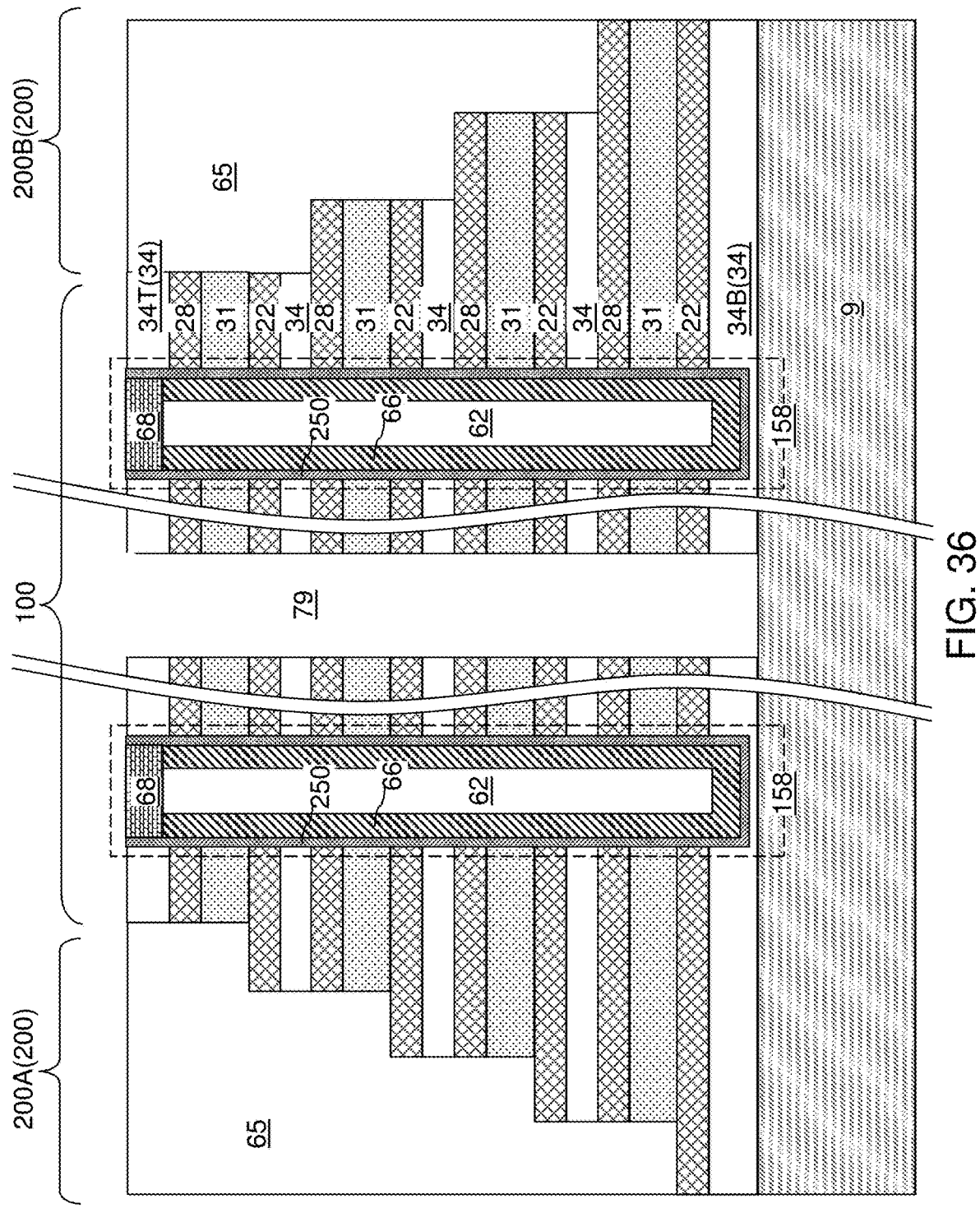
FIG. 36 is a vertical cross-sectional view of the third exemplary structure after formation of source layers and drain layers according to the third embodiment of the present disclosure.

Referring to FIG. 36, at least one electrically conductive material can be deposited in the source-level backside recesses 43S and the drain-level backside recesses 43D through the backside trenches 79. The at least one electrically conductive material can include a metallic nitride material (such as TaN, TiN, or WN) that forms a metallic liner and a metallic fill material (such as W, Co, Ru, or Mo) that fills remaining volumes of the source-level backside recesses 43S and the drain-level backside recesses 43D that are not filled by the metallic liner. Alternatively or additionally, the at least one electrically conductive material may comprise a heavily doped semiconductor material. In case a heavily doped semiconductor material is deposited directly on the horizontal surfaces of the channel-level sacrificial layers 31, or in case semiconductor channels having a doping a first conductivity type are present in lieu of the channel-level sacrificial layers 31, the heavily doped semiconductor material has a doping of a second conductivity type that is the opposite of the first conductivity type.

The at least one electrically conductive material fills all volumes of the source-level backside recesses 43S and the drain-level backside recesses 43D. Portions of the at least one electrically conductive material deposited at peripheral portions of the backside trenches 79 or above the topmost insulating layer 34 can be removed by an etch process, which may include an isotropic etch process and/or an anisotropic etch process. Remaining portions of the at least one electrically conductive material that fills the source-level backside recesses 43S constitute source layers 22, each of which functions as the source electrode of a respective set of NOR transistors. Remaining portions of the at least one electrically conductive material that fills the drain-level backside recesses 43D constitute drain layers 28, each of which functions as the drain electrode of the respective set of NOR transistors. Generally, the source-level sacrificial layer 42S and the drain-level sacrificial layers 42D are replaced with the source layers 22 and the drain layers 28 (i.e., source lines and bit lines), respectively.

Figure 37:
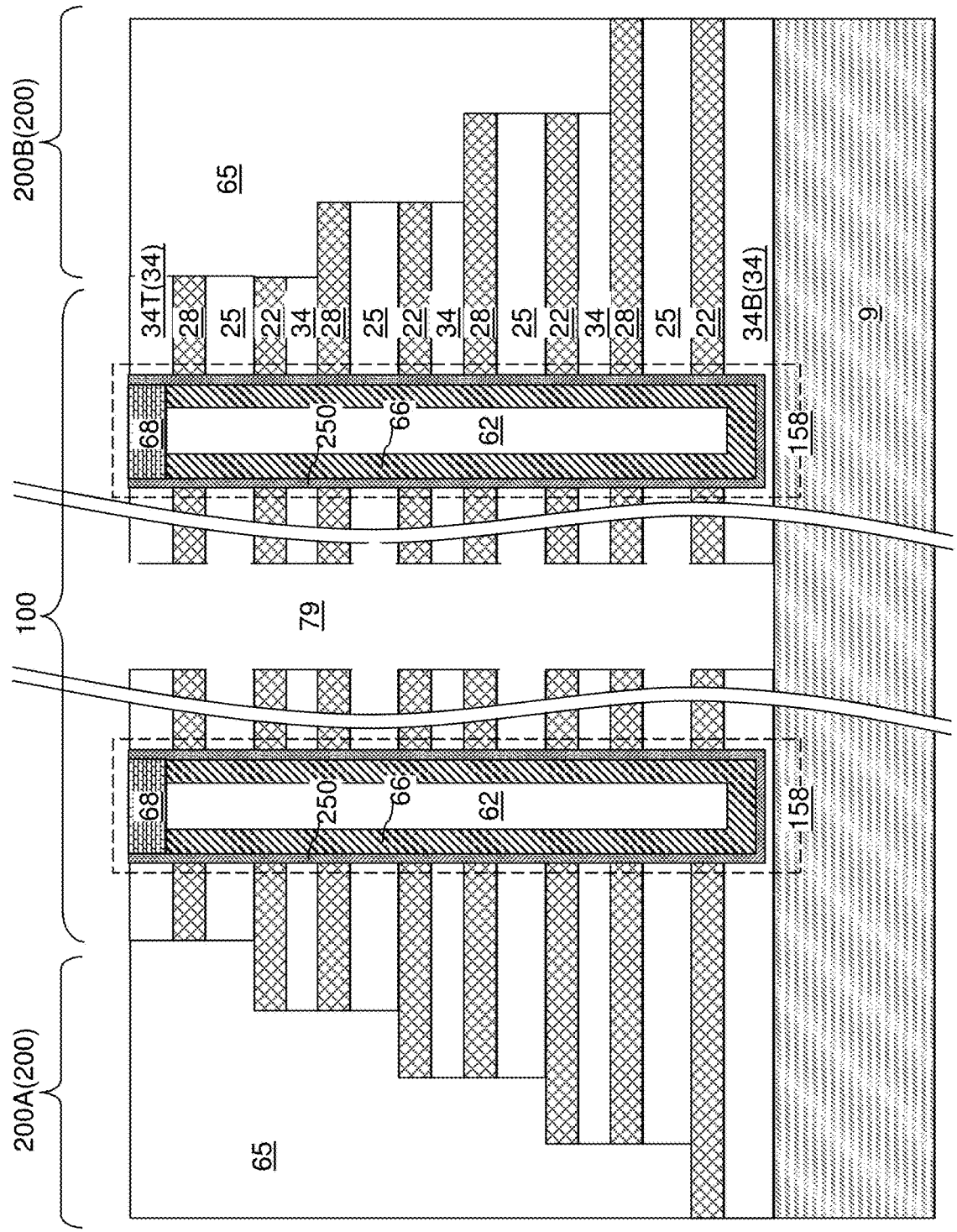
FIG. 37 is a vertical cross-sectional view of the third exemplary structure after formation of channel-level backside recesses according to the third embodiment of the present disclosure.

Referring to FIG. 37, an etchant that selectively etches the materials of the channel-level sacrificial layers 31 with respect to the materials of the insulating layers 34, the retro-stepped dielectric material portions 65, the source layers 22, and the drain layers 28 can be introduced into the backside trenches 79, for example, employing an etch process. Channel-level backside recesses 25 are formed in volumes from which the channel-level sacrificial layers 31 are removed. In one embodiment, the channel-level sacrificial layer 31 can include borosilicate glass or organosilicate glass, and the materials of the insulating layers 34 and the retro-stepped dielectric material portion 65 can include undoped silicate glass having an etch rate in 100:1 dilute hydrofluoric acid that is less than 1%, and/or less than 0.1%, of the etch rate of borosilicate glass or organosilicate glass.

The etch process can be a wet etch process employing a wet etch solution, or can be a gas phase (dry) etch process in which the etchant is introduced in a vapor phase into the backside trenches 79. For example, if the channel-level sacrificial layers 31 include borosilicate glass or organosilicate glass, the etch process can be a wet etch process employing 100:1 dilute hydrofluoric acid or 1,000:1 dilute hydrofluoric acid.

Each channel-level backside recess 25 can be a laterally extending cavity having a lateral dimension that is greater than the vertical extent of the cavity. In other words, the lateral dimension of each channel-level backside recess 25 can be greater than the height of the respective channel-level backside recess 25. A plurality of channel-level backside recesses 25 can be formed in the volumes from which the material of the channel-level sacrificial layers 25 is removed. Each of the plurality of channel-level backside recesses 25 can extend substantially parallel to the top surface of the substrate 9. In one embodiment, each channel-level backside recess 25 can have a uniform height throughout.

Figure 38:
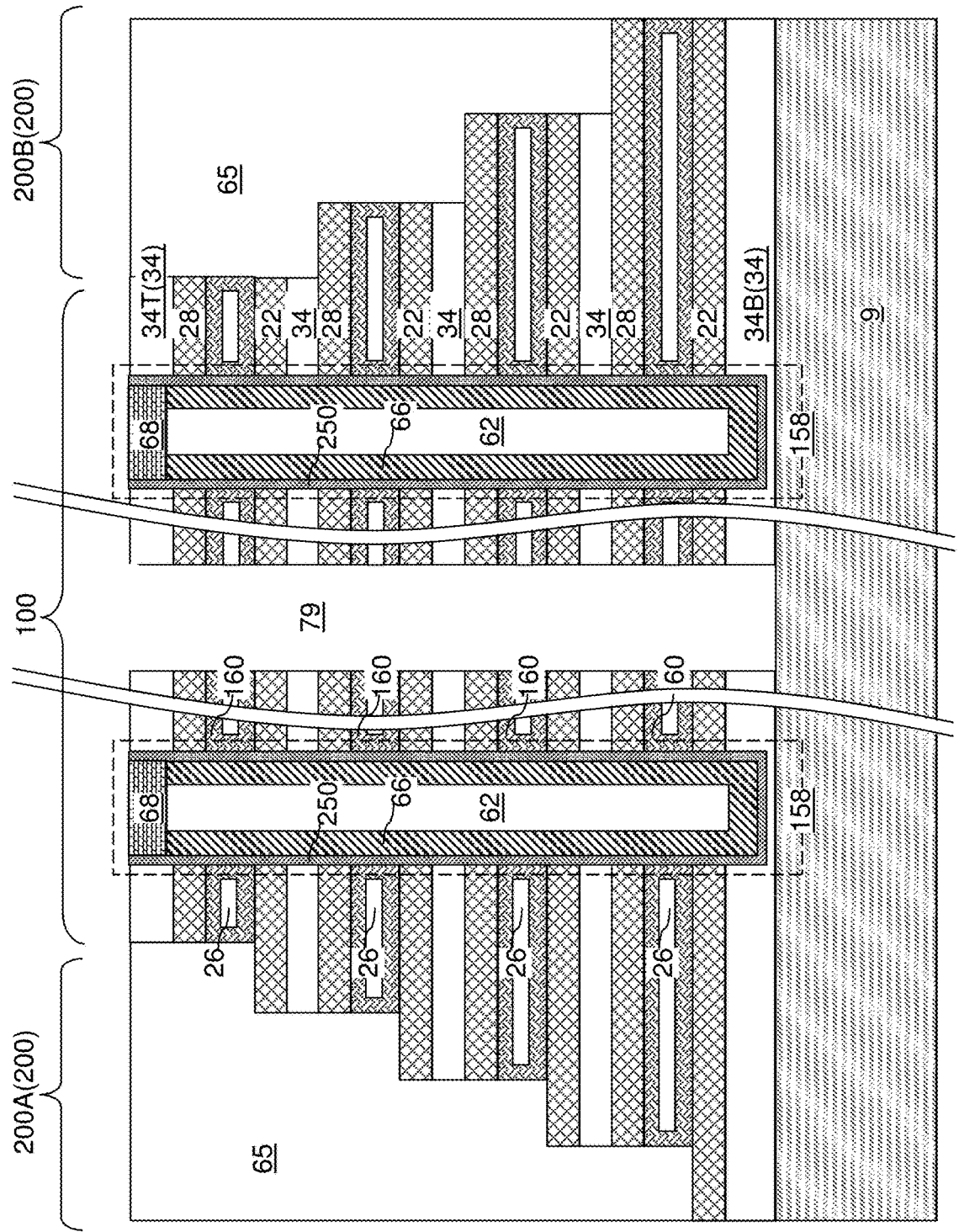
FIG. 38 is a vertical cross-sectional view of the third exemplary structure after formation of channel-containing layers according to the third embodiment of the present disclosure.

Referring to FIG. 38, a semiconductor channel material can be deposited directly on the physically exposed surfaces of the source layers 22 and the drain layers 28 and directly on physically exposed sidewall segments of the resonant tunneling barrier stack 152. In one embodiment, the semiconductor channel material includes a high mobility, narrow bandgap Group III-V semiconductor material, such as indium arsenide (InAs). Use of a narrow bandgap semiconductor material for the semiconductor channel material provides the advantage of enhanced charge carrier mobility in a semiconductor channel. The semiconductor channel material can have a first conductivity type, which may be p-type or n-type. The semiconductor channel material can be deposited by a conformal deposition process such as a low pressure chemical vapor deposition (LPCVD) process or an atomic layer deposition (ALD) process. The thickness of the deposited semiconductor channel material may, or may not, be less than one half of the height of each channel-level backside recess 25. In one embodiment, the thickness of the deposited semiconductor channel material may be in a range from 3 nm to 10 nm, although lesser and greater thicknesses can also be employed. Generally, the semiconductor channel material may partially or fully fill the channel-level backside recesses 25.

In case the chancel-level backside recesses 25 are not fully filled with the semiconductor channel material, a dielectric fill material may be optionally deposited in the remaining volumes of the channel-level backside recesses 25 by a conformal or non-conformal deposition process. For example, a doped silicate glass, an undoped silicate glass, or organosilicate glass may be optionally deposited in unfilled volumes of the channel-level backside recesses 25 to form dielectric material portions.

Portions of the dielectric fill material and the semiconductor channel material that are deposited outside the channel-level backside recesses 25 can be removed by an etch back process, which may comprise at least one anisotropic etch process and/or at least one isotropic etch process. For example, portions of the dielectric fill material and the semiconductor channel material that are located in the backside trenches 79 or above the topmost insulating layer 34 can be removed by the etch back process. Each remaining portion of the semiconductor channel material located within a channel-level backside recess 25 constitutes a semiconductor channel 160. Each remaining portion of the dielectric fill material located within a channel-level backside recess 25 constitutes a channel-level dielectric region 26. Alternatively, in case the dielectric fill material is not employed, a channel-level dielectric region 26 which comprises an air gap may be formed within each channel-level backside recess 25.

A channel-containing layer (160, 26) can be formed within each channel-level backside recess 25. Each channel-containing layer (160, 26) may comprise a respective combination of a semiconductor channel 160 and an optional channel-level dielectric region 26. The channel-level dielectric region 26 may comprise a dielectric fill material and/or an air gap. In this case, each channel-level material layer is formed as a channel-level sacrificial layer 34, and is replaced with a channel-containing layer (160, 26) including a semiconductor channel 160.

In an alternative embodiment, the order of formation of the source and drain layer and the channel-containing layer is reversed. The steps of FIGS. 37 and 38 may be performed first, followed by the steps of FIGS. 35 and 36.

Figure 39:
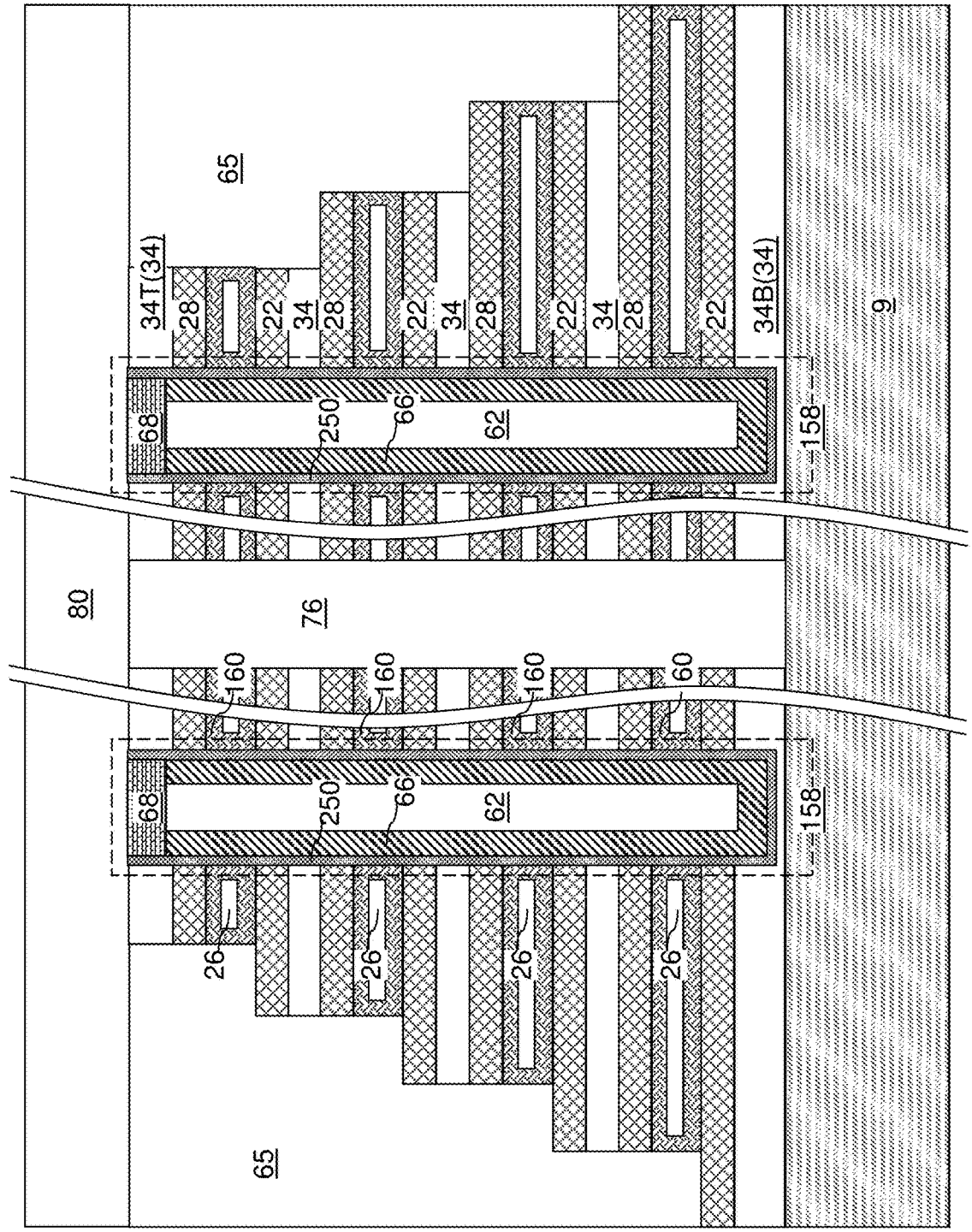
FIG. 39 is a vertical cross-sectional view of the third exemplary structure after formation of backside trench fill structures and a contact-level dielectric layer according to the third embodiment of the present disclosure.

Referring to FIG. 39, a dielectric material such as silicon oxide can be deposited in each backside trench 79 and over the topmost insulating layer 34T. Portions of the dielectric material that are deposited in the backside trenches 79 form backside trench fill structures 76, which may consist essentially of the dielectric material. Portions of the dielectric material that is deposited over the topmost insulating layer 34 can constitute a contact-level dielectric layer 80. Each backside trench fill structure 76 can vertically extend through the multiple instances of a unit layer stack including a source layer 22, a channel-containing layer (160, 26), a drain layer 28, and an inter-transistor-isolation insulating layer 34.

Figure 40A:
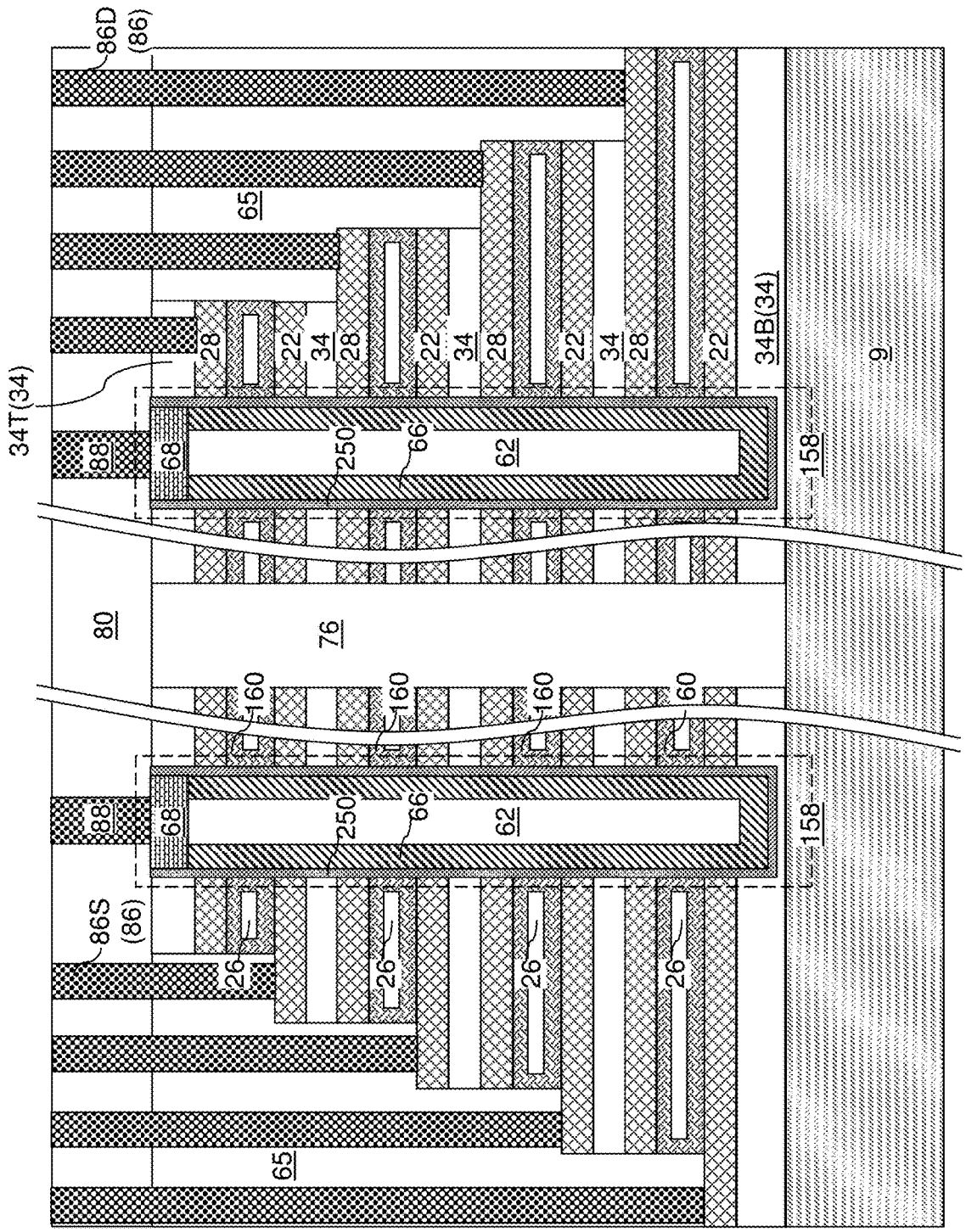
FIG. 40A is a vertical cross-sectional view of the third exemplary structure after formation of various contact via structures according to the third embodiment of the present disclosure.
Figure 40B:
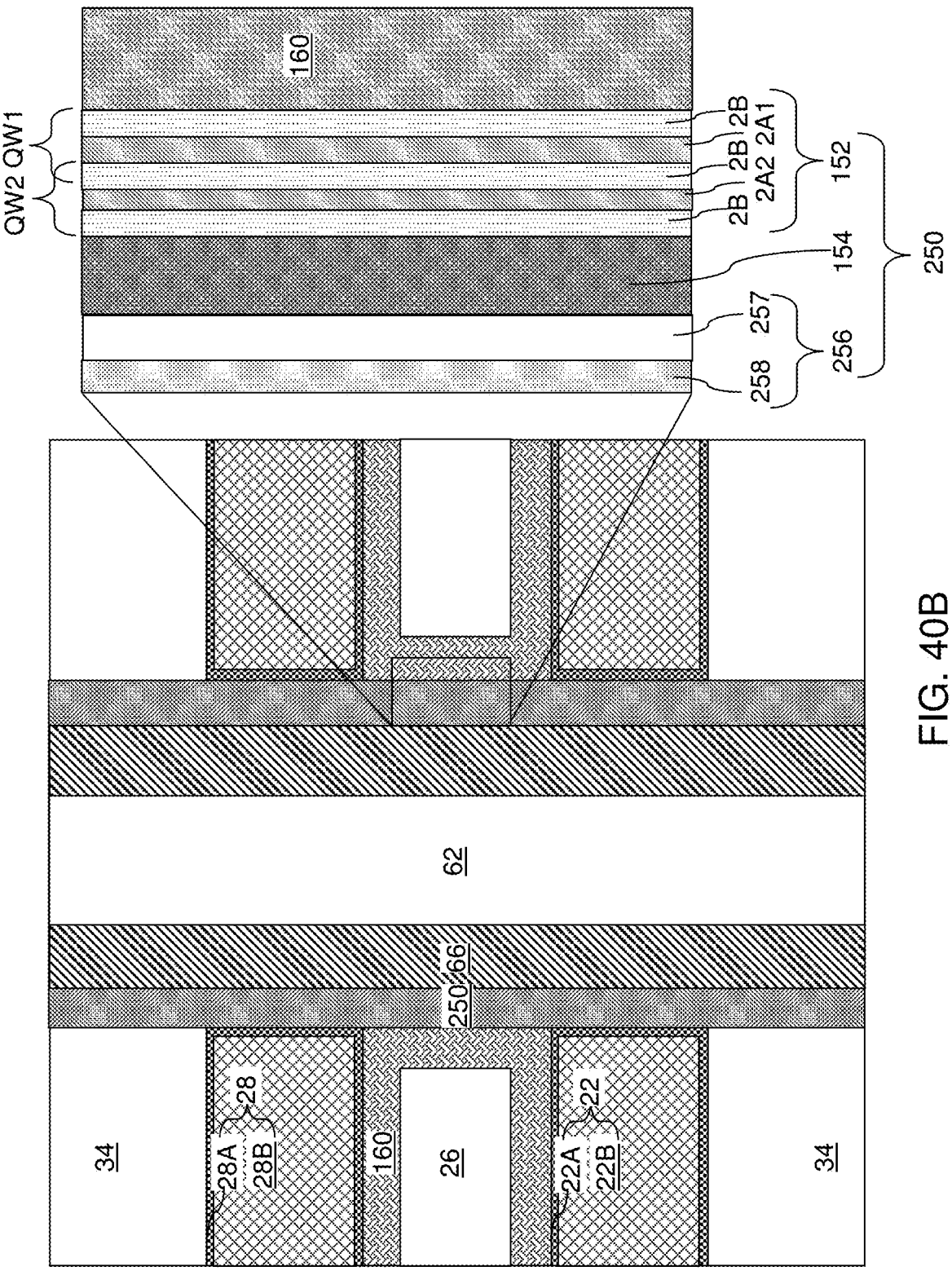
FIG. 40B is a vertical cross-sectional view of a region of the third exemplary structure of FIG. 40A around a memory opening fill structure.

Referring to FIGS. 40A and 40B, contact via structures (88, 86) can be formed through the contact-level dielectric layer 80 and optionally through a retro-stepped dielectric material portion 65. The contact via structures (88, 86) include word line contact via structures 88 each of which contacts a respective one of the contact pad structures 68 (if present, or one of the control gate electrodes 66), and is electrically connected to a respective control gate electrode 66. Word line interconnect lines can be subsequently formed over the contact-level dielectric layer 80. Each of the word line interconnect lines can be in electrical contact with a respective one of the control gate electrodes 66 through a respective contact via structure 88 and optionally through a respective contact pad structure 68.

Further, the contact via structures (88, 86) include layer contact via structures 86 that contact a respective one of the source layers 22 and the drain layers 28 within the respective staircase regions. The layer contact via structures 86 include source layer contact via structures 86S and drain layer contact via structures 86D. Each source layer contact via structure 86S contacts a respective one of the source layers 22. Each drain layer contact via structure 86D contacts a respective one of the drain layers 28. Source interconnect lines (not shown) and drain interconnect lines (not shown) can be subsequently formed over the contact-level dielectric layer 80 to electrically connect each of the layer contact via structures (86S, 86D) to a respective node of a driver circuit, which includes source line drivers, bit line drivers, and a sensing circuit.

The resonant tunneling barrier stack 152 is laterally surrounded by and contacts each semiconductor channel 160 within the at least one instance of the unit layer stack (22, 31, 28, 34). The configuration of the third exemplary structure illustrated in FIG. 40B is the first configuration of the third exemplary structure in which the at least one dielectric blocking barrier layer 256 comprises a layer stack including a silicon oxide layer 257 and a dielectric metal oxide layer 258.

Figure 41:
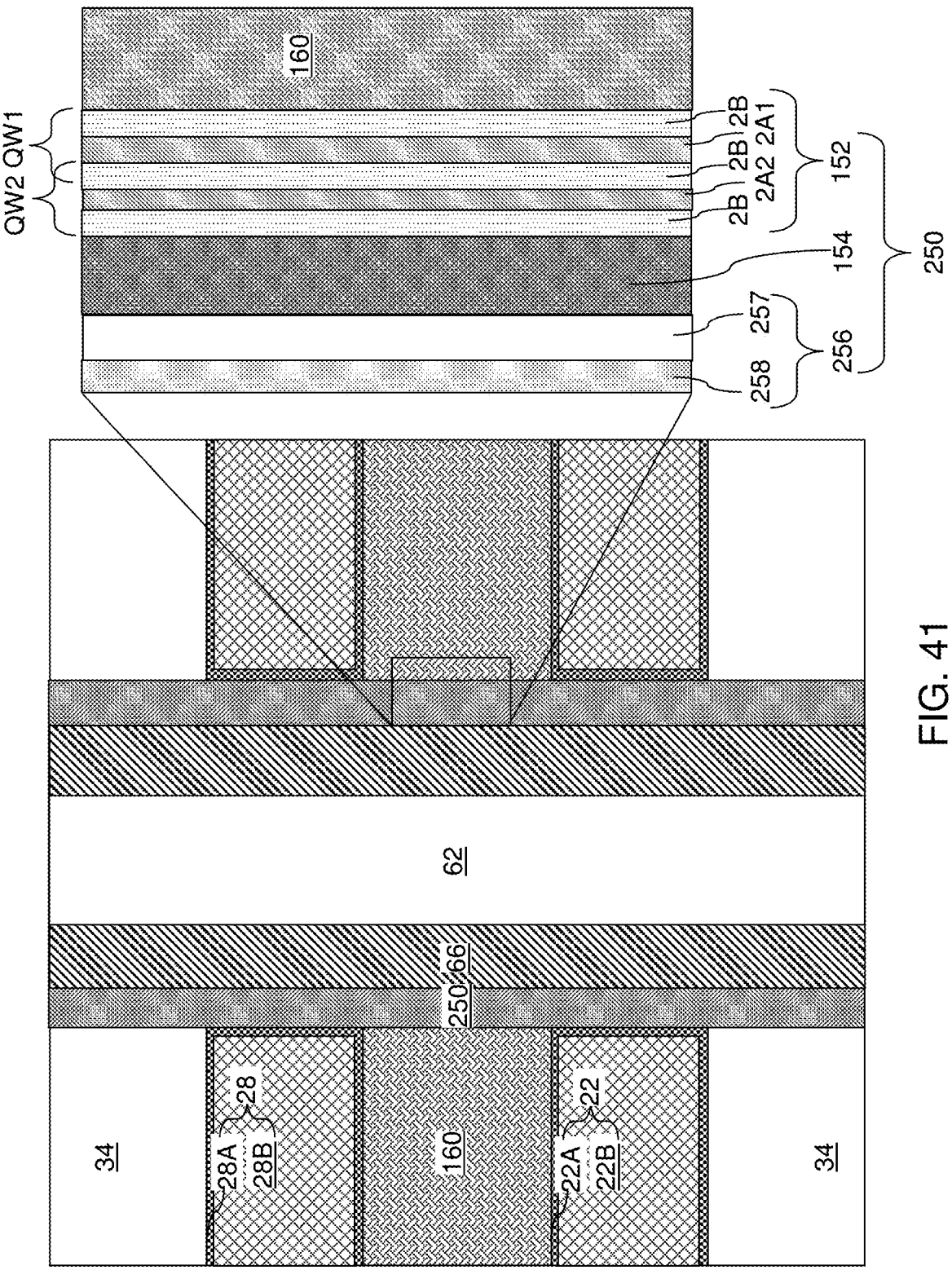
FIG. 41 is a vertical cross-sectional view of a region of a first alternative configuration of the third exemplary structure according to the third embodiment of the present disclosure.

Referring to FIG. 41, a first alternative configuration of the third exemplary structure can be derived from the third exemplary structure of FIGS. 40A and 40B by modifying a subset of processing steps. Specifically, a semiconductor channel 160 may be formed in lieu of the channel-level sacrificial layer 31 within each unit layer stack at processing steps that correspond to the processing steps of FIG. 16. Thus, each unit layer stack as initially formed may comprise a source-level sacrificial layer 42S, a semiconductor channel 160, a drain-level sacrificial layer 42D, and an insulating layer 34. Each semiconductor channel 160 may comprise the same material as the semiconductor channels 160 in the third exemplary structure of FIGS. 40A and 40B. Further, the processing steps of FIGS. 37 and 38 can be omitted. In other words, there is no need to replace the channel-level sacrificial layer 31 because each unit layer stack as originally formed includes a respective semiconductor channel 160.

Figure 42:
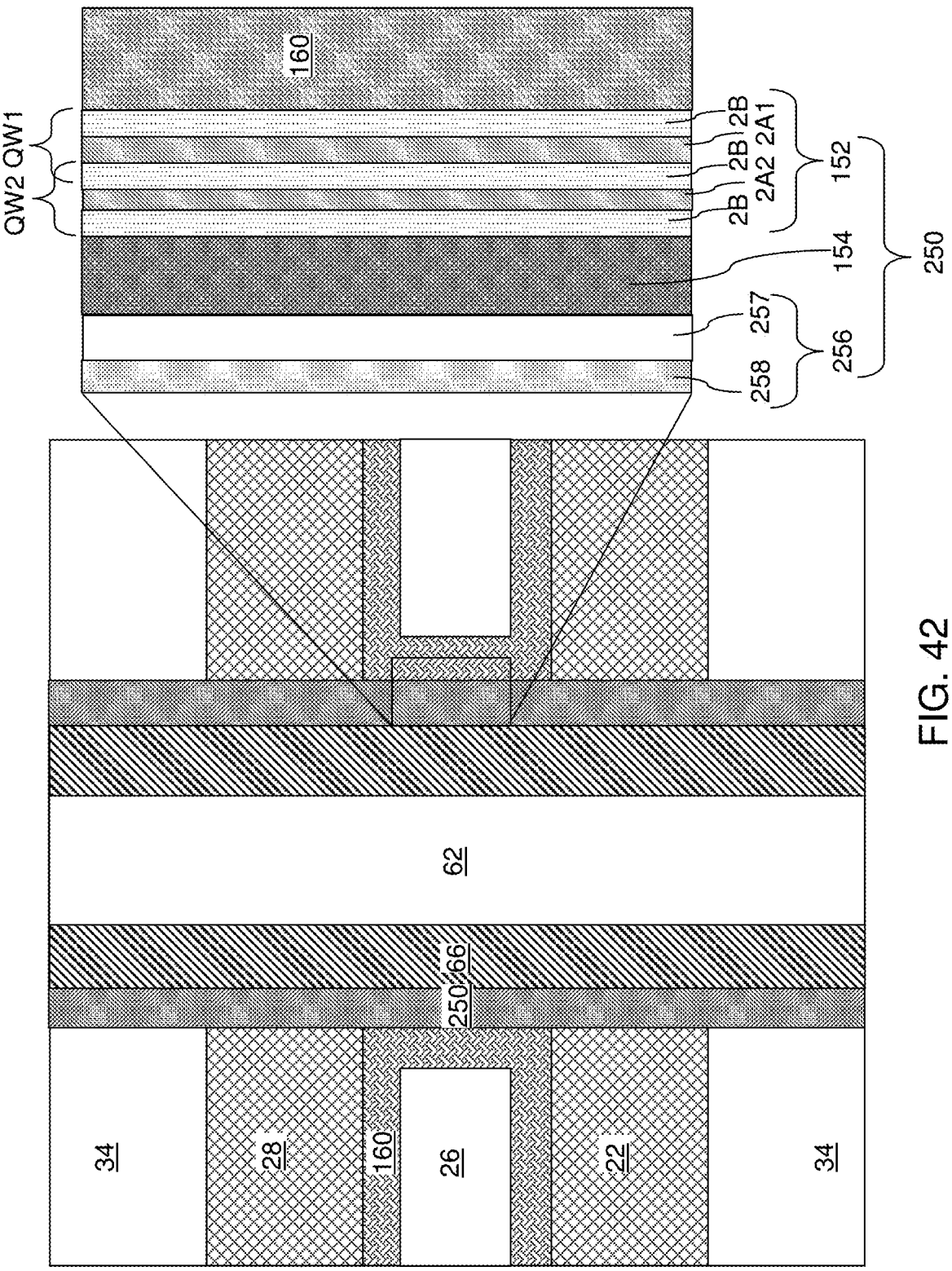
FIG. 42 is a vertical cross-sectional view of a region of a second alternative configuration of the third exemplary structure according to the third embodiment of the present disclosure.

Referring to FIG. 42, a second alternative configuration of the third exemplary structure can be derived from the third exemplary structure of FIGS. 40A and 40B by modifying a subset of processing steps. Specifically, a source layer 22 including a first conductive material can be formed in lieu of a source-level sacrificial layer 42S in each unit layer stack, and a drain layer 28 including a second conductive material can be formed in lieu of a drain-level sacrificial layer 42D in each unit layer stack. The source layer 22 and the drain layer 28 in the second alternative configuration of the third exemplary structure may include any conductive material that may be employed for the source layers 22 and the drain layers 28 in the third exemplary structure illustrated in FIGS. 40A and 40B. The source layers 22 and the drain layers 28 may comprise the same conductive material, or may comprise different conductive materials.

Figure 43:
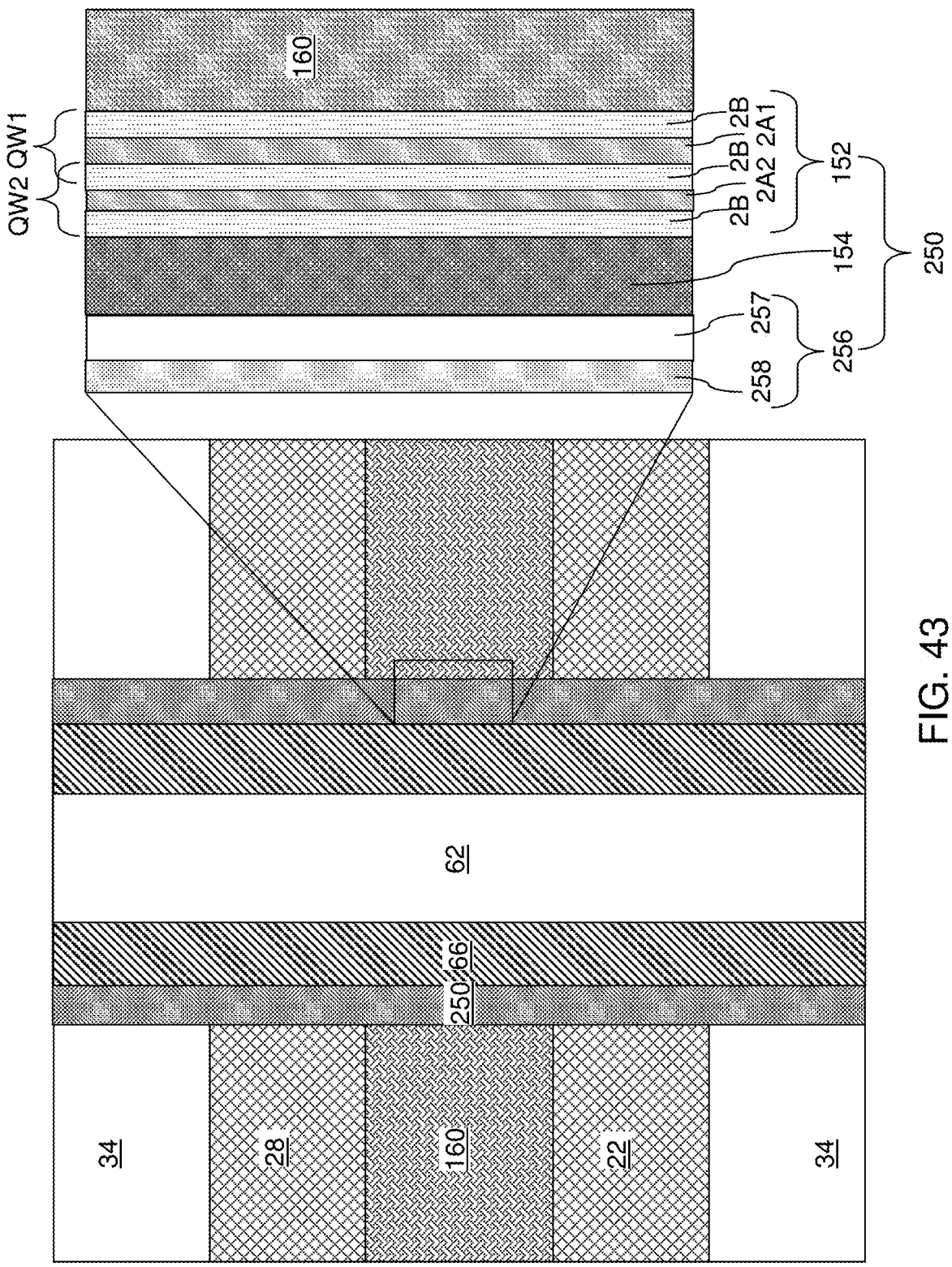
FIG. 43 is a vertical cross-sectional view of a region of a third alternative configuration of the third exemplary structure according to the third embodiment of the present disclosure.

Referring to FIG. 43, a third alternative configuration of the third exemplary structure can be derived from the second alternative configuration of the third exemplary structure by forming a semiconductor channel 160 in lieu of a channel-level sacrificial layer 31 within each unit layer stack at processing steps that correspond to the processing steps of FIG. 16. Thus, each unit layer stack as initially formed may comprise a source layer 22, a semiconductor channel 160, a drain layer 28, and an insulating layer 34. Each semiconductor channel 160 may comprise the same material as the semiconductor channels 160 in the third exemplary structure of FIGS. 40A and 40B. Further, the processing steps of FIGS. 37 and 38 can be omitted.

Figure 44:
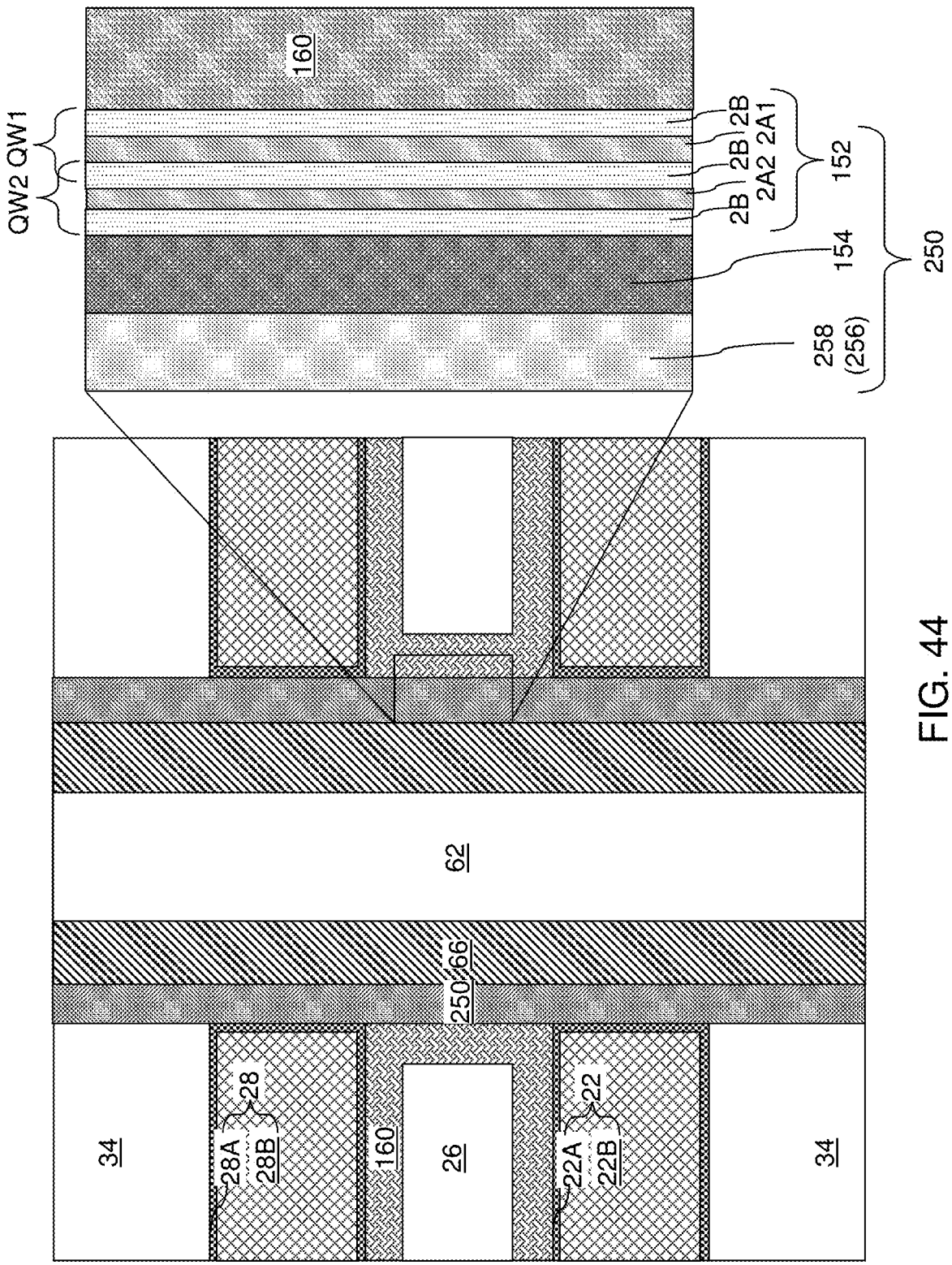
FIG. 44 is a vertical cross-sectional view of a region of a fourth alternative configuration of the third exemplary structure according to the third embodiment of the present disclosure.

Referring to FIG. 44, a fourth alternative configuration of the third exemplary structure can be derived from the third exemplary structure shown in FIGS. 40A and 40B by employing just the dielectric metal oxide layer 258 as the at least one dielectric blocking barrier layer 256.

Figure 45:
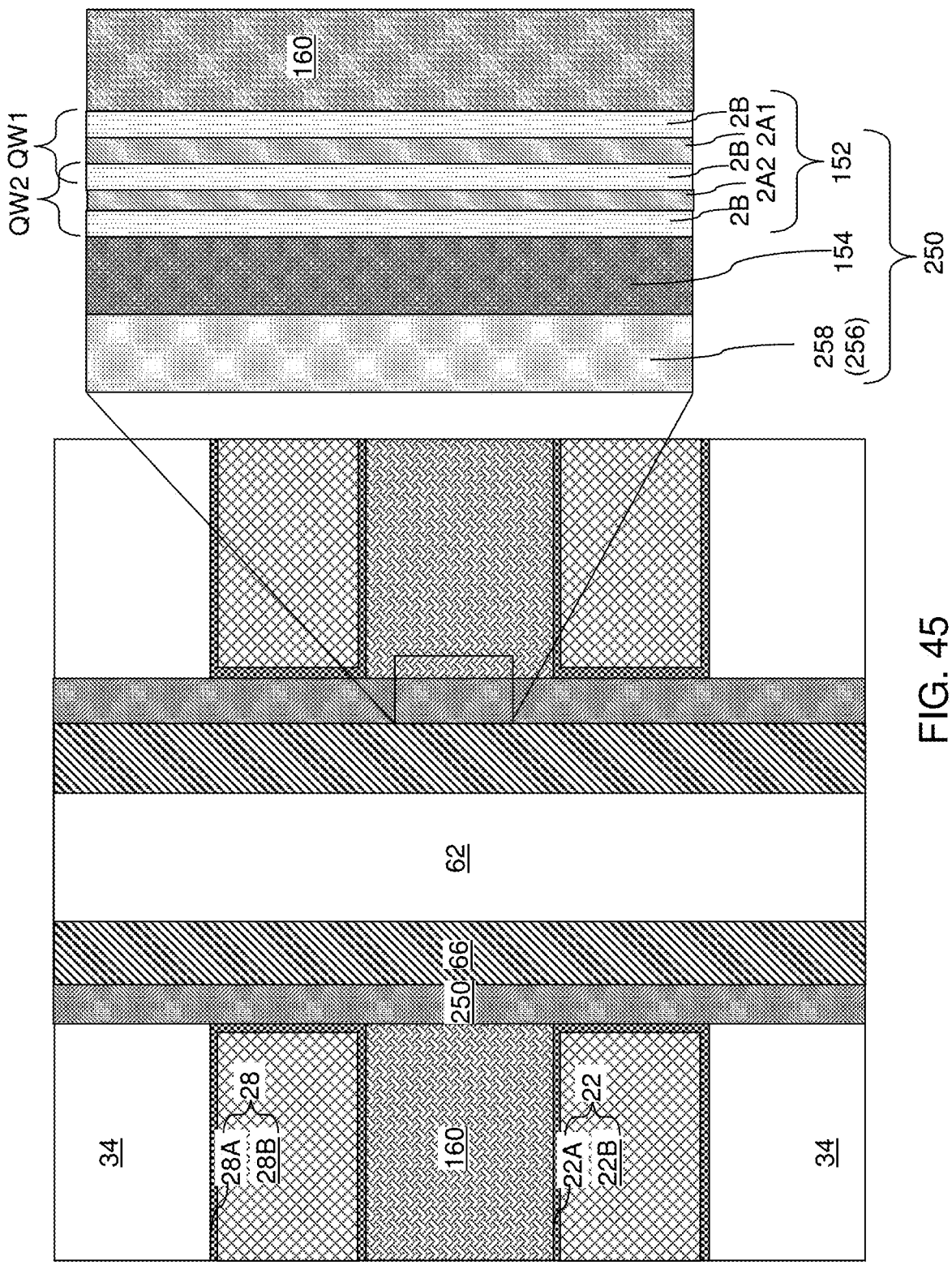
FIG. 45 is a vertical cross-sectional view of a region of a fifth alternative configuration of the third exemplary structure according to the third embodiment of the present disclosure.

Referring to FIG. 45, a fifth alternative configuration of the third exemplary structure can be derived from the first alternative configuration of the third exemplary structure shown in FIG. 41 by employing only the dielectric metal oxide layer 258 as the dielectric blocking barrier layer 256.

Figure 46:
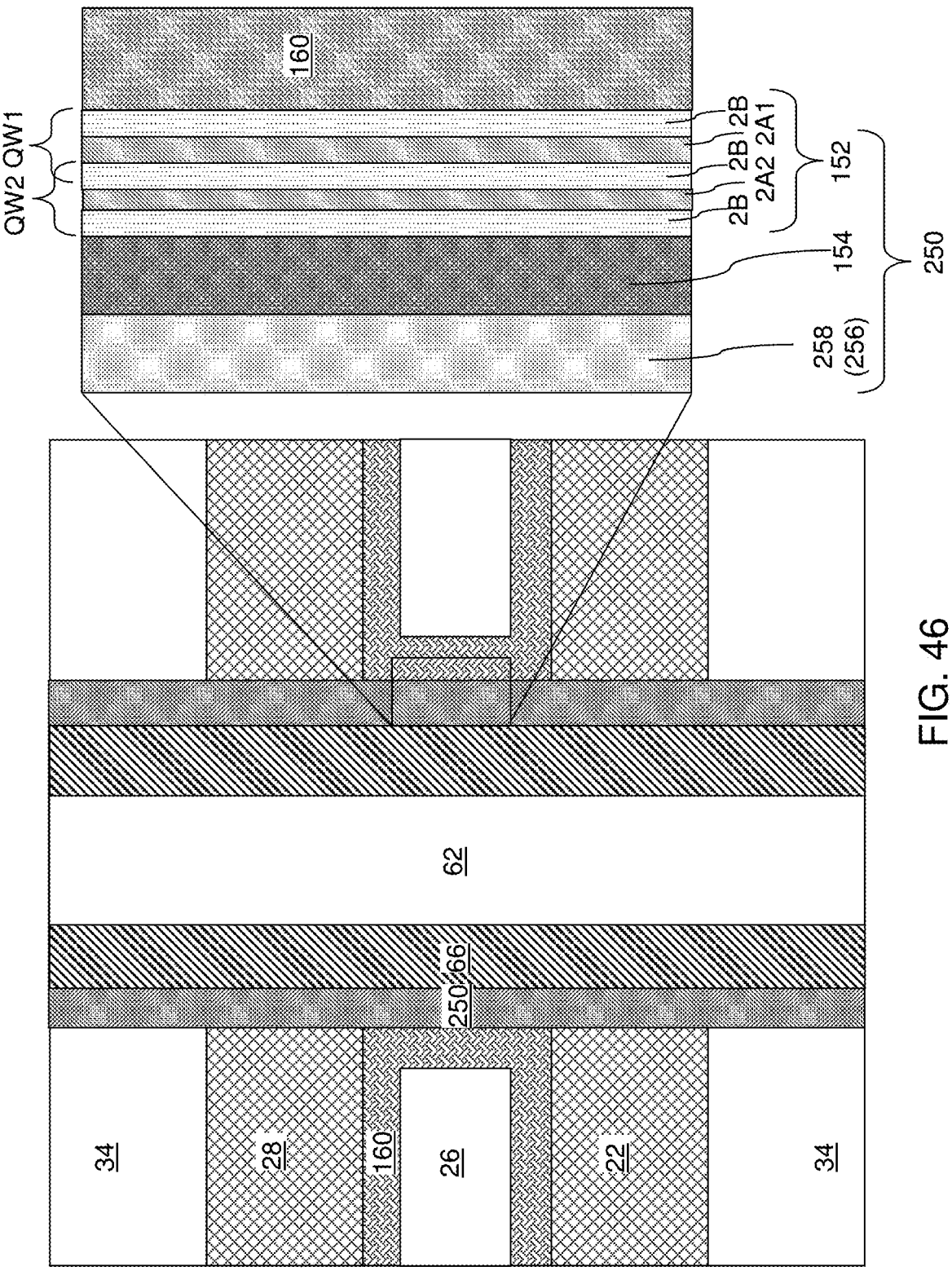
FIG. 46 is a vertical cross-sectional view of a region of a sixth alternative configuration of the third exemplary structure according to the third embodiment of the present disclosure.

Referring to FIG. 46, a sixth alternative configuration of the third exemplary structure can be derived from the second alternative configuration of the third exemplary structure shown in FIG. 41 by employing only the dielectric metal oxide layer 258 as the dielectric blocking barrier layer 256.

Figure 47:
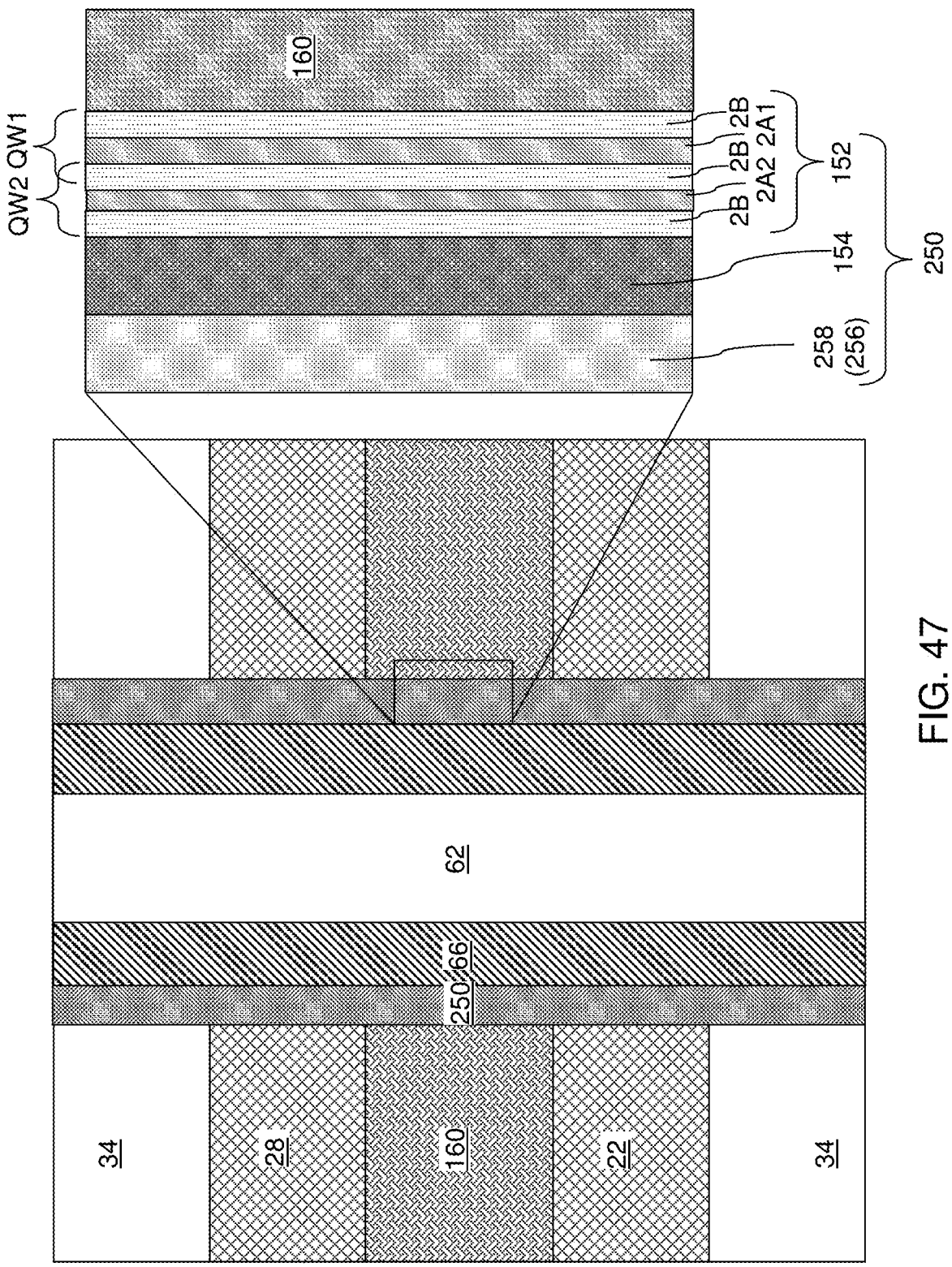
FIG. 47 is a vertical cross-sectional view of a region of a seventh alternative configuration of the third exemplary structure according to the third embodiment of the present disclosure.

Referring to FIG. 47, a seventh alternative configuration of the third exemplary structure can be derived from the third alternative configuration of the third exemplary structure shown in FIG. 41 by employing only the dielectric metal oxide layer 258 as the dielectric blocking barrier layer 256.

Figure 48:
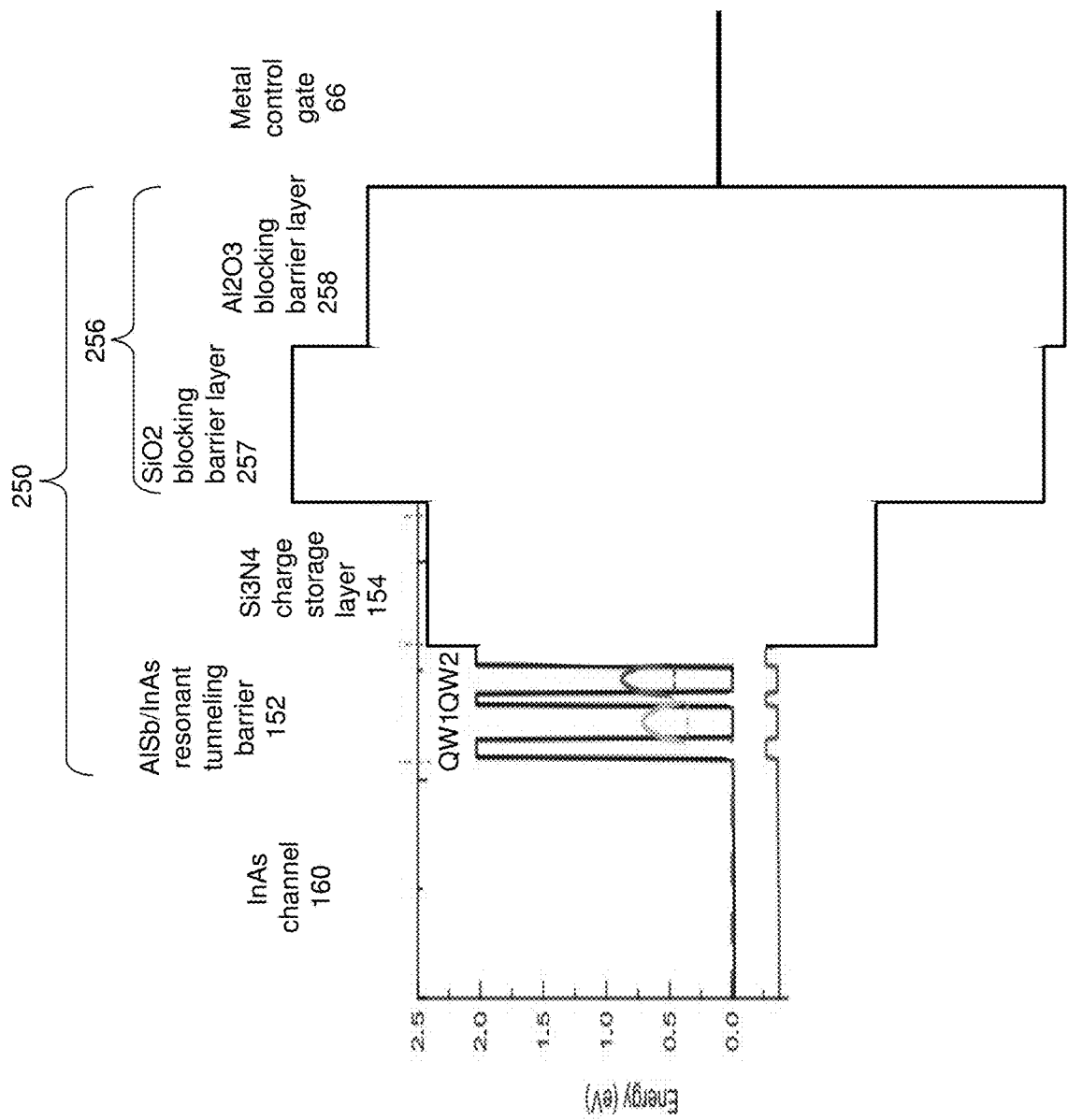
FIG. 48 is a band gap diagram of a layer stack including a vertical semiconductor channel, a memory film, and a word line including a portion of an electrically conductive layer within the second exemplary structure.

FIG. 48 is a band gap diagram of a layer stack including a semiconductor channel 160, a memory film 250, and a control gate electrode 66 (which can be a metal gate electrode) within the third exemplary structure. The band diagram is illustrated for an illustrative case in which the dielectric blocking barrier layer 256 includes a silicon oxide layer 257 and an aluminum oxide layer 258. As discussed above, various combinations of dielectric materials may be employed for the dielectric blocking barrier layer 256.

The use of a dielectric blocking barrier layer 256 instead of III-V semiconductor barrier layer 156 in the first and second embodiment provides robust blocking for both electrons and holes, and hence better reliability. In addition, the memory film 250 of the third embodiment does not require negative control gate bias operation, simplifying design and reducing chip area. Furthermore, the device of the third embodiment allows both substrate/well erase operation (for devices in which the channel 160 is electrically connected to the substrate 9) or gate induced drain leakage (GIDL) type erase (for devices in which the channel is not electrically connected to the substrate). For example, GIDL erase may be used in a driver circuit CMOS under memory array configuration device, or in a driver circuit CMOS bonded to the memory array configuration device.

For example, the memory cell of the third embodiment may be programmed by applying a positive bias to its control gate 66 (e.g., a bias of +2.5V to 3V). The thickness of the quantum wells in the resonant tunneling barrier 152 may be selected in such a way that available electron energy levels line up at certain voltage applied to control gate 66, e.g. 2.5V. Once energy levels in the quantum wells are nearly coincident, it leads to a strong coupling of these states and resonant tunnelling, and electrons flow from the semiconductor channel 160 to the memory material layer 154 to charge the memory cell.

The memory cell of the second embodiment may be erased by applying a positive bias to the semiconductor channel 160 via the respective source and/or drain of the same cell (e.g., a bias of +2.5V to 8V, such as 2.5V to 3V, or 3V to 8V). If the semiconductor channel 160 is electrically connected to the substrate 9, then the erase voltage may be applied to the substrate.

If the semiconductor channel 160 is not electrically connected to the substrate 9, then the semiconductor channel 160 potential can be raised using GIDL. For example, the source line and/or the bit line of the memory cell being erased is biased at relatively high positive voltage (e.g., 3V to 8V). Band bending and the electric field allow electrons to flow from the memory material layer 154 portion of the memory cell to the semiconductor channel 160 while holes flow from the semiconductor channel to the memory material layer 154 portion of the memory cell to facilitate erasing the cell. The dielectric blocking barrier layer 256 prevents or reduces electron and hole back leakage into the control gate 66 due to big band offsets in both of the dielectric blocking barrier layer conduction and valence bands. The device of the third embodiment may be read using any suitable NOR memory device reading operation.

Referring to all drawings and according to various embodiments of the present disclosure, a memory device is provided, which comprises: at least one instance of a unit layer stack (22, 31, 28, 34) including a source layer 22, a channel-containing layer that contains a semiconductor channel 160, and a drain layer 28 that are stacked along a vertical direction over a substrate (9, 10); a memory opening 49 vertically extending through the at least one instance of the unit layer stack (22, 31, 28, 34); and a memory opening fill structure 158 located in the memory opening 49 and comprising a control gate electrode 66 and a memory film 250 in contact with each instance of the semiconductor channel 160, wherein the memory film 250 comprises a resonant tunneling barrier stack 152, the barrier layer (156, 256), and a memory material layer 154 located between the resonant tunneling barrier stack 152 and the barrier layer.

In one embodiment, the barrier layer comprises the dielectric blocking barrier layer 256. In one embodiment, the resonant tunneling barrier stack 152 comprises at least two semiconductor quantum wells (QW1, QW2). In one embodiment, the at least two semiconductor quantum wells (QW1, QW2) comprise a first quantum well QW1 and a second quantum well QW2 located between the first quantum well QW1 and the control gate electrode; the first quantum well QW1 comprises a first semiconductor well layer 2A1 located between a first barrier layer 2B and a second barrier layer 2B; and the second quantum well QW2 comprises a second semiconductor well layer 2A2 located between the second barrier layer 2B and a third barrier layer 2B.

In one embodiment, the first semiconductor well layer 2A1 is thinner than the second semiconductor well layer 2A2. In one embodiment, the first semiconductor well layer 2A1 and the second semiconductor well layer 2A2 have a narrower bandgap than the first, second, and third barrier layers 2B. In one embodiment, the first semiconductor well layer 2A1 and the second semiconductor well layer 2A2 comprise indium arsenide, and the first, second, and third barrier layers 2B comprise aluminum antimonide.

In one embodiment, the memory material layer 154 comprises a dielectric charge storage material; the semiconductor channel 160 comprises a first compound semiconductor material; and the dielectric blocking barrier layer 256 comprises at least one dielectric oxide material. In one embodiment, the memory material layer 154 comprises a silicon nitride layer and the semiconductor channel 160 comprises an indium arsenide layer.

In one embodiment, the dielectric blocking barrier layer 256 comprises a dielectric metal oxide layer 258. In one embodiment, the dielectric blocking barrier layer 256 further comprises a silicon oxide layer 257 in contact with the dielectric metal oxide layer 258. In one embodiment, the dielectric metal oxide layer 258 contacts the memory material layer 154.

In one embodiment, the dielectric blocking barrier layer 256 is surrounded by the memory material layer 154; and the memory material layer 154 is surrounded by the resonant tunneling barrier stack 152. In one embodiment, the resonant tunneling barrier stack 152 is laterally surrounded by and contacts each semiconductor channel 160 within the at least one instance of the unit layer stack (22, 31, 28, 34).

In one embodiment, the three-dimensional memory device of the present disclosure may be operated by: applying a positive voltage to the control gate electrode to program a data bit in the memory material layer 154; and applying a positive voltage to the semiconductor channel to erase the data bit in the memory material layer 154.

The various embodiments of the present disclosure may be employed to provide a three-dimensional memory device employing resonant tunneling through a resonant tunneling barrier stack 152, which enables a low voltage operation for a charge storage memory devices through use of resonant tunneling of charge carriers through quantum wells having aligned energy states.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising:
   at least one instance of a unit layer stack including a source layer, a channel-containing layer that contains a semiconductor channel, and a drain layer that are stacked along a vertical direction over a substrate;
   a memory opening vertically extending through the at least one instance of the unit layer stack; and
   a memory opening fill structure located in the memory opening and comprising a control gate electrode and a memory film in contact with each instance of the semiconductor channel, wherein the memory film comprises a resonant tunneling barrier stack, a barrier layer, and a memory material layer located between the resonant tunneling barrier stack and the barrier layer.

2. The memory device of claim 1, wherein the barrier layer comprises a dielectric blocking barrier layer.

3. The memory device of claim 1, wherein the resonant tunneling barrier stack comprises at least two semiconductor quantum wells.

4. The memory device of claim 3, wherein:
   the at least two semiconductor quantum wells comprise a first quantum well and a second quantum well located between the first quantum well and the control gate electrode;
   the first quantum well comprises a first semiconductor well layer located between a first barrier layer and a second barrier layer; and
   the second quantum well comprises a second semiconductor well layer located between the second barrier layer and a third barrier layer.

5. The memory device of claim 4, wherein the first semiconductor well layer is thinner than the second semiconductor well layer.

6. The memory device of claim 5, wherein the first semiconductor well layer and the second semiconductor well layer have a narrower bandgap than the first, second, and third barrier layers.

7. The memory device of claim 6, wherein the first semiconductor well layer and the second semiconductor well layer comprise indium arsenide, and the first, second, and third barrier layers comprise aluminum antimonide.

8. The memory device of claim 2, wherein:
   the memory material layer comprises a dielectric charge storage material;
   the semiconductor channel comprises a first compound semiconductor material; and the dielectric blocking barrier layer comprises a dielectric oxide material.

9. The memory device of claim 8, wherein the memory material layer comprises a silicon nitride layer and the semiconductor channel comprises an indium arsenide layer.

10. The memory device of claim 2, wherein the dielectric blocking barrier layer comprises a dielectric metal oxide layer.

11. The memory device of claim 10, wherein the dielectric blocking barrier layer further comprises a silicon oxide layer in contact with the dielectric metal oxide layer.

12. The memory device of claim 10, wherein the dielectric metal oxide layer contacts the memory material layer.

13. The memory device of claim 2, wherein:
the dielectric blocking barrier layer is surrounded by the memory material layer; and
the memory material layer is surrounded by the resonant tunneling barrier stack.

14. The memory device of claim 13, wherein the resonant tunneling barrier stack is laterally surrounded by and contacts each semiconductor channel within the at least one instance of the unit layer stack.

15. A method of operating the three-dimensional memory device of claim 1, comprising:
applying a positive voltage to the control gate electrode to program a data bit in the memory material layer; and
applying a positive voltage to the semiconductor channel to erase the data bit in the memory material layer.

16. A method of making a memory device, comprising:
forming at least one instance of a unit layer stack including a source-level material layer, a channel-level material layer, and a drain-level material layer over a substrate, wherein the source-level material layer and the drain-level material layer are formed as, or are subsequently replaced with, an electrically conductive source layer and an electrically conductive drain layer, and wherein the channel-level material layer comprises a semiconductor channel or is replaced with the semiconductor channel;
forming a memory opening through the at least one instance of the unit layer stack;
forming a memory film in the memory opening, wherein the memory film comprises a layer stack that includes a resonant tunneling barrier stack, a barrier layer, and a memory material layer located between the resonant tunneling barrier stack and the barrier layer; and
forming a control gate electrode on an inner sidewall of the memory film.

17. The method of claim 16, wherein the barrier layer comprises at least one dielectric oxide material.

18. The method of claim 17, wherein the barrier layer further comprises a silicon oxide layer.

19. The method of claim 16, wherein:
the resonant tunneling barrier stack is formed directly on a sidewall of the memory opening; and
the control gate electrode is formed directly on the barrier layer.

20. The method claim 16, wherein:
the resonant tunneling barrier stack comprises at least two semiconductor quantum wells;
the least two semiconductor quantum wells comprise a first quantum well and an second quantum well that is formed between the first quantum well and the control gate electrode;
the first quantum well comprises a first semiconductor well layer that is formed between a first barrier layer and a second barrier layer;
the second quantum well comprises a second semiconductor well layer that is formed between the second barrier layer and a third barrier layer; and
the first semiconductor well layer is thinner than the second semiconductor well layer.

* * * * *